(12) United States Patent
Spanier et al.

(10) Patent No.: US 12,193,333 B2
(45) Date of Patent: Jan. 7, 2025

(54) SOLID STATE TUNABLE IONIC OSCILLATOR DIELECTRIC MATERIALS AND RESONANT DEVICES

(71) Applicants: Drexel University, Philadelphia, PA (US); Bar-Ilan University, Ramat Gan (IL); The Regents of the University of California, Oakland, CA (US)

(72) Inventors: Jonathan E. Spanier, Bala Cynwyd, PA (US); Zongquan Gu, Chalfont, PA (US); Ilya Grinberg, Bet Shemesh (IL); Atanu Samanta, Ramat Gan (IL); Haim Barak, Ramat Gan (IL); Cedric J. G. Meyers, Oakland, CA (US); Robert A. York, Oakland, CA (US)

(73) Assignees: Drexel University, Philadelphia, PA (US); Bar-Ilan University, Ramat Gan (IL); The Regents of the University of California, Oakland, CA (US)

( * ) Notice: Subject to any disclaimer, the term of this patent is extended or adjusted under 35 U.S.C. 154(b) by 662 days.

(21) Appl. No.: 17/264,726

(22) PCT Filed: Aug. 1, 2019

(86) PCT No.: PCT/US2019/044675
§ 371 (c)(1),
(2) Date: Jan. 29, 2021

(87) PCT Pub. No.: WO2020/028670
PCT Pub. Date: Feb. 6, 2020

(65) Prior Publication Data
US 2021/0305491 A1    Sep. 30, 2021

(51) Int. Cl.
*H10N 30/853* (2023.01)
*H01P 7/10* (2006.01)

(52) U.S. Cl.
CPC ........... *H10N 30/8554* (2023.02); *H01P 7/10* (2013.01); *H10N 30/8536* (2023.02); *H10N 30/8561* (2023.02)

(58) Field of Classification Search
CPC .. H01P 7/10; H10N 30/8536; H10N 30/8561; H10N 30/8554
See application file for complete search history.

(56) References Cited

U.S. PATENT DOCUMENTS

| | | |
|---|---|---|
| 2007/0152773 A1 | 7/2007 | Oakes et al. |
| 2017/0009090 A1 | 1/2017 | Haghzadeh et al. |

FOREIGN PATENT DOCUMENTS

| | | |
|---|---|---|
| FR | 2236810 A1 | 2/1975 |
| GB | 1204867 A | 9/1970 |
| GB | 2380069 A | 3/2003 |

OTHER PUBLICATIONS

Singh, et al.; "Tunable multiferroic properties of Mn substituted BiFeO3 thin films"; Ceramics International; vol. 2, No. 12; Sep. 2016; p. 13432-13441.
International Search Report and Written Opinion dated Dec. 16, 2019 for International Application No. PCT/US2019/044675; 16 pages.

*Primary Examiner* — J. San Martin
(74) *Attorney, Agent, or Firm* — Smith, Gambrell & Russell, LLP; Michael J. Riesen

(57) ABSTRACT

An article comprising a ferroelectric material in its ferroelectric phase, wherein the article is configured to enable low-loss propagation of signals with ultra-low dielectric loss at one or more select frequencies.

19 Claims, 42 Drawing Sheets

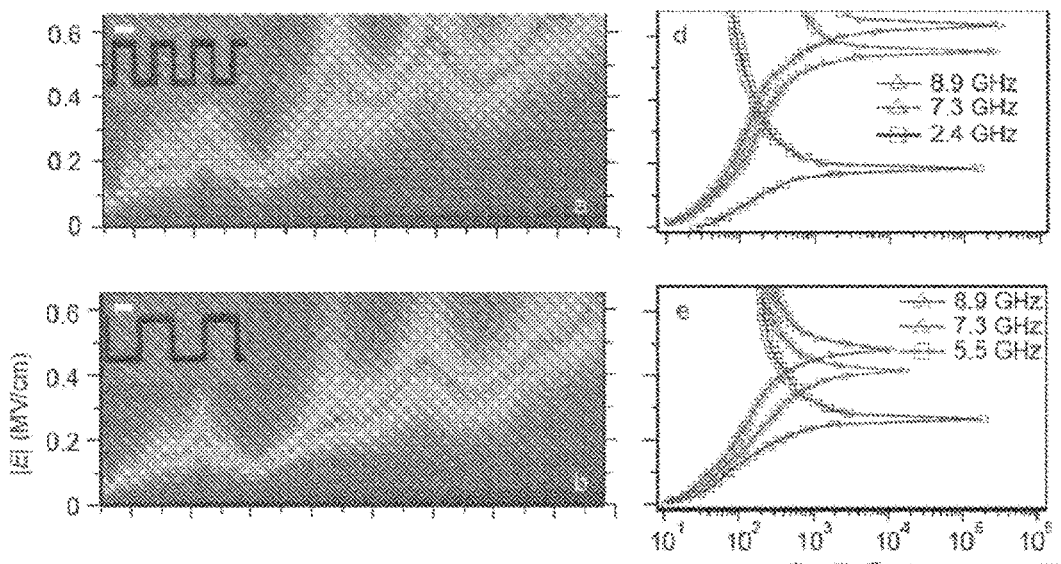
FIG. 6A
FIG. 6B
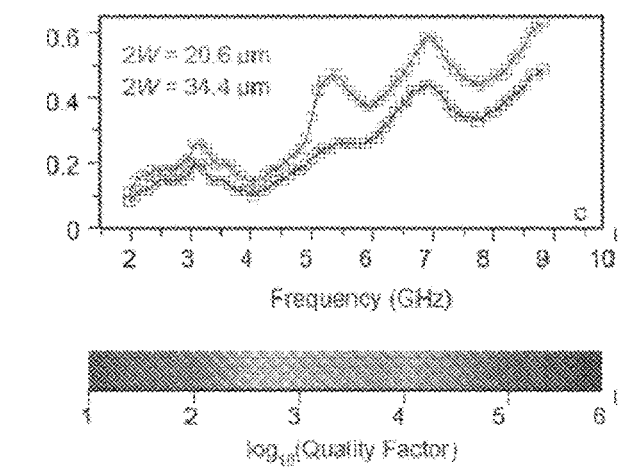
FIG. 6C $G_{11} = 5.10 \times 10^{-10}$ J m³ C⁻²

$G_{11} = 9.28 \times 10^{-9}$ J m³ C⁻²

$G_{11} = 1.25 \times 10^{-10}$ J m³ C⁻²

$G_{11} = 2.23 \times 10^{-9}$ J m³ C⁻²

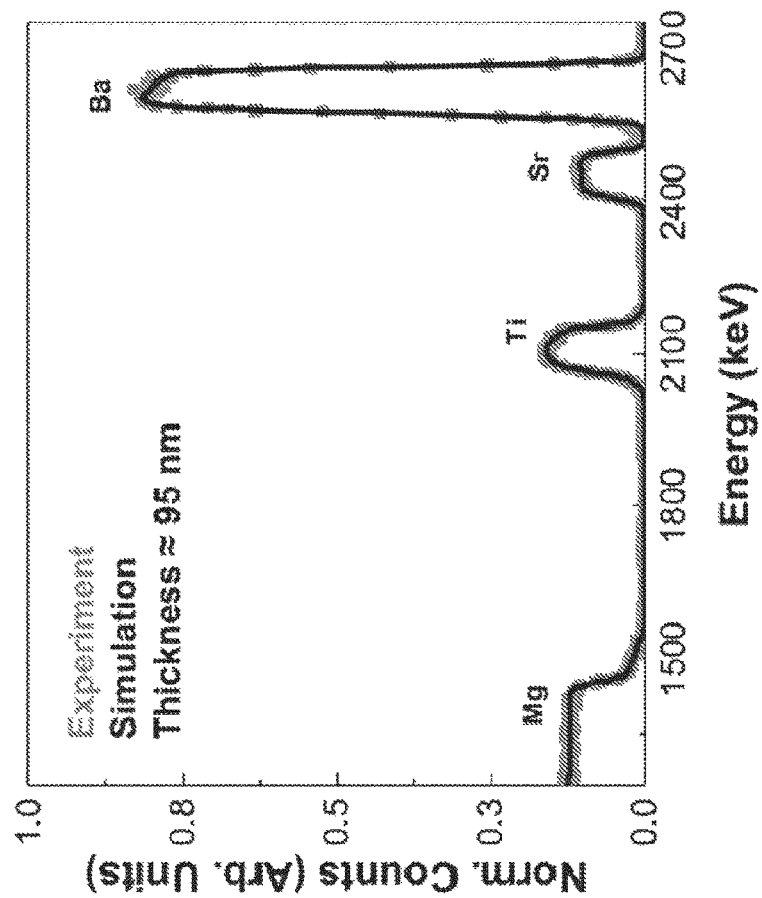
FIG. 17
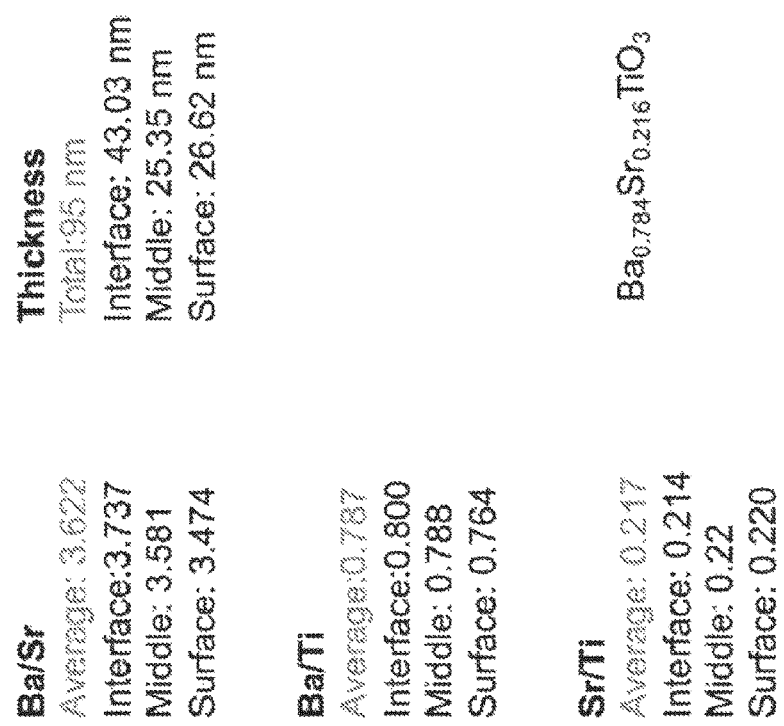
SP199
BST/MgO
Ba/Sr
Average: 3.622
Interface: 3.737
Middle: 3.581
Surface: 3.474
Ba/Ti
Average: 0.787
Interface: 0.800
Middle: 0.788
Surface: 0.764
Sr/Ti
Average: 0.217
Interface: 0.214
Middle: 0.22
Surface: 0.220
Thickness
Total: 95 nm
Interface: 43.03 nm
Middle: 25.35 nm
Surface: 26.62 nm
$Ba_{0.784}Sr_{0.216}TiO_3$

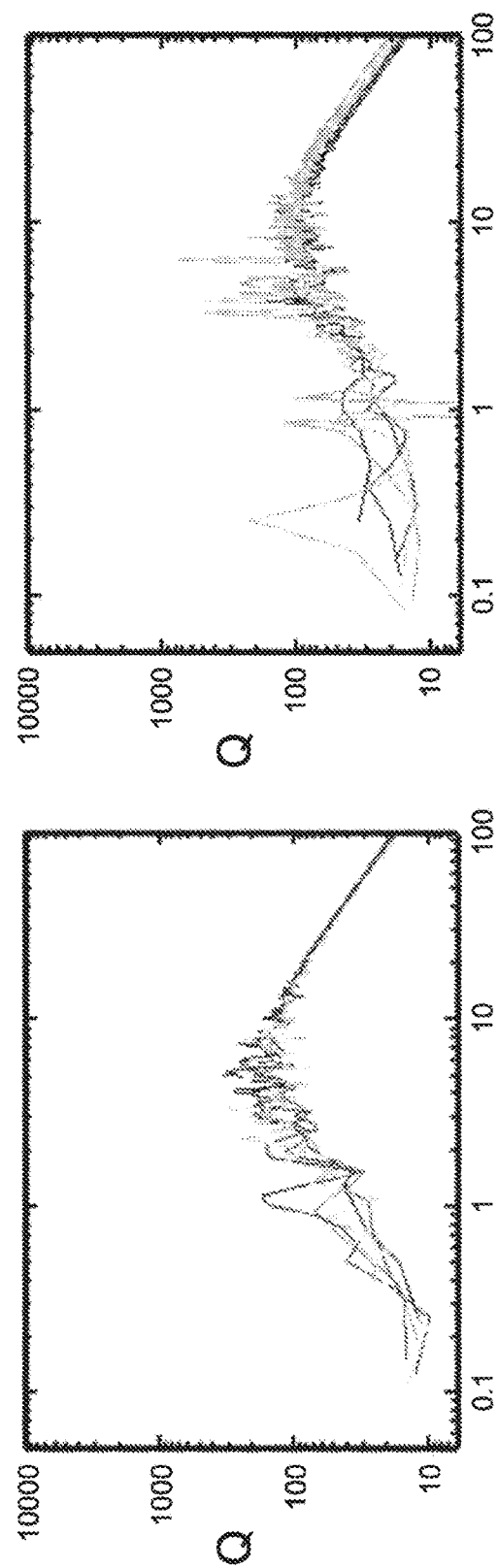
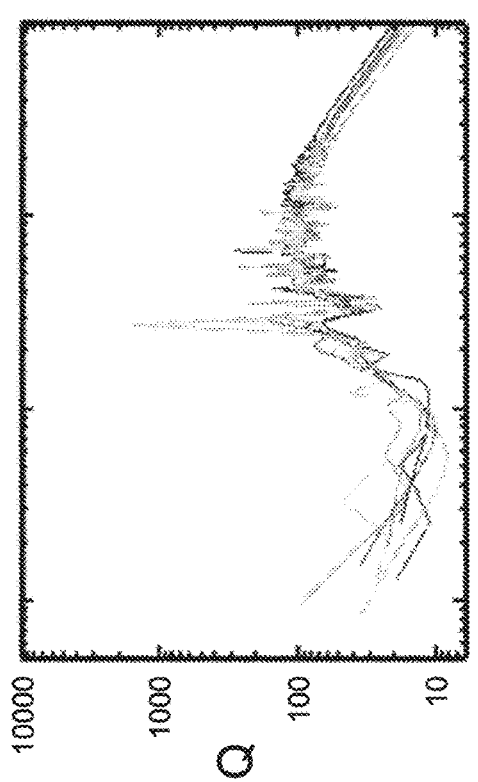
FIG. 34A
FIG. 34B
FIG. 34C

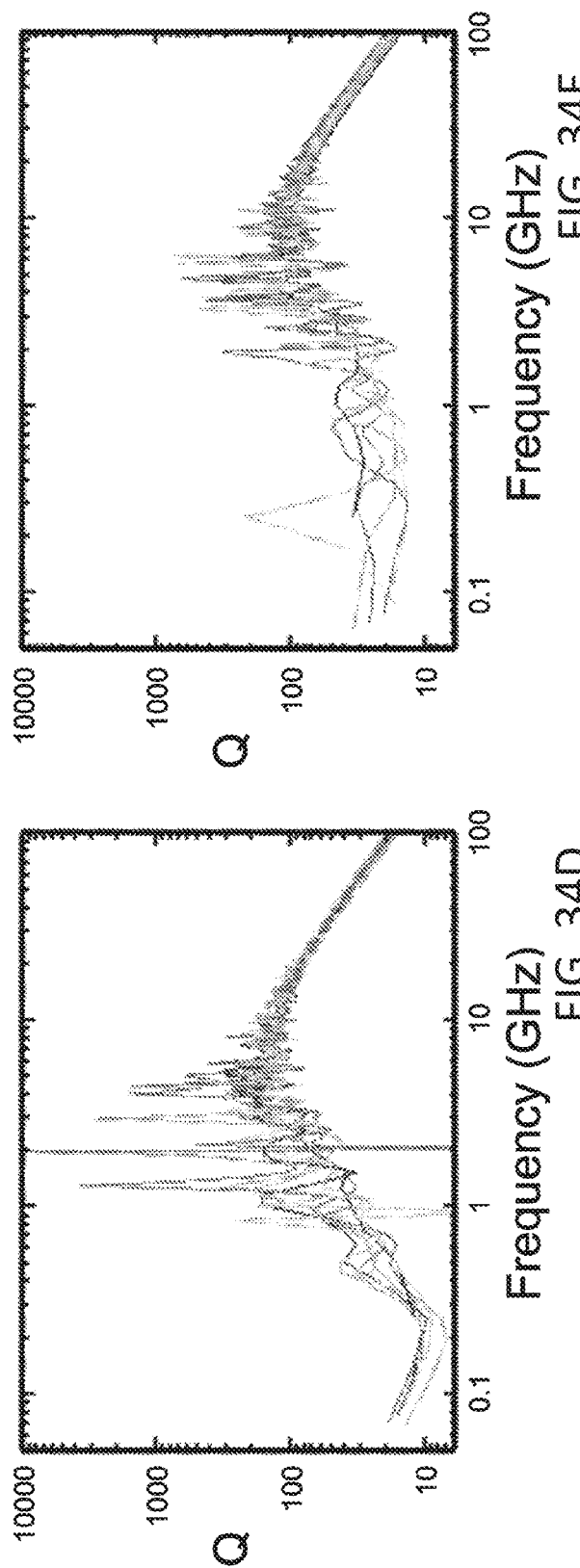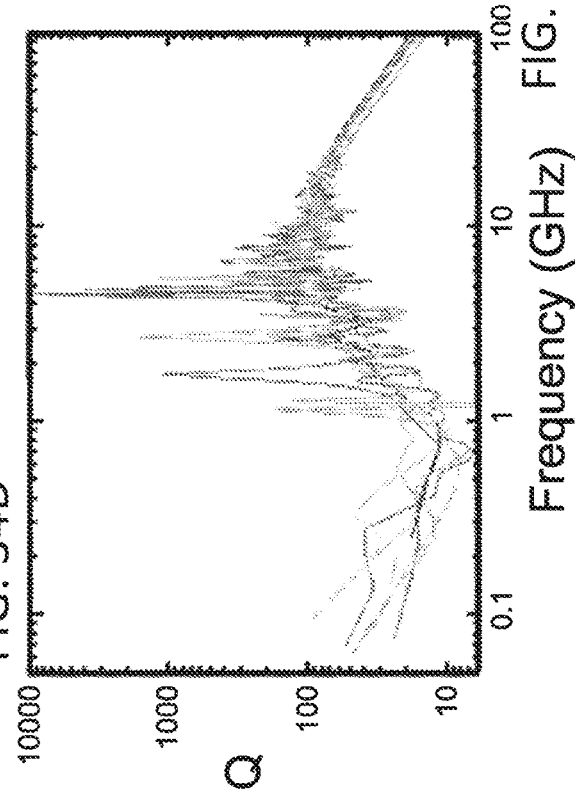

SOLID STATE TUNABLE IONIC OSCILLATOR DIELECTRIC MATERIALS AND RESONANT DEVICES

GOVERNMENT RIGHTS

This invention was made with government support under Grant No. W911NF-14-1-0500 awarded by the U.S. Army Research Office. The government has certain rights in the invention.

CROSS-REFERENCE TO RELATED APPLICATIONS

This application is a National Stage Application of International Application No. PCT/US2019/044675, filed Aug. 1, 2019, which claims the benefit of U.S. Provisional Application No. 62/713,301, filed on Aug. 1, 2018, which are hereby incorporated herein in their entirety.

TECHNICAL FIELD

The technical field generally relates to dielectric, piezoelectric, ferroelectric materials. More specifically, the technical field relates to solid state tunable materials and oscillator devices.

BACKGROUND

Ordering of ferroelectric polarization in domains [W. J. Merz, Domain formation and domain wall motions in ferroelectric BaTiO$_3$ single crystals, Phys. Rev. 95, 690-698 (1954).] and its response trajectories under field [Ruijuan Xu, Shi Liu, Ilya Grinberg, J Karthik, Anoop R Damodaran, Andrew M Rappe, and Lane W Martin, Ferroelectric polarization reversal via successive ferroelastic transitions, Nature Mater. 14, 79-86 (2015)] may be necessary for non-volatile memories [A. Chanthbouala, A. Crassous, V. Garcia, K. Bouzehouane, S. Fusil, X. Moya, J. Allibe, B. Dlubak, J. Grollier, S. Xavier, et al., Solid-state memories based on ferroelectric tunnel junctions, Nature Nanotechnology 7, 101-104 (2012)], transducers, [P. Muralt, Ferroelectric thin films for micro-sensors and actuators: a review, Journal of Micromechanics and Microengineering 10, 136 (2000)] and electro-optic devices [B. W. Wessels, Ferroelectric epitaxial thin films for integrated optics, Annu. Rev. Mater. Res. 37, 659-679 (2007)].

However, for voltage control of capacitance and frequency agility in telecommunications devices, domain walls have long been thought to be a nuisance and a hindrance, leading to high dielectric loss and hysteresis in the response to the applied electric field. [G. Arlt, U. Winger, and S. Witte, Dielectric dispersion of ferroelectric ceramics and single crystals at microwave frequencies, Ann. Phys. 506, 578 (1994)]. To avoid these deleterious effects, tunable dielectrics are often operated under piezoelectric resonance conditions, relying on operation well above the ferroelectric Curie temperature $T_C$, [Bob York, Tunable dielectrics for RF circuits, Ch. 6 of "Multifunctional Adaptive Microwave Circuits and Systems," M. Steer, ed. (2006)] and there appears to be an unavoidable trade-off between the two requirements of high tunability and low loss, leading to severe limitations on the figure of merit in tunable dielectric devices.

Current telecom devices rely on the ability to tune device frequency in the radio frequency (RF) spectrum, with the development of current bulk and thin film-based acoustic wave filters, resonators and other devices over the last few decades allowing cell phone miniaturization, antenna tuning and the development of current mobile telecom technology. Further telecom development (5G, IoT) may require an even more efficient use of the spectrum, necessitating the development of thin-film dielectrics with higher dielectric tunability n, quality factor Q, and figures of merits, and motivating an intense research and development effort. In particular, extrinsic effects such as defects, strain, interface, and polar ordering have been intensely investigated and have benefitted from the recent advances in the understanding of how functional properties can be tailored significantly, evolve from symmetry-breaking, or can even be induced artificially [C.-H. Lee, N. D. Orloff, T. Birol, Y. Zhu, V. Goian, E. Rocas, R. Haislmaier, E. Vlahos, J. A. Mundy, L. F. Kourkoutis, et al., Exploiting dimensionality and defect mitigation to create tunable microwave dielectrics, Nature 502, 532-536 (2013); A. R. Damodaran, E. Breckenfeld, Z. Chen, S. Lee, and L. W. Martin, Enhancement of ferroelectric Curie temperature in BaTiO3 films via strain-induced defect dipole alignment, Adv. Mater. 26, 6341-6347 (2014); A. R. Damodaran, C.-W. Liang, Q. He, C.-Y. Peng, L. Chang, Y.-H. Chu, and L. W. Martin, Nanoscale structure and mechanism for enhanced electromechanical response of highly strained BiFeO$_3$ thin films, Adv. Mater. 23, 3170-3175 (2011)].

Extrinsic enhancement of susceptibility from ferroelectric (FE) domain walls [Y. L. Wang, A. K. Tagantsev, D. Damjanovic, and N. Setter, Giant domain wall contribution to the dielectric susceptibility in BaTiO$_3$, Appl. Phys. Lett. 91, 062905 (2007)] can be attained by strain engineering through creation of domain wall-rich films, in which their extrinsic character allows dielectric properties not bounded by intrinsic limits of the defect-free bulk. Nevertheless, for tunable dielectrics, polar domains have not been considered helpful, and generally are equivalent to other crystal imperfections (e.g., oxygen vacancies) that must be suppressed to achieve greater material quality in order to obtain lower dielectric loss and higher figure of merit values [A. K. Tagantsev, V. O. Sherman, K. F. Astafiev, J. Venkatesh, and N. Setter, Ferroelectric materials for microwave tunable applications, J. of Electroceramics 11, 5-66 (2003)]. Therefore, domain engineering has not been investigated for tunable and low-loss dielectrics.

Complex ferroelectric domain structures have been predicted and realized in perovskite ABO$_3$ thin films such as PbTiO$_3$, Pb(Zr,Ti)O$_3$, BaTiO$_3$, (Ba,Sr)TiO$_3$ and BiFeO$_3$. The domain patterns can be engineered by the strain tuning, the orientation of the substrate termination, uniform film composition or graded, the film thickness, and/or the electrical boundary condition. Such domain patterns may be configured to achieve significant improvements in the dielectric, pyroelectric, and piezoelectric properties. Films comprised of simple c domains (e.g., out-of-plane polarization) are most common since this domain configuration is most effective for use in actuators, memory elements, and novel gates. However, the associated depolarization field particularly in thin films, compromises functionality and performance, even limiting the written state on the time scale of hours.

Ordering of ferroelectric polarization and its trajectory in response to an electric field are essential for ferroelectric and multiferroic (e.g., ferroelectric-ferromagnetic) -based non-volatile memories, transducers, electro-optic devices, analog voltage-tunable filters, antennas and phase shifters, and voltage-controlled oscillators and ferroelectric piezoelectric resonators, including, but not limited to, surface- and bulk-acoustic wave resonators.

Currently, for voltage control of capacitance and of frequency agility of resonance in telecommunications devices that utilize ferroelectric materials, hysteresis in the ferroelectric polarization-voltage (or electric field) response is problematic for establishing precise and facile (e.g., single-valued) control of capacitance with voltage (electric field), requiring ferroelectric materials to be designed and/or operated in their higher-temperature paraelectric phase, to suppress the undesirable ferroelectric hysteresis. This means that the ferroelectric phase transition, or Curie temperature $T_c$, must be appreciably below the temperature or temperature window of intended operation.

It is well known that the largest value of dielectric permittivity for a given ferroelectric material, and thus capacitance tunability, is found at or near the $T_c$ for the material. However, dielectric permittivity in a ferroelectric material rapidly decreases with temperature for $T>T_c$, where dielectric tunability relies on reorientation of field- (or voltage-) induced ferroelectric polarization, as opposed to remnant polarization. Thus, the magnitude of attainable dielectric or capacitance tunability is sacrificed to meet the need for suppression of ferroelectric hysteresis.

Dielectric loss, represented as $\tan\delta$ or its reciprocal, quality factor Q, is a key measure of the performance of a material intended for use in many of the above-mentioned devices and applications, with significant implications for the ability to transmit a particular frequency and reject others (frequency selectivity). The radio-frequency and microwave-frequency dielectric loss (quality factor) in a material is well known to increase (decrease) with increasing frequency $\omega$, in general scaling not weaker (more strongly) than linearly with $\omega$, in accordance with the fundamental theory of Akhiezer [Akhiezer, A. On the absorption of sound in solids, J. Phys. USSR 1, 277 (1939)], and refined for ferroelectrics by Tagantsev et al.

Currently, ferroelectric and non-ferroelectric piezoelectric materials are utilized in RF and microwave applications, such as filters, antennas, phase shifters, voltage-controlled oscillators, and bulk and surface acoustic wave resonators etc. Ferroelectric materials are typically utilized in their non-ferroelectric phase. Where cost is not prohibitive and there is availability, single-crystalline piezoelectric materials in bulk form are employed, such as sapphire or quartz, to provide the lowest loss, or highest quality factor. However, when cost is prohibitive and/or materials are not available in single-crystalline form, polycrystalline bulk ceramic materials are utilized, which have higher loss and lower quality factor, but are less expensive.

Single-crystalline or polycrystalline, non ferroelectric piezoelectric materials do not possess intrinsic tunability. That is, the application of voltage or electric field can cause the material to compress or expand, but there is no ability for the material to change its dielectric permittivity intrinsically. Thus, apart from small and slow changes due to temperature or pressure, there is essentially no practical capability of non-ferroelectric piezoelectric material to change its frequency. Thus, non-ferroelectric piezoelectric materials resonate at particular set of frequencies (modes) dependent on their material properties, and the geometry of the material, and cannot be altered, practically. Changes in frequency are achieved in non-ferroelectric piezoelectric materials, and are widely adopted in communications and information technologies, for example, by designing and incorporating sets of resonators of fixed frequencies, and then switching among different piezoelectric resonators in transmission and reception of signals, using techniques such as spread-spectrum frequency hopping. While this approach is prevalent, as new spectrum is available, considered, released and licensed, each time a set of new frequencies is offered, piezoelectric resonators require design and fabrication of new chipsets, rendering currently designed and fabricated piezoelectric resonator chipsets potentially obsolete.

Single-crystalline or polycrystalline ferroelectric piezoelectric materials possess an intrinsic tunability, even when the material is in its paraelectric phase, where voltage or electric field may permit rotation of remnant or induced ferroelectric polarization, thereby enabling larger changes in dielectric permittivity, which can be realized as voltage-tuned capacitance. A voltage-tunable capacitor, when introduced into an analog circuit, permits tuning of a resonant frequency, which depends in part on the adjustable capacitance. Thus, ferroelectric piezoelectrics remain attractive for voltage-tunable capacitors, resonators and analog circuits, where a continuum of frequencies may be desired, as opposed to discrete, fixed frequencies. Currently, the best ferroelectric piezoelectric resonators exhibit frequencies that can be voltage tuned by a few percent (<5%), at most. However, current ferroelectric piezoelectric materials, whether in single-crystalline or polycrystalline form, exhibit dielectric losses (quality factors) that are considerably higher (lower) than those for non-ferroelectric piezoelectric materials, making them less desirable, despite this frequency agility.

The design and manufacturing of RF and microwave components is driven in large measure by a trend towards further miniaturization of devices and device components, particularly through the use of film and thin-film ferroelectric and non-ferroelectric piezoelectric technology for the efficient, scalable manufacturing of resonators, filters, antennas, etc., and integrated circuits. This scaling of technology permits operation at lower voltages and power, ease of packaging and even integration with other technologies. The manufacture of even discrete capacitor elements benefits by miniaturization, through scalable, high-yield processing of film devices. Thus, the use of films and thin films of piezoelectric material is highly advantageous for the aforementioned technologies.

As described above, non ferroelectric piezoelectric materials in the desirable film form may be engineered in device structures to resonate and exhibit, at room temperature, values of Q that may be as high as on the order of $10^3$ in L, S, and C bands (<10 GHz). The well-developed microfabrication of piezoelectric resonators enables transmission and reception of RF and microwave frequency signals at discrete frequencies, with sufficiently low loss to permit application in mobile handsets and other radio devices, Internet-of-Things technologies, and bio- and chemical sensors based on chemically-specific binding and frequency shift due to accumulation of mass. However, the frequencies are fixed according to the resonator materials and geometry, requiring a different set of resonators for different frequencies.

Films of ferroelectric and non-ferroelectric piezoelectric material may be formed in single-crystalline or polycrystalline form, like their bulk counterparts. While polycrystalline films are advantageous for some applications, and they are easier to produce, single crystalline films have superior dielectric loss properties, since they do not possess grain boundaries that impede the flow of RF and microwave power. Therefore, single-crystal ferroelectric (in their paraelectric phase) and non-ferroelectric piezoelectric films are currently superior to polycrystalline films in this regard.

Further, ferroelectric or non-ferroelectric single crystals possessing a higher concentration of point defects and/or dislocations typically exhibit higher losses than those with fewer point defects and dislocations. Therefore, growth of high-quality single crystalline epitaxial films is desirable, if not preferred, to polycrystalline films.

As dielectric losses are related to the dissipation of normal modes in crystals (phonons) which possess a thermal population factor, reduction in the temperature results in lower dielectric losses, all other things equal, due to decreased contribution from phonons. Thus, currently a perfect crystal of a given compound at definite temperature possesses a well-defined frequency scaling of its dielectric loss or quality factor. In practical crystals, which have a finite thermodynamically limited non-zero concentration of defects, a so-called intrinsic limit on temperature-dependent dielectric loss or quality factor is not attained. This has encouraged RF and microwave applications utilizing bulk single crystals and low-temperature operation, even utilizing superconducting electrodes to reduce resistive contributions to loss.

Currently, ferroelectric domain walls, which form spontaneously in a ferroelectric material below the material's $T_c$ due to favorable energetic considerations, are problematic because, like point defects, dislocations, and grain boundaries, domain walls are significant sources of scattering of energy, and thus can be significant sources of dielectric loss. In particular, currently dielectric loss depends significantly on domain wall density, regardless of the domain wall type. Thus, to avoid these deleterious effects, tunable dielectrics are often operated under piezoelectric resonance conditions, relying on operation well above the ferroelectric Curie temperature $T_c$ and there appears to be an unavoidable trade-off between the two requirements of high tunability and low loss, leading to severe limitations on the figure of merit in tunable dielectric devices.

SUMMARY

Described herein are domain wall-dense and multiple domain wall-variant engineered materials such as dielectric meta-materials. Such engineering may include ordering of polarization. Ordering of spontaneous ferroelectric polarization, for example, is essential to non-volatile memories, piezoelectric transduction, and electro-optic devices and hysteresis-free frequency-agile filters and antennas that function via voltage tuning of capacitance.

Engineering increases in dielectric, piezoelectric and ferroelectric properties have been realized through interfacially driven phenomena attained by arrangement of phases in superlattices, by engineering nanocomposites, by engineering films so that point defects are aggregated in ways that reduce dielectric loss as compared with a random placement of those defects, or by engineering solid solutions designed to operate at or near a morphotropic phase boundary separating well-defined structural phases. In ferroelectric thin films, the extrinsic enhancement of susceptibility from domain wall pinning can be attained by strain engineering at room temperature through creation of a domain wall-rich film. The design and realization of a heterogeneous dielectric meta-material is presented that is distinguished by the phase proximity of and accessibility among two or more thermodynamically predicted ferroelectric domain wall variant types.

Among the most compelling unsolved science and technology challenges for communications, navigation, telemetry, etc. are those relating to new materials and device concepts that can deliver disruptive advances in frequency selectivity, spectrum management and reduced power requirements, through material non-linear response characteristics. Expanding the realm of possible interactions of RF microwave energy with dielectric solids that govern propagation and that enable tuning of thermodynamic and physical properties is critical to identifying and enhancing novel sources of non-linear responsiveness of media to external DC and EM fields, and ultimately exploiting these interactions.

Microwave oscillators play a critical role, where the combination of low loss/high quality factor, narrow bandwidth or large tunability, low phase noise, low power consumption/high output power, temperature stability, and frequency settling times are all important considerations. Current solid state microwave oscillators, whether implemented using dielectric resonator oscillators, or using surface acoustic wave (SAW) or bulk acoustic wave (BAW) resonators, or film bulk acoustic wave resonators (FBARs), or within monolithic microwave integrated circuits (MMICs), are challenged by a tradeoff between a requirement for high quality factor that, in a simple device element, is juxtaposed against an inherent limitation on tunability, requiring complex circuits to meet design requirements. Further, the dielectric loss is understood to be intrinsically limited, theoretically, though this is rarely reached. Parametric power amplifiers (PAs) remain attractive alternatives to transconductance PAs because of their near-perfect RF-RF conversion efficiencies. Additionally, parametric systems are not expected to suffer from the gain-bandwidth product that limits the usable bandwidth of transconductance PAs. Parametric amplifiers typically comprise at least two basic components: a variable ac capacitor (variac) and an oscillator.

The present disclosure relates to a new microwave oscillating medium based on novel atomic-scale ionic oscillators that can be realized in a ferroelectric solid, and enables ultra-low loss at selected frequencies that can be designed and controlled based on the density, type and characteristics of the defects, rather than the material density and acoustic wave velocities.

The Attachments and Appendices to this application are incorporated herein and deemed to be part of the application as if otherwise incorporated. The specific compositions and other features disclosed in these Attachments and Appendices, and obvious extensions thereof, are considered to be additional embodiments of the present invention as if specifically described in the body of the specification.

µC/cm². In (d-g) plotted is the angle of in-plane polarization θ=±90°, where θ is the angle between and the sum of the two in-plane components $P_1+P_2$.

Figure 3:
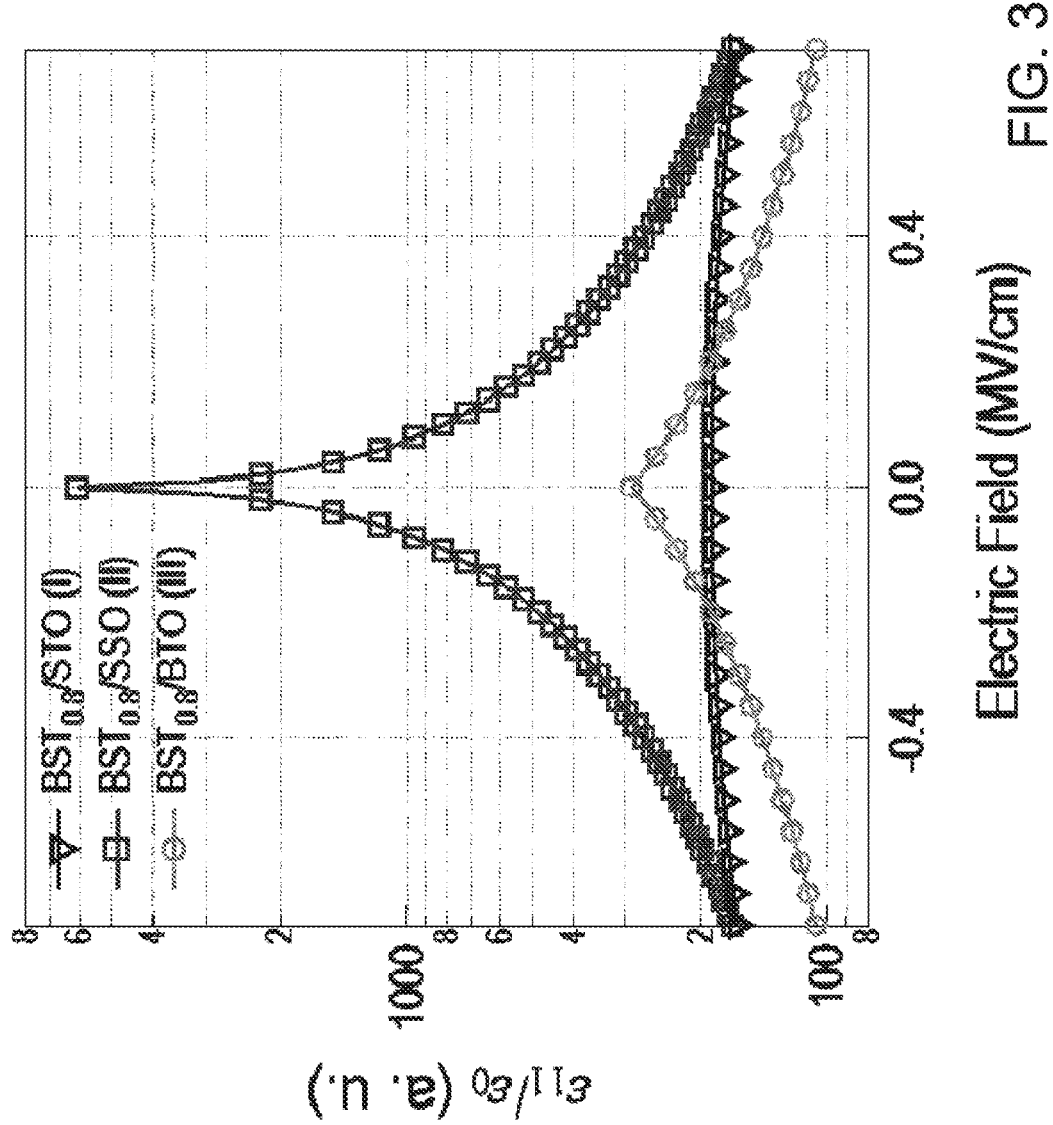

FIG. 3. The effect of proximity to this domain phase variant degeneracy point is seen, showing theoretically-predicted in-plane quasi-static field tunability of relative dielectric permittivity $\varepsilon_{11}/\varepsilon_0$ in $Ba_{0.8}Sr_{0.2}TiO_3$ films on $SrTiO_3$, on $SmScO_3$, and on $BaTiO_3$, corresponding to strain states I, II and III, respectively, calculated using the GLD model.

Figure 4A:
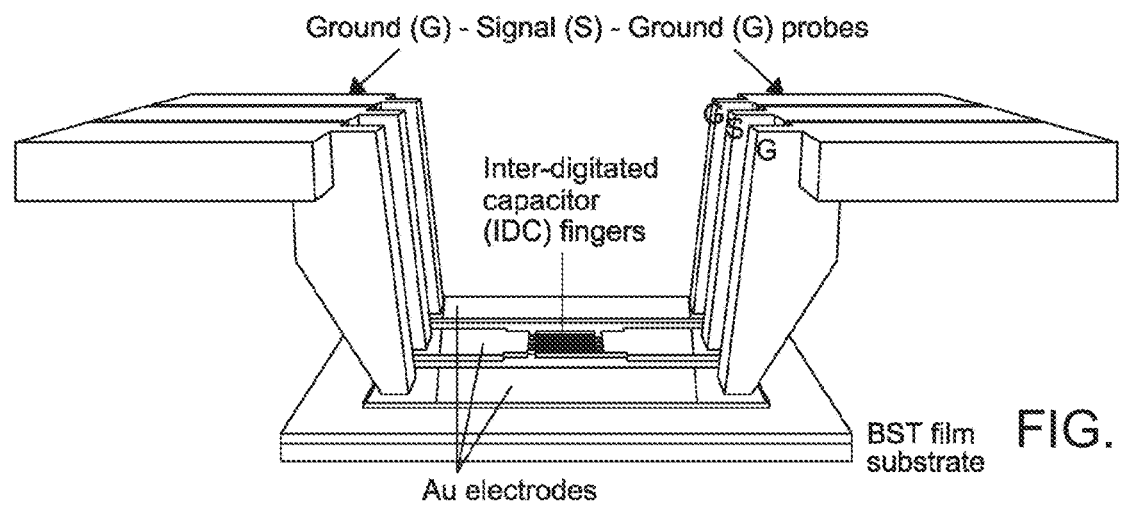
Figure 4B:
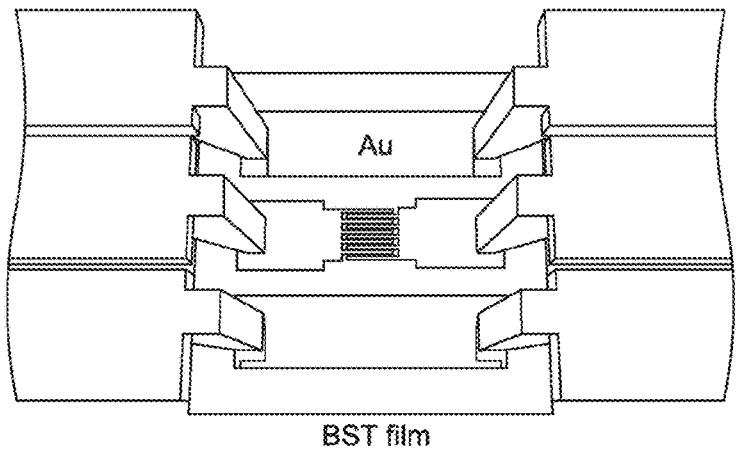

FIGS. 4A-4B Illustration of the experimental two-port, interdigitated electrode capacitor geometry.

Figure 5:
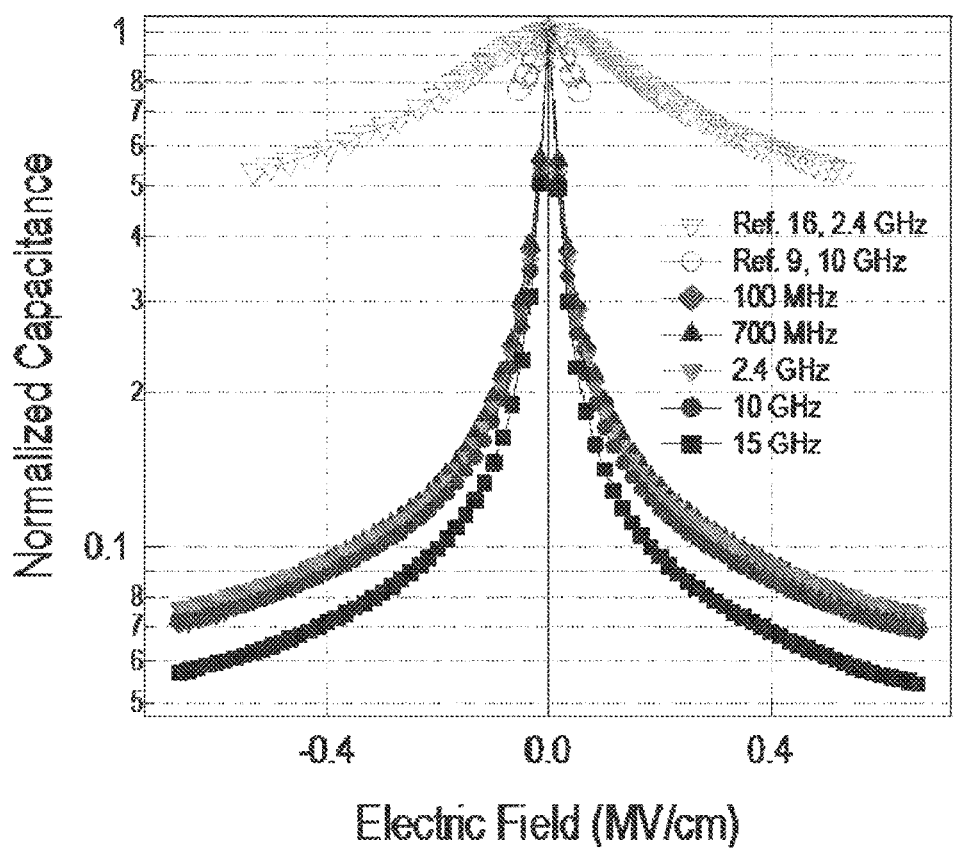

FIG. 5. Measured in-plane field tuning of in-plane normalized capacitance $C_{norm}(E)$ at selected frequencies for a 400 nm-thick manifold domain-wall-variant material (or meta-material) film sample ($Ba_{0.8}Sr_{0.2}TiO_3/SmScO_3(110)$), compared with that for epitaxial paraelectric (Ba,Sr)TiO₃ (BST)[C. J. G. Meyers, C. R. Freeze, S. Stemmer, and R. A. York, (Ba, Sr)TiO₃ tunable capacitors with RF commutation quality factors exceeding 6000, Appl. Phys. Lett. 109, 112902 (2016)] and $Sr_7Ti_6O_{19}$ [C.-H. Lee, N. D. Orloff, T. Birol, Y. Zhu, V. Goian, E. Rocas, R. Haislmaier, E. Vlahos, J. A. Mundy, L. F. Kourkoutis, et al., Exploiting dimensionality and defect mitigation to create tunable microwave dielectrics, Nature 502, 532-536 (2013)].

FIGS. 6A-6C: microwave spectroscopy revealing field-dependent resonant domain wall spectral signatures of ultra-low loss, and tunable resonant performance. Experimentally determined Q plotted as a function of frequency and DC in-plane bias field for a 100 nm-thick film with a, ten and b, six IDC electrode pairs, distinguished by the period 2 W defined by the electrode finger width w and inter-electrode spacing d as shown in the optical micrographs that appear as an inset within each (scale bar: 10 µm). C and D: extracted values of frequency and field for which Q peaks are obtained for devices in A and B showing that the spectra of voltage-dependent frequencies for which the resonant Q peaks occur are essentially the same, and that the resonant frequency can be bias tuned by ≈400%, from ≈2 GHz at ≈0.1 MV/cm, to ≈10 GHz at ≈0.67 MV/cm, with 10³ approximately less than or equal to Q approximately less than or equal to 10⁶. Representative traces of DC field-dependent Q, for selected frequencies shown in the legend, corresponding to devices shown in FIGS. 6A-6C.

Figure 7:
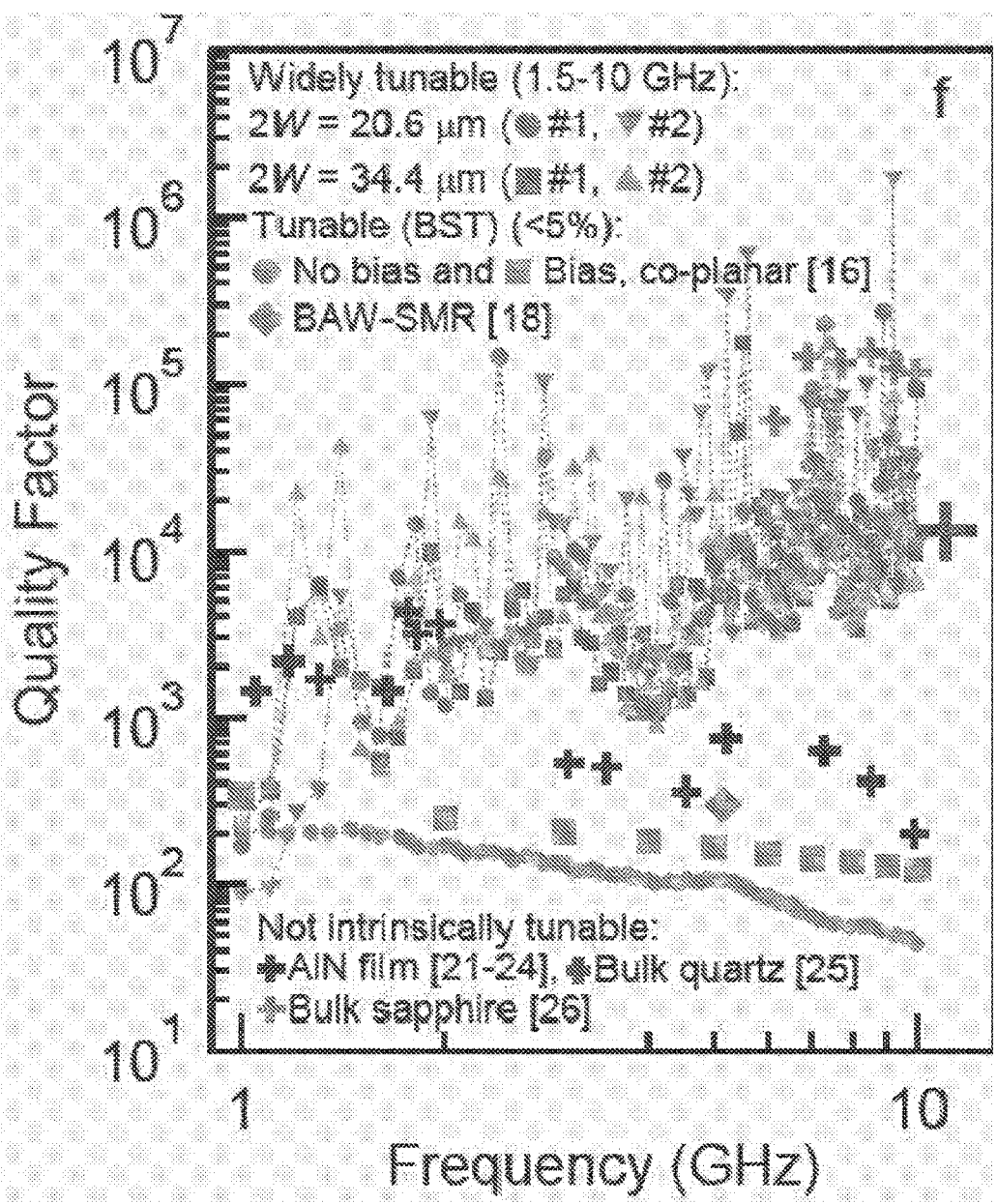

FIG. 7. Peak Q collected at 100 frequencies in four different devices showing an increase of more than one order of magnitude over approximately one decade of frequency, deviating strongly from the usual 1/f scaling law. Shown for comparison are highest values for bulk single crystal quartz, sapphire, and MN film piezoelectric resonators, none of which are intrinsically tunable (each point represents an individual device), and those reported for intrinsically tunable BST films, including for a film bulk acoustic wave solidly-mounted resonator (BAW-SMR).

Figure 8A:
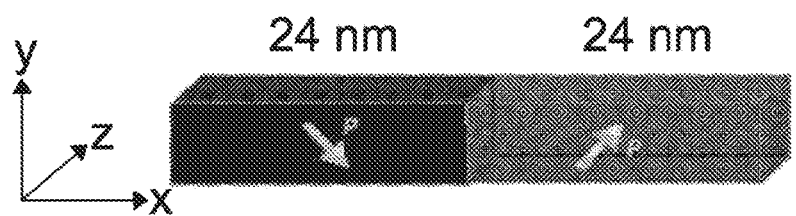
Figure 8B:
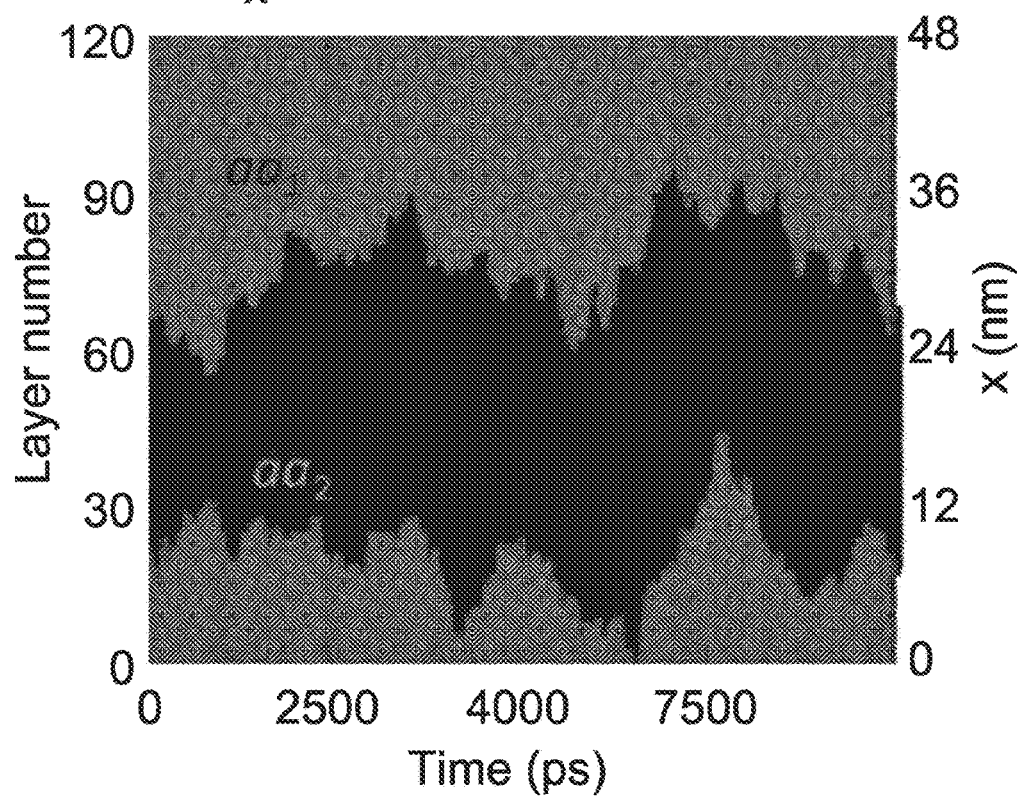

FIGS. 8A-8B. MD simulation of Q. a, An illustration of the MD supercell and domain fluctuations at $E_x$=0.6 MV/cm with the $P_y$>0 domain shown in black and $P_y$<0 domain shown in gray.

Figure 9:
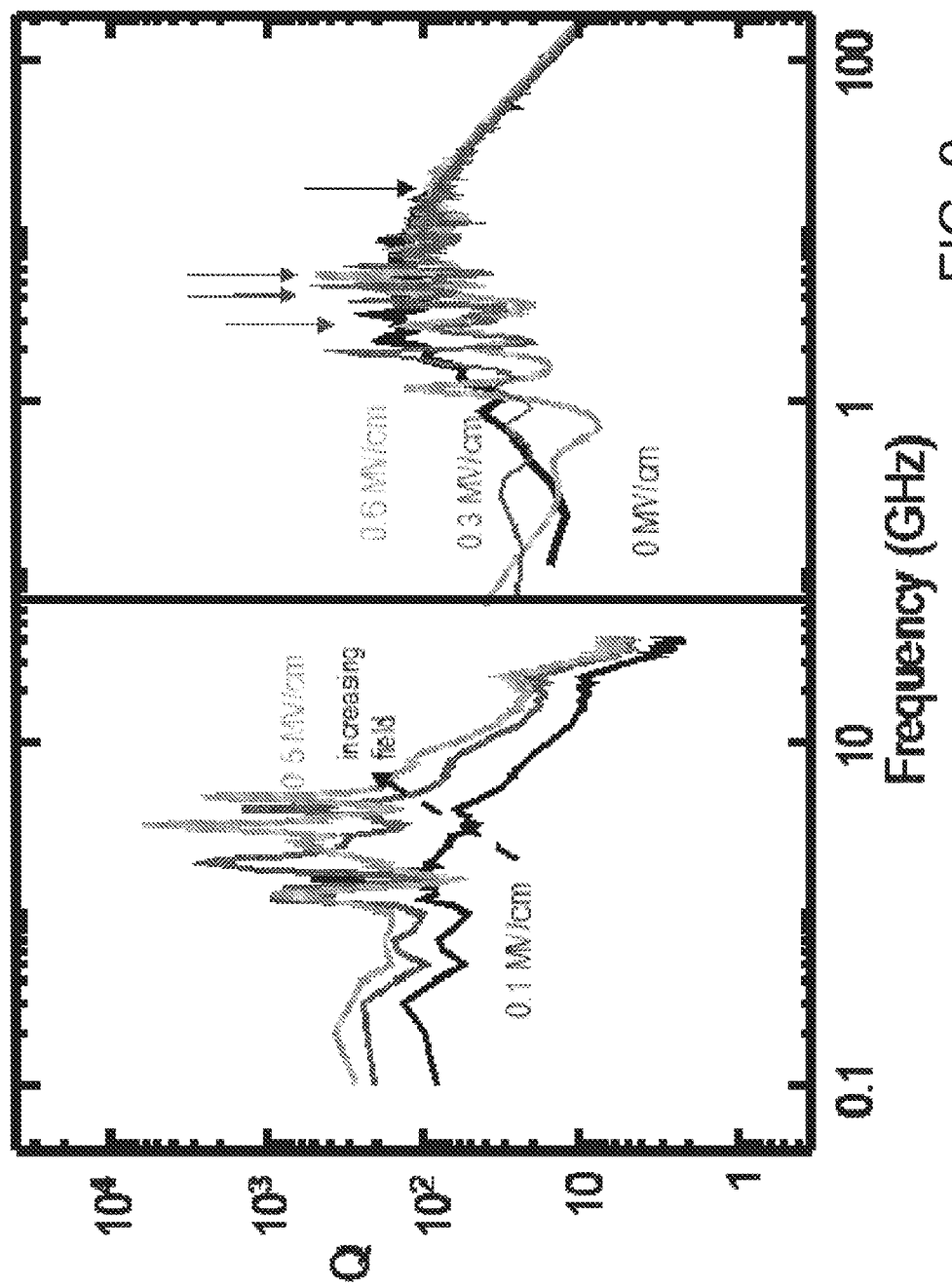

FIG. 9. Q obtained experimentally (left panel) and $Q_y$ of MD simulations (right panel) for the $aa_1/aa_2$ domain structure. Experimental data shown for E=0.09, E=0.25 MV/cm, and E=0.5 MV/cm). MD data are shown for E=0, E=0.3 MV/cm (green), and E=0.6 MV/cm.

Figure 10:
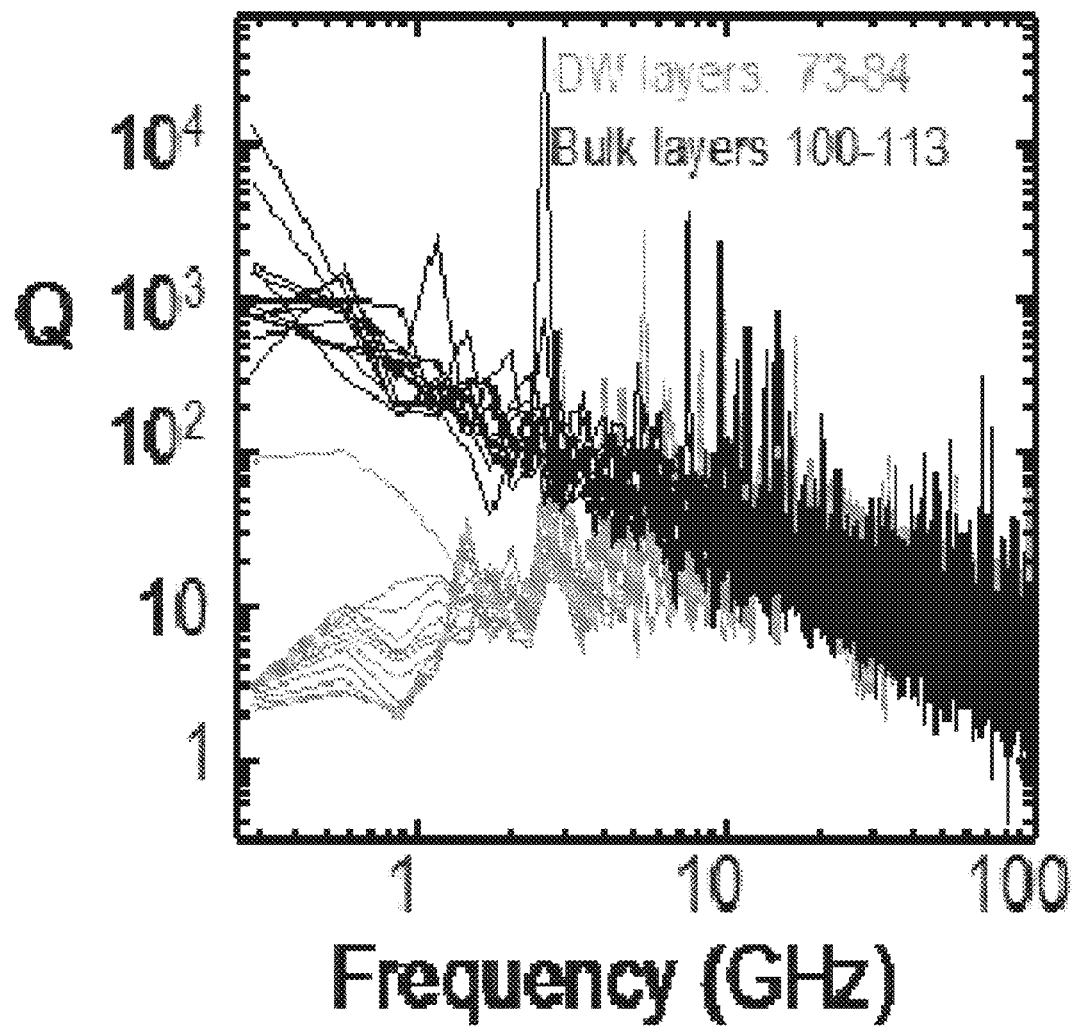

FIG. 10. Q(f) for the bulk-like layers 100-113 and DW layers 73-84 from MD simulations at E=0.6 MV/cm.

Figure 11:
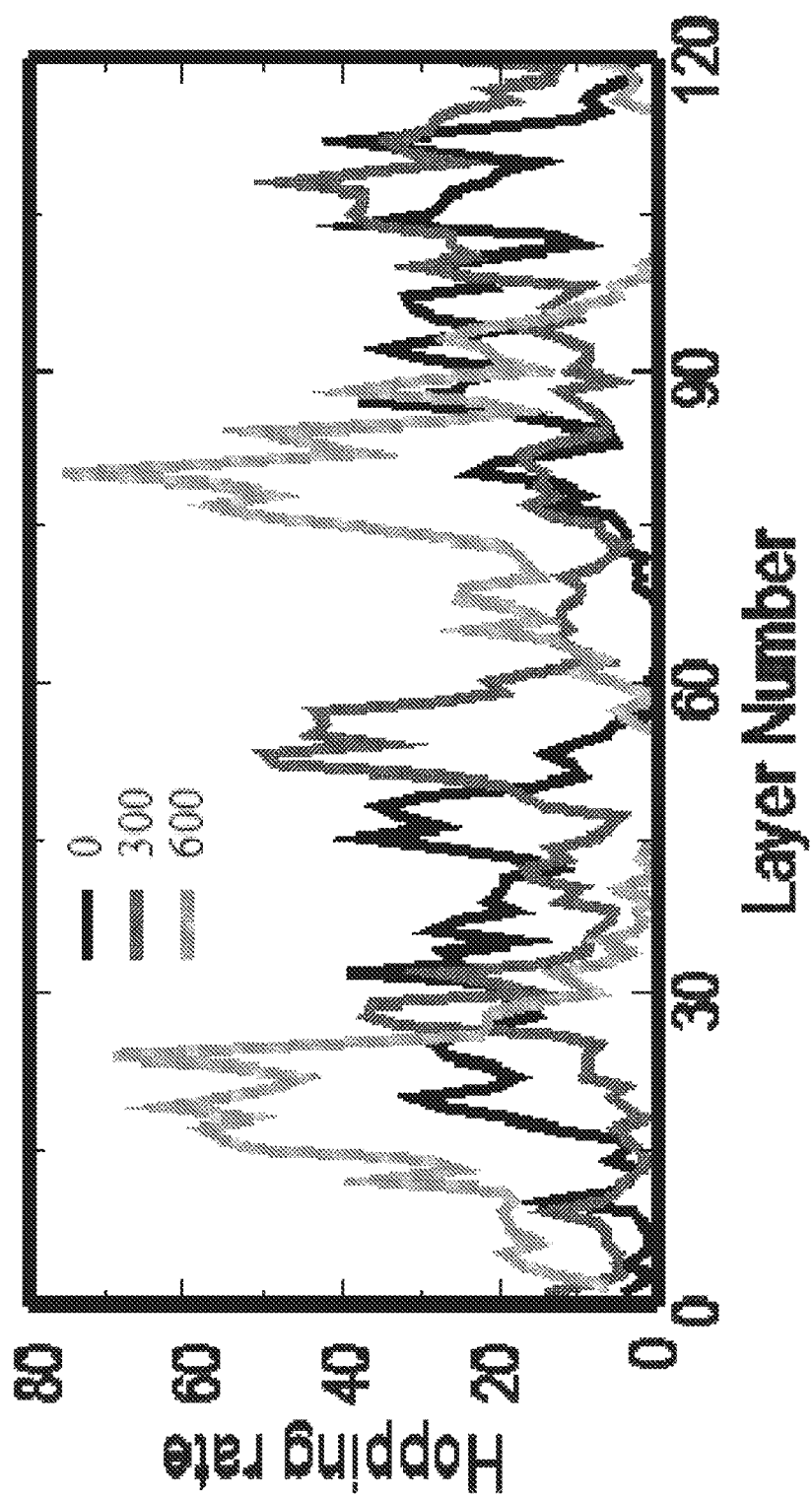

FIG. 11. Hopping rates for individual layers of the 120× 10×10 supercell.

Figure 12:
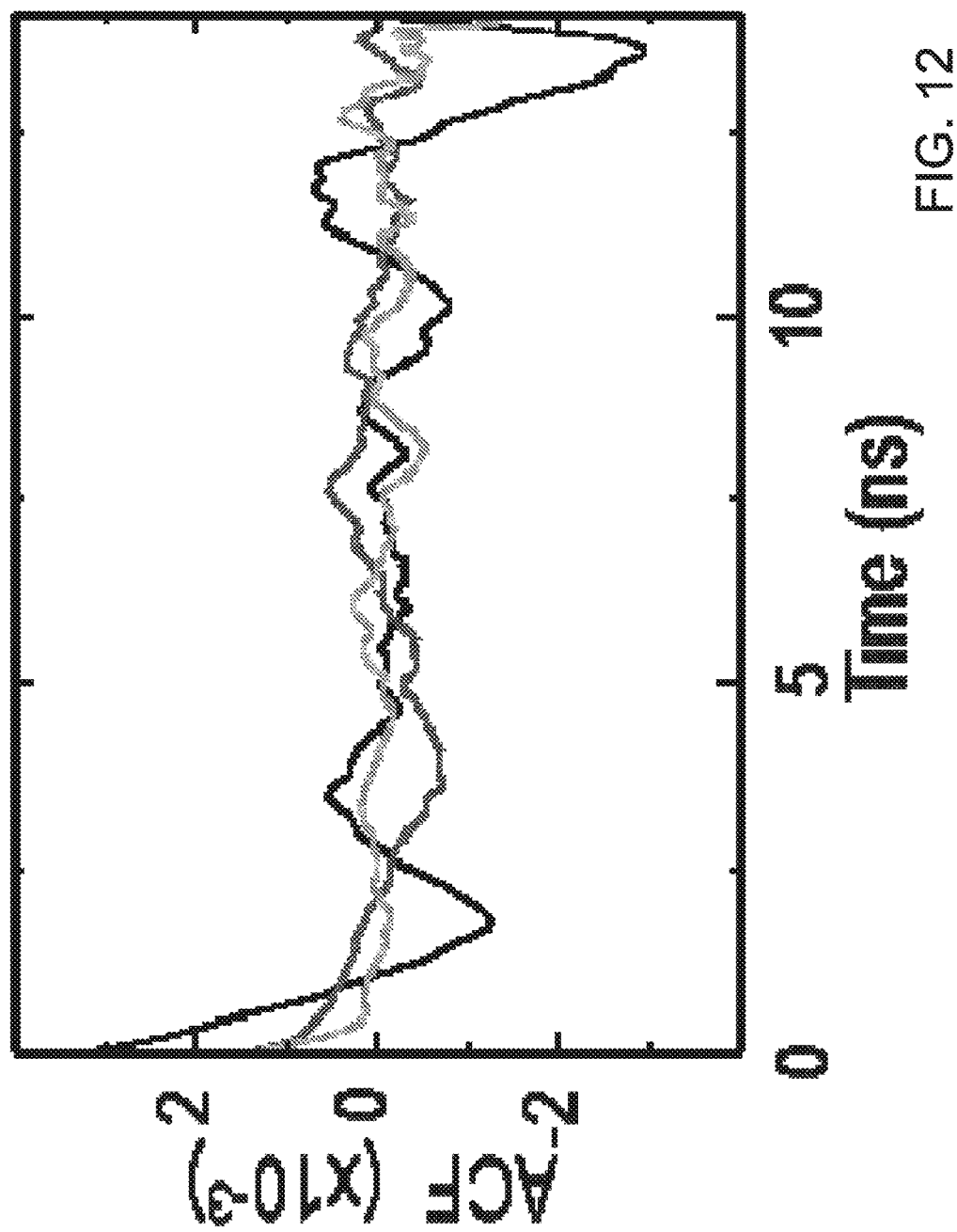

FIG. 12. Total P time autocorrelation functions obtained from MD simulations for E=0, E=0.3 MV/cm, and E=0.6 MV/cm.

Figure 13C:
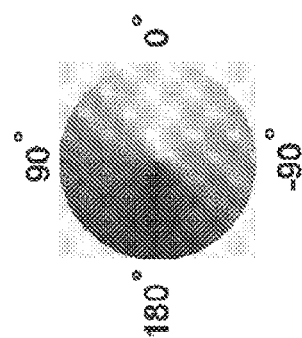
Figure 13C:
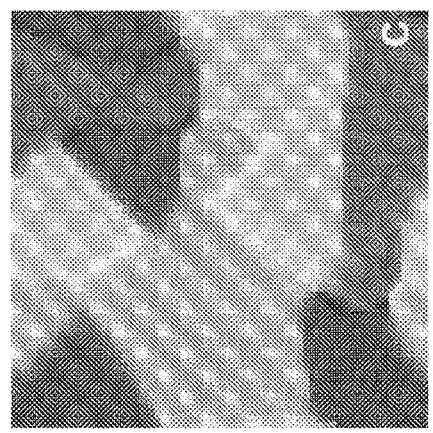
Figure 13B:
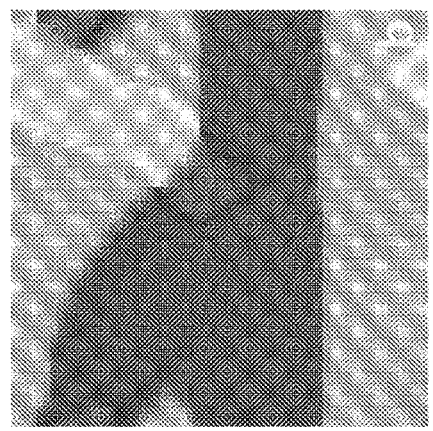
Figure 13A:
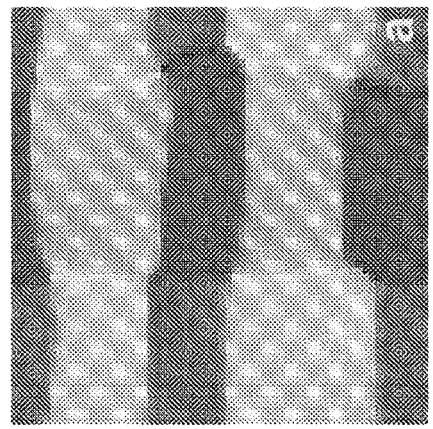
Figure 14B:
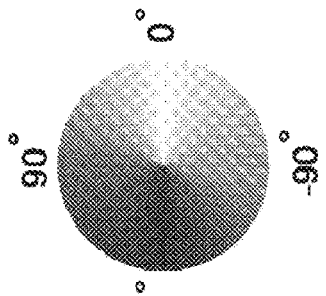
Figure 14B:
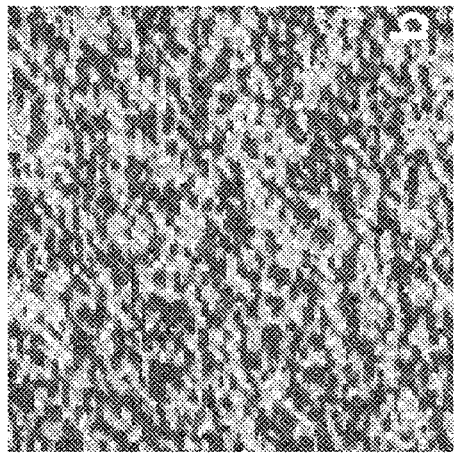
Figure 14D:
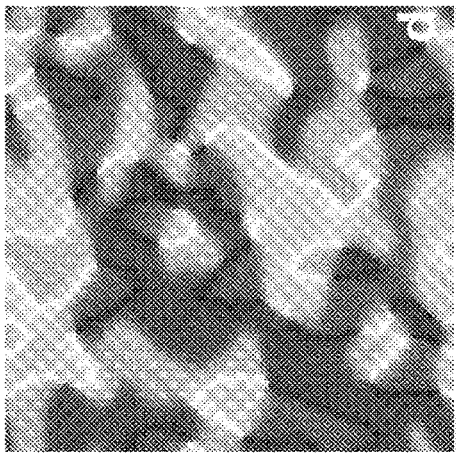
Figure 14A:
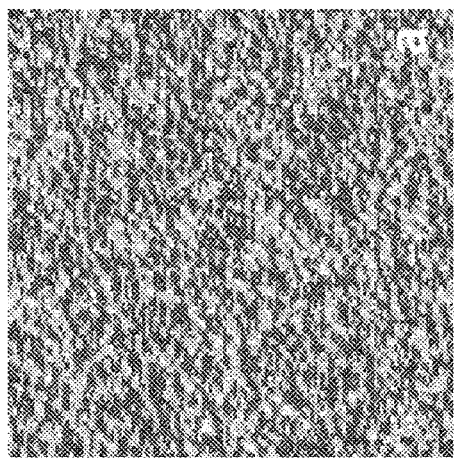
Figure 14C:

FIGS. 13A-13C. Phase field simulations of Case II with a cell containing 64×64×64 grid points using three different initial conditions.

FIGS. 14A-14D. Phase field simulations of Case II with a cell containing 128×128×128 grid points using different values for $G_{11, BIO}$ as indicated below each figure panel.

Figure 15:
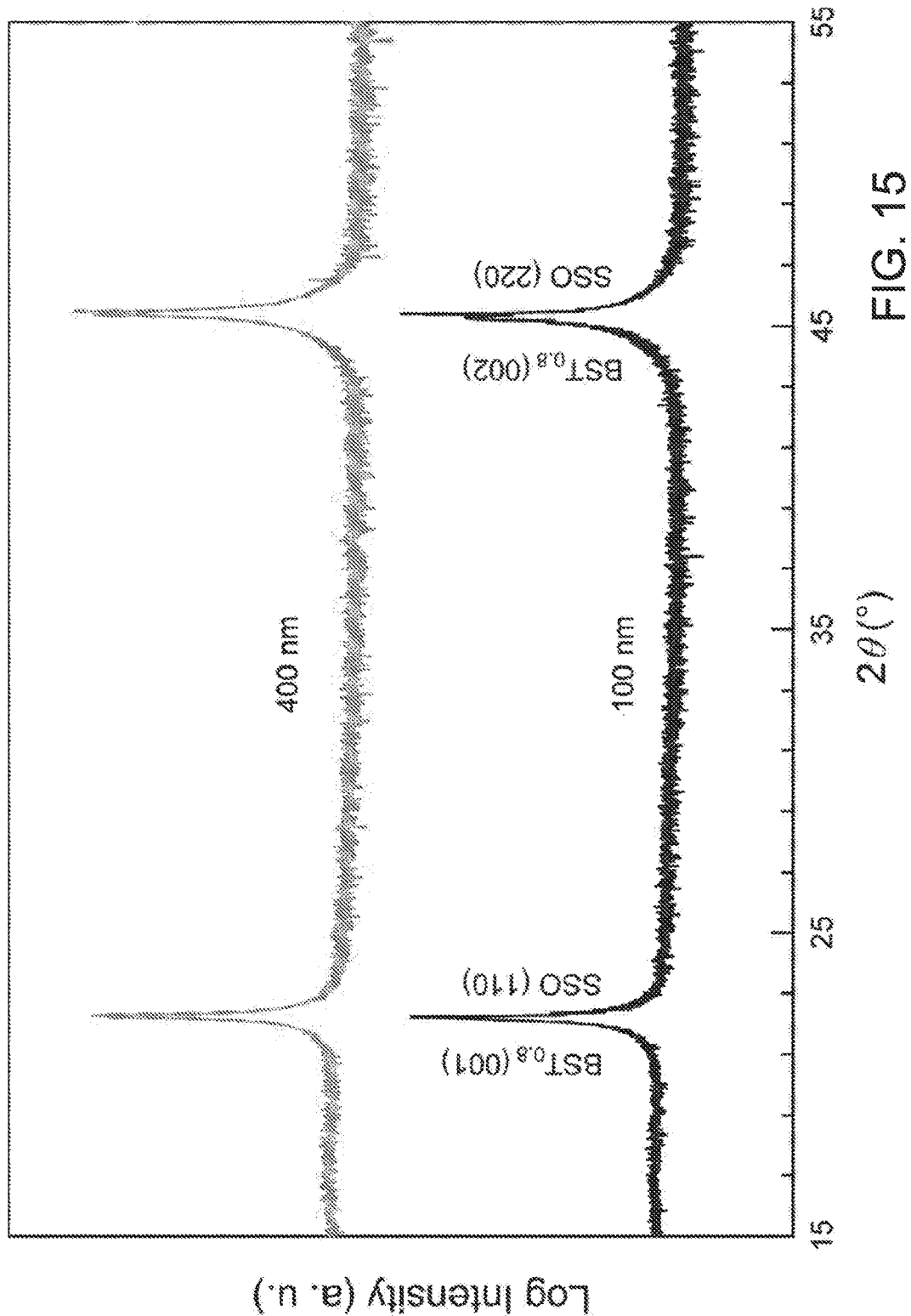

FIG. 15. X-ray diffraction collected on 100 nm and 400 nm thick BST epitaxial films deposited on SmScO₃ (110). The small peaks in addition to the film and substrate are attributed to Umweg peaks.

Figures 16A, 16B:
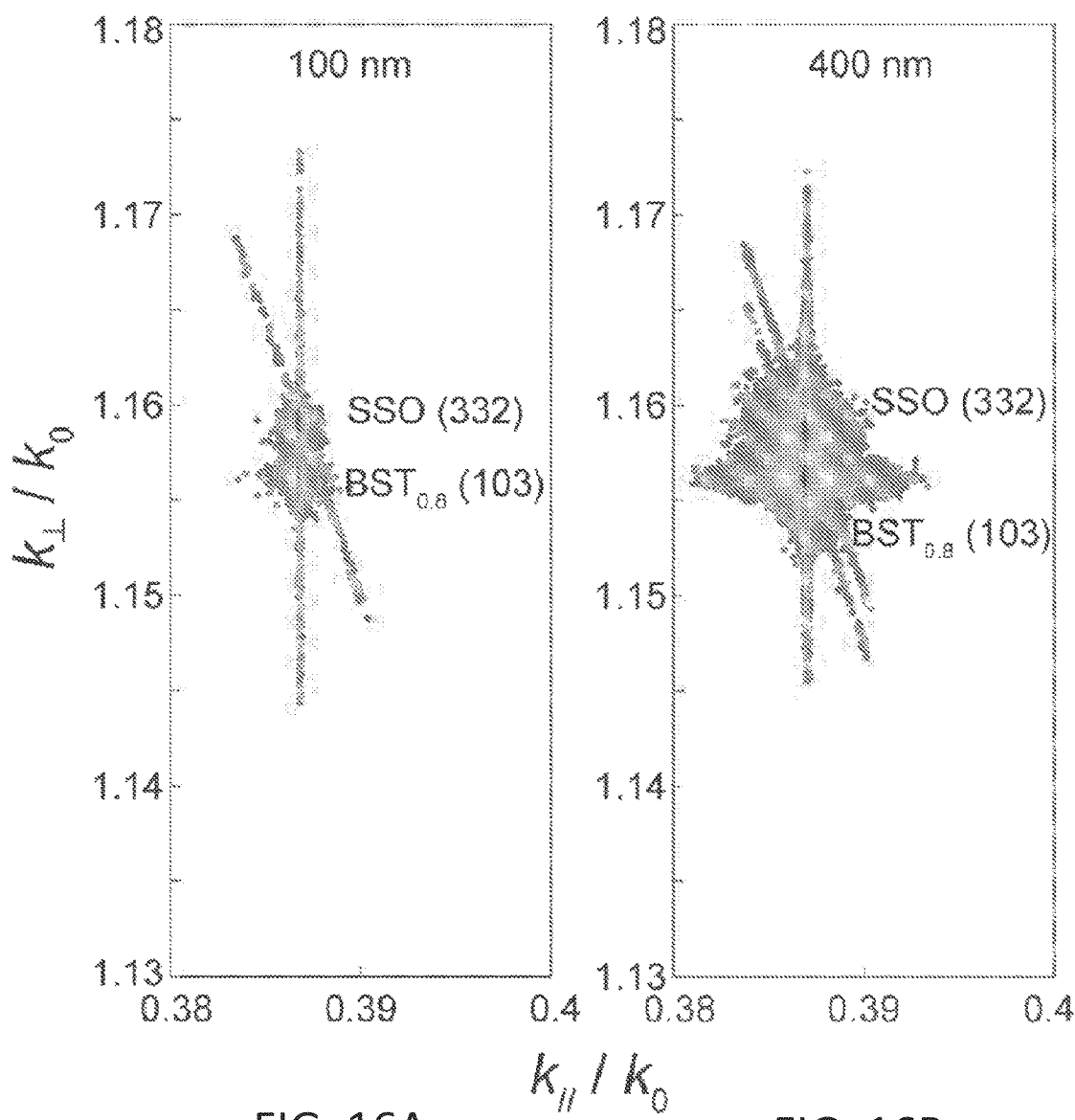

FIGS. 16A-16B. Reciprocal space maps (RSMs) showing, left-to-right (103) film and (332) SSO substrate reflections in 100 nm and 400 nm thick x=0.8 film samples, confirming that the films are epitaxial and strain coherent.

FIG. 17. Rutherford backscattering spectroscopy analysis results, obtained on a BST film, confirming no A-site deficiency, within the known 1% error.

Figure 18A:
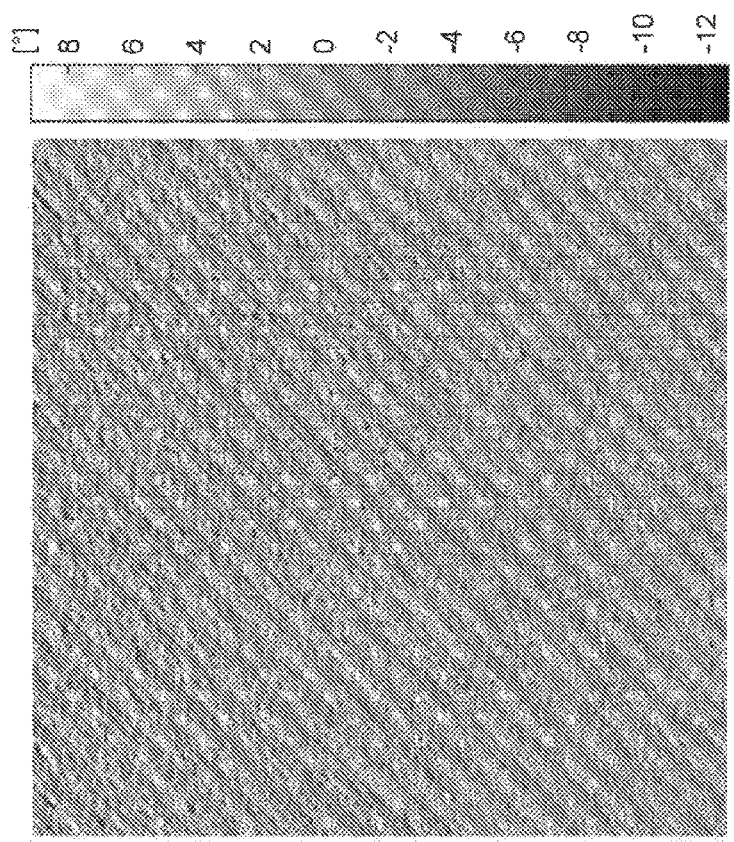
Figure 18B:
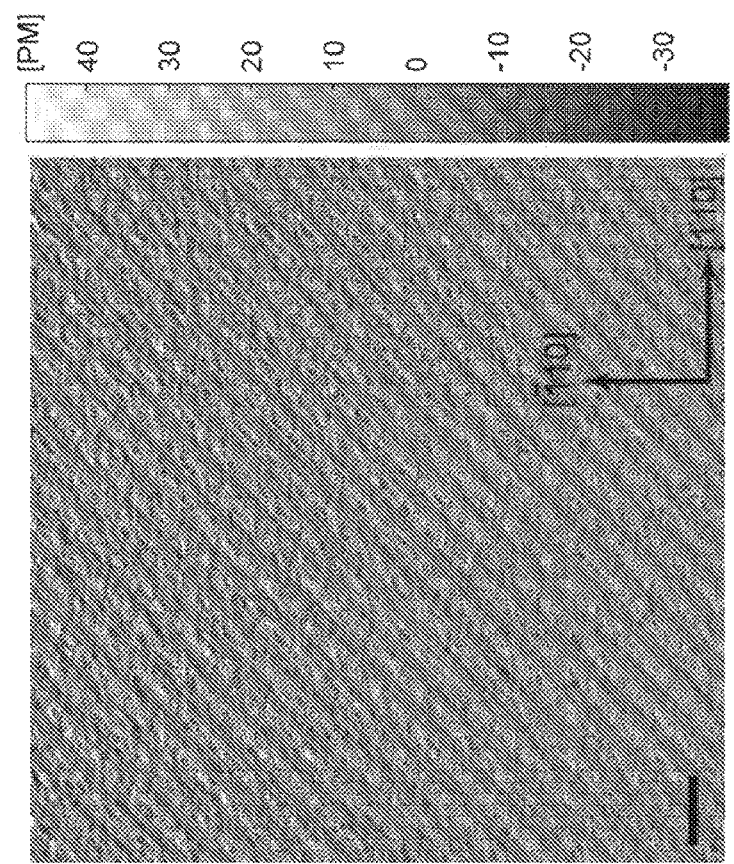

FIGS. 18A-18B. Dual-amplitude resonance tracking (DART) lateral-force piezoresponse force microscopy (PFM) images (amplitude on the left, and phase on the right) collected on a ≈100-120-nm thick $Ba_{0.8}Sr_{0.2}TiO_3$ film on SSO, with crystallographic orientation denoted. The diagonal pattern confirms that the films possess dense $aa_1/aa_2/aa_1/aa_2$ type superdomain structure as described in the main text. The scale bar corresponds to 1 µm.

Figure 19:
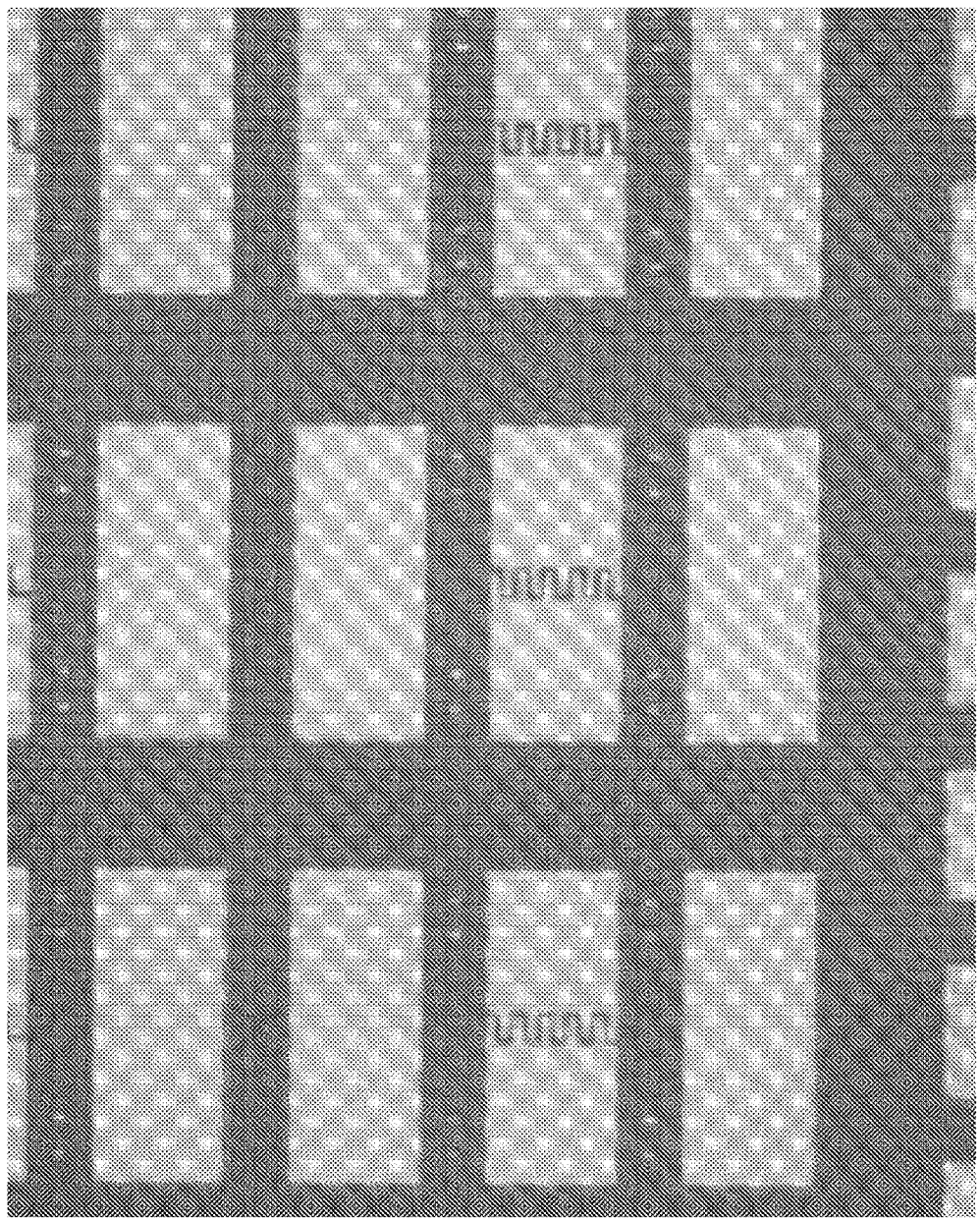
Figure 20A:
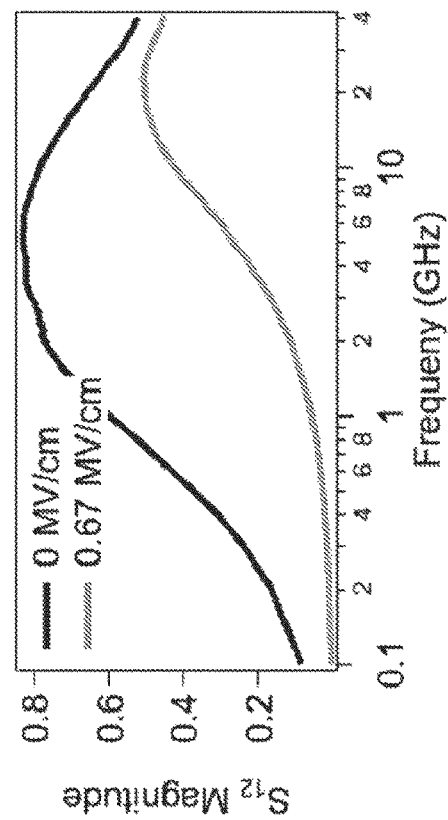
Figure 20C:
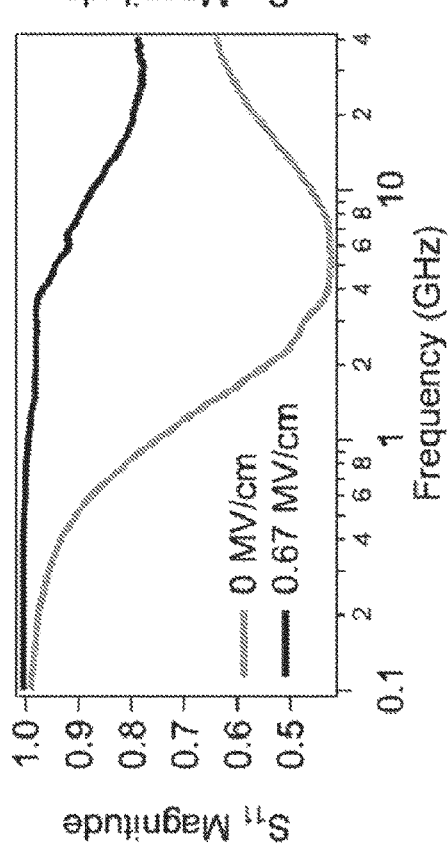
Figure 20B:
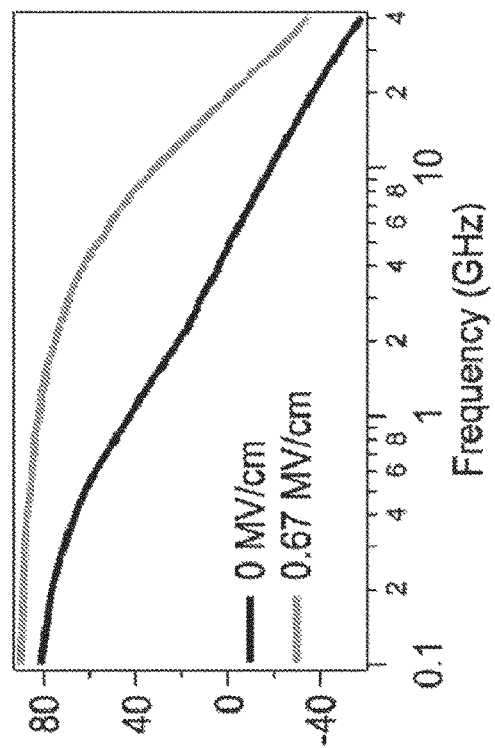
Figure 20D:
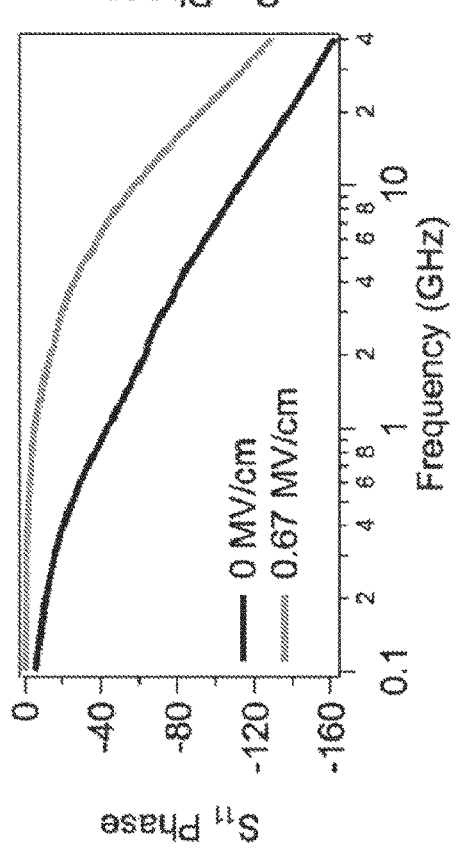

FIG. 19. Optical micrograph of a representative two-port ten interdigitated-finger electrode capacitor (IDC) devices; the devices shown above were fabricated on a 100 nm-thick film, and have inter-electrode gap spacing of 3 µm.

FIGS. 20A-20D. Representative measured S parameter data collected from a 400 nm-thick film device.

Figure 21:
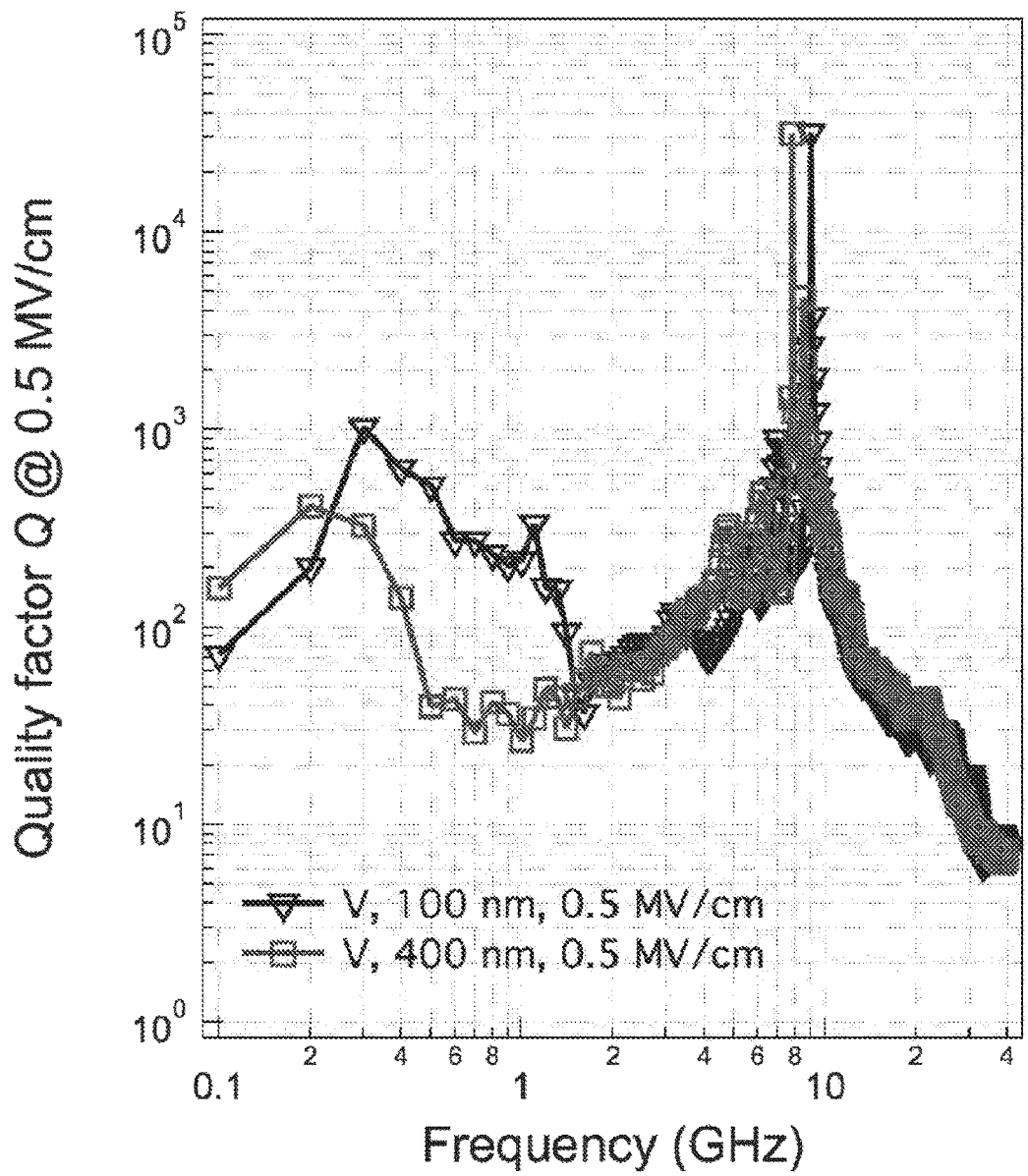

FIG. 21. Measured quality factor Q at 0.5 MV/cm.

Figure 22:
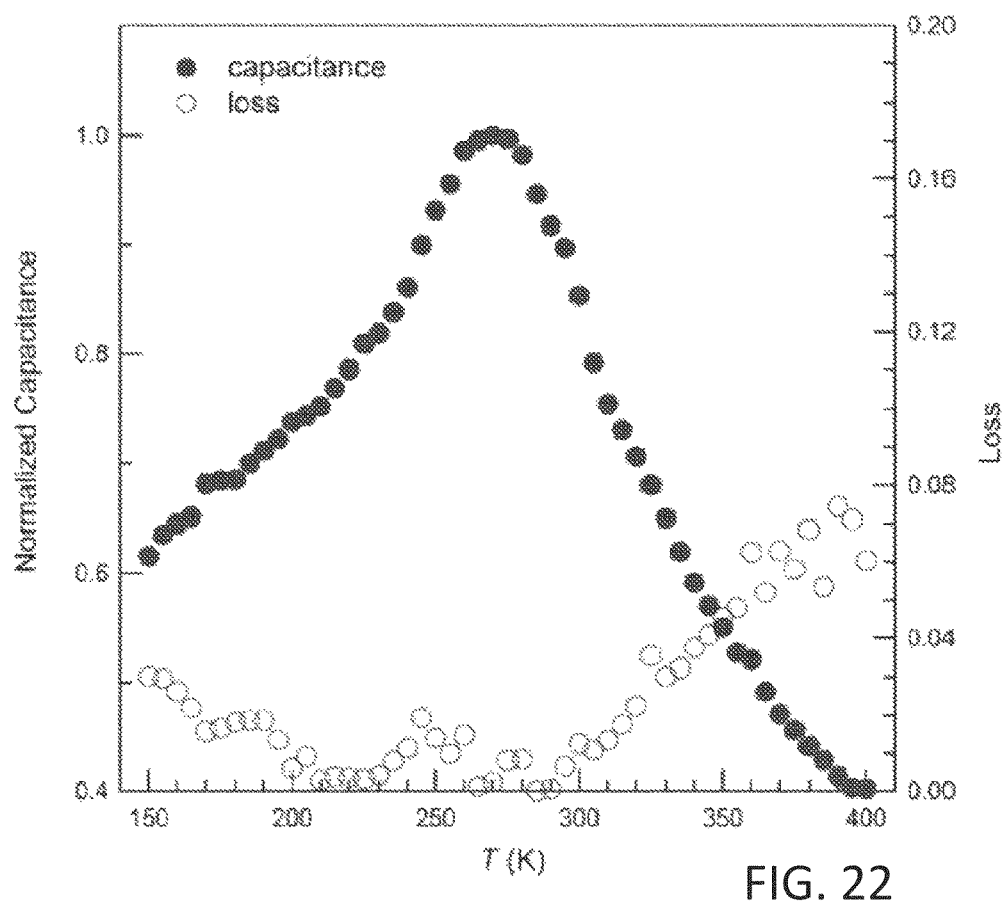

FIG. 22. Measured zero-bias temperature-dependent capacitance and loss at 1 MHz.

Figure 23:
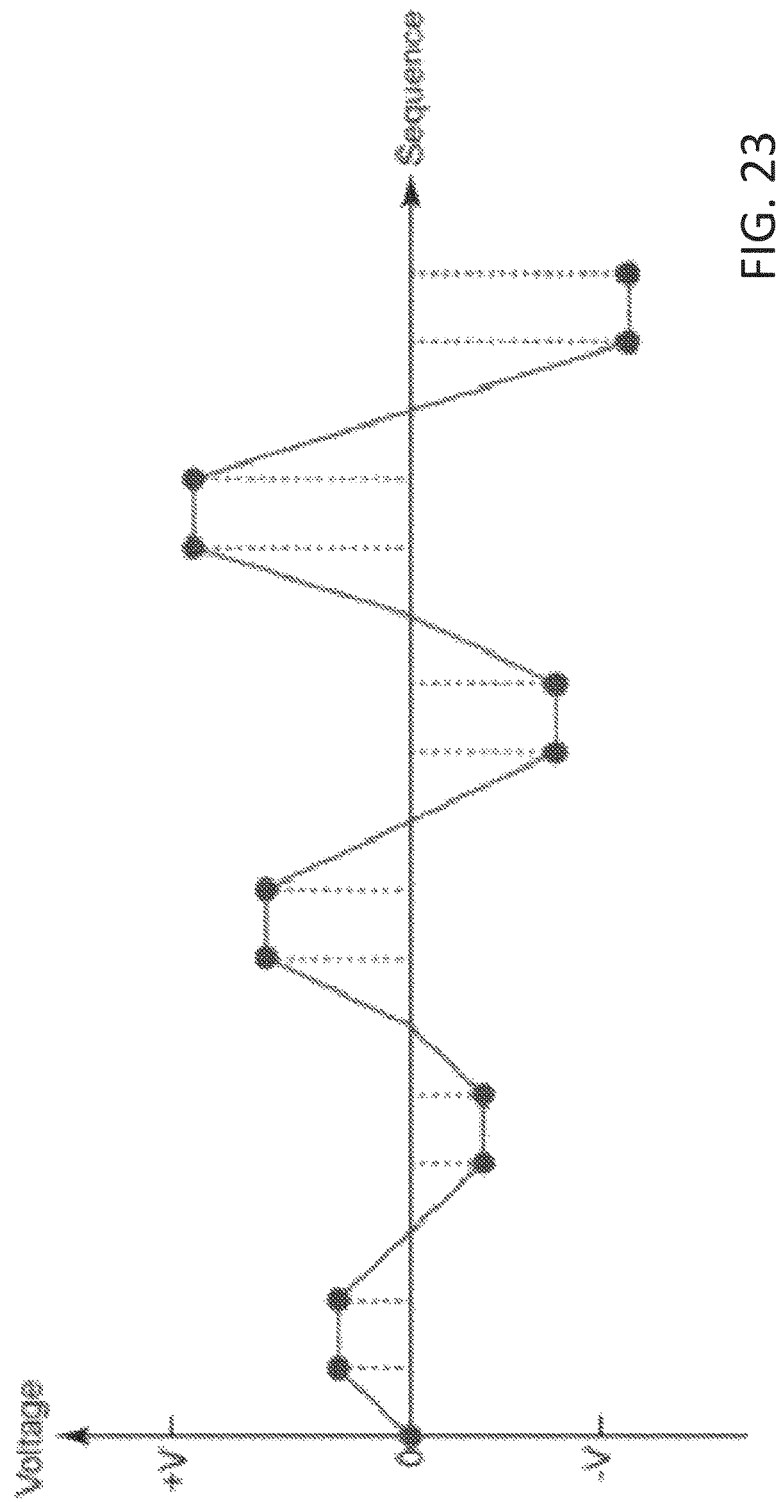

FIG. 23. Illustration of voltage-time measurement sequence employed in voltage sweeps.

Figure 24:
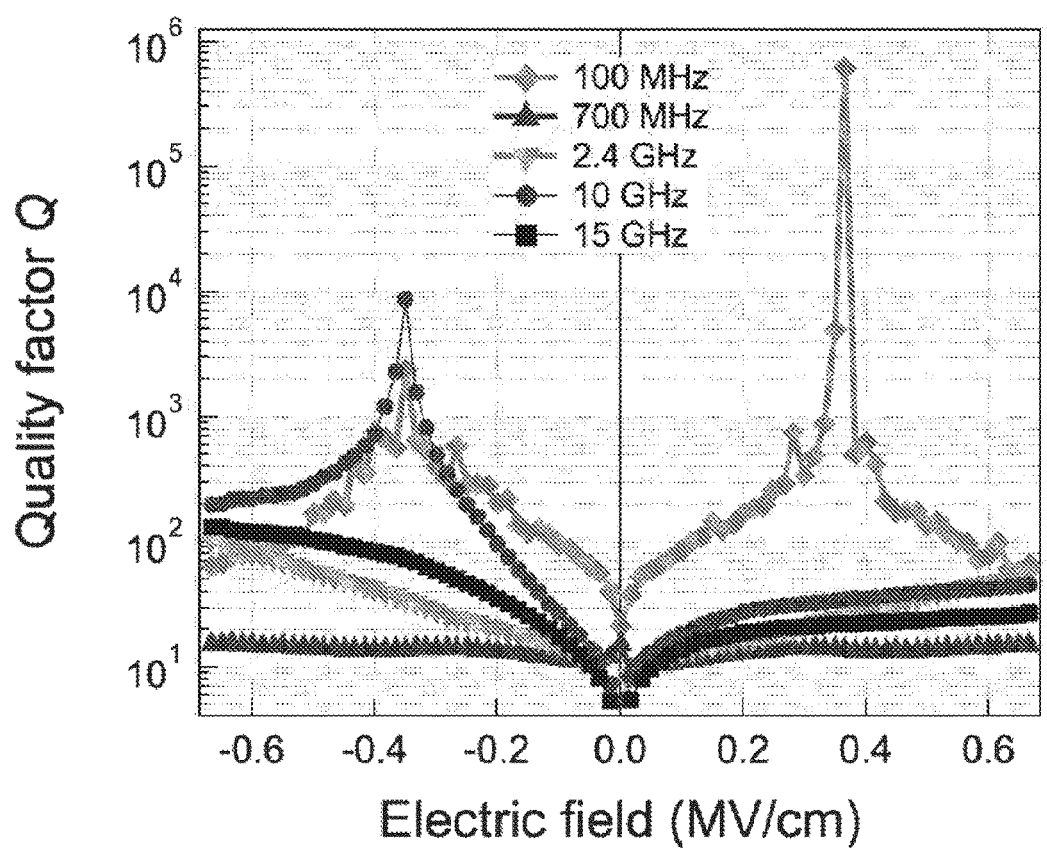

FIG. 24. Measured field dependence of Q corresponding to a sample.

Figure 25:
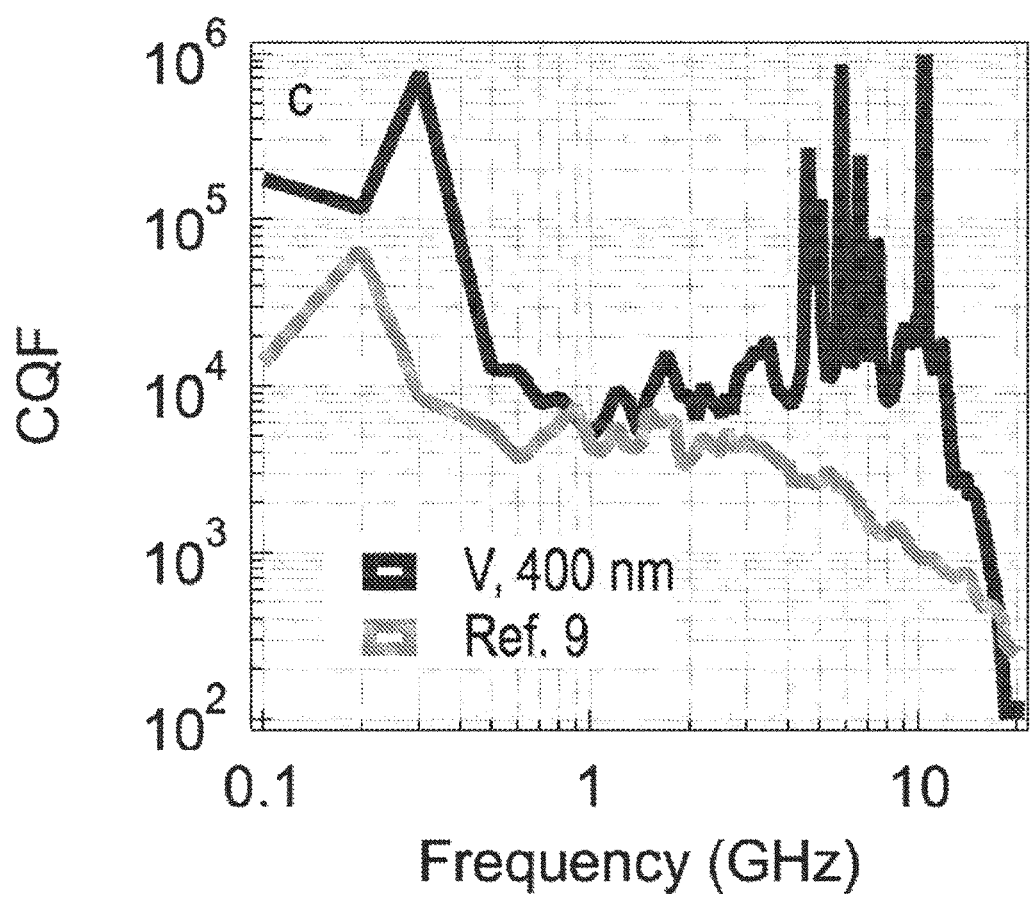

FIG. 25. The commutation quality factor CQF(f)=(n(f)−1)² Q(0,f) Q(E,f)ln(f) [I. B. Vendik, O. G. Vendik, and E. L. Kollberg, Commutation quality factor of two-state switchable devices, IEEE Transactions on Microwave Theory and Techniques 48, 802-808 (2000).], a key metric that incorporates n(E) and Q(E) shows values that, in this range, are greater than those of the best films reported [C. J. G. Meyers, C. R. Freeze, S. Stemmer, and R. A. York, (Ba, Sr)TiO₃ tunable capacitors with RF commutation quality factors exceeding 6000, Appl. Phys. Lett. 109, 112902 (2016)] to date.

Figure 26:
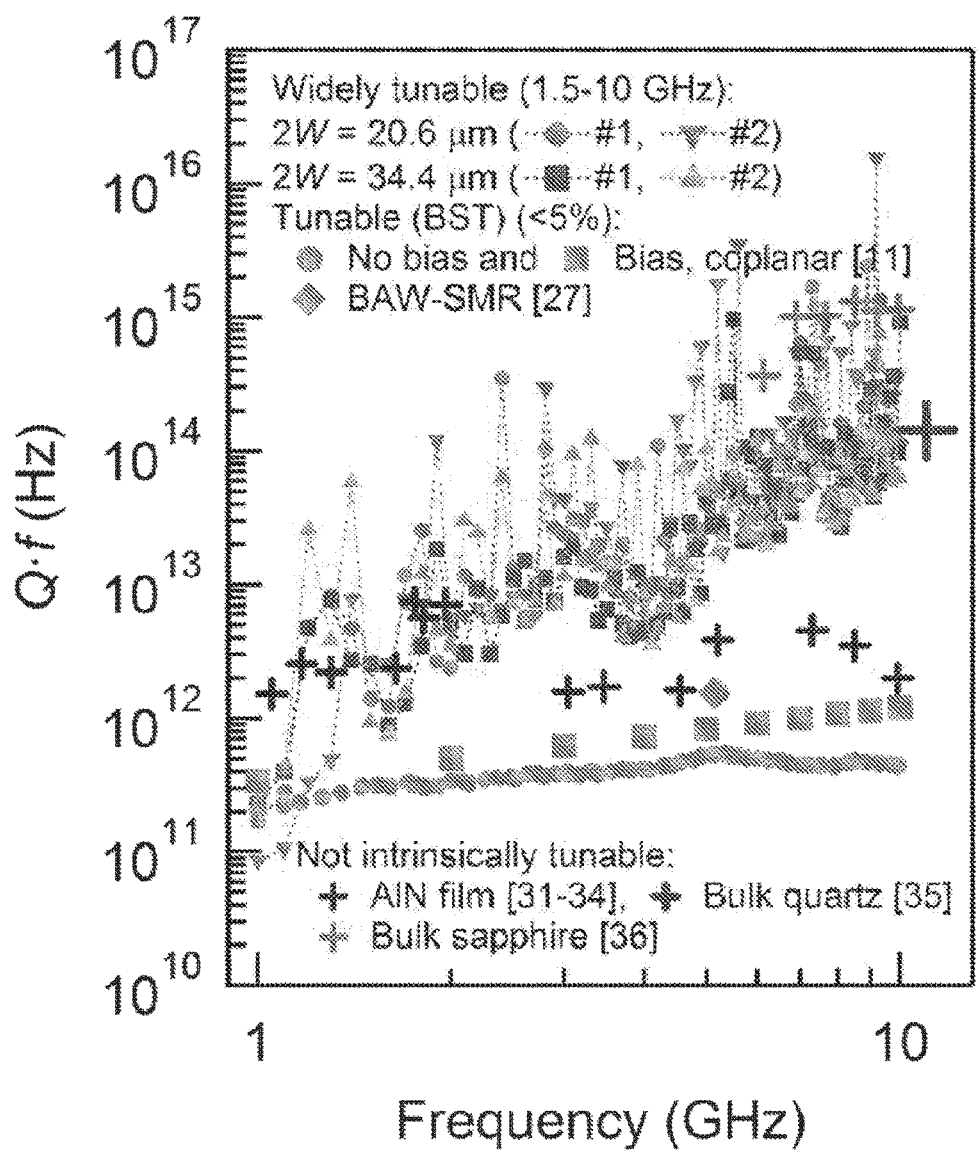

FIG. 26. data plotted as quality factor-frequency product as a function of frequency, for four widely tunable MDVM film devices, and values for other BST and not intrinsically tunable devices. Cited references correspond to those in the main text.

Figure 27:
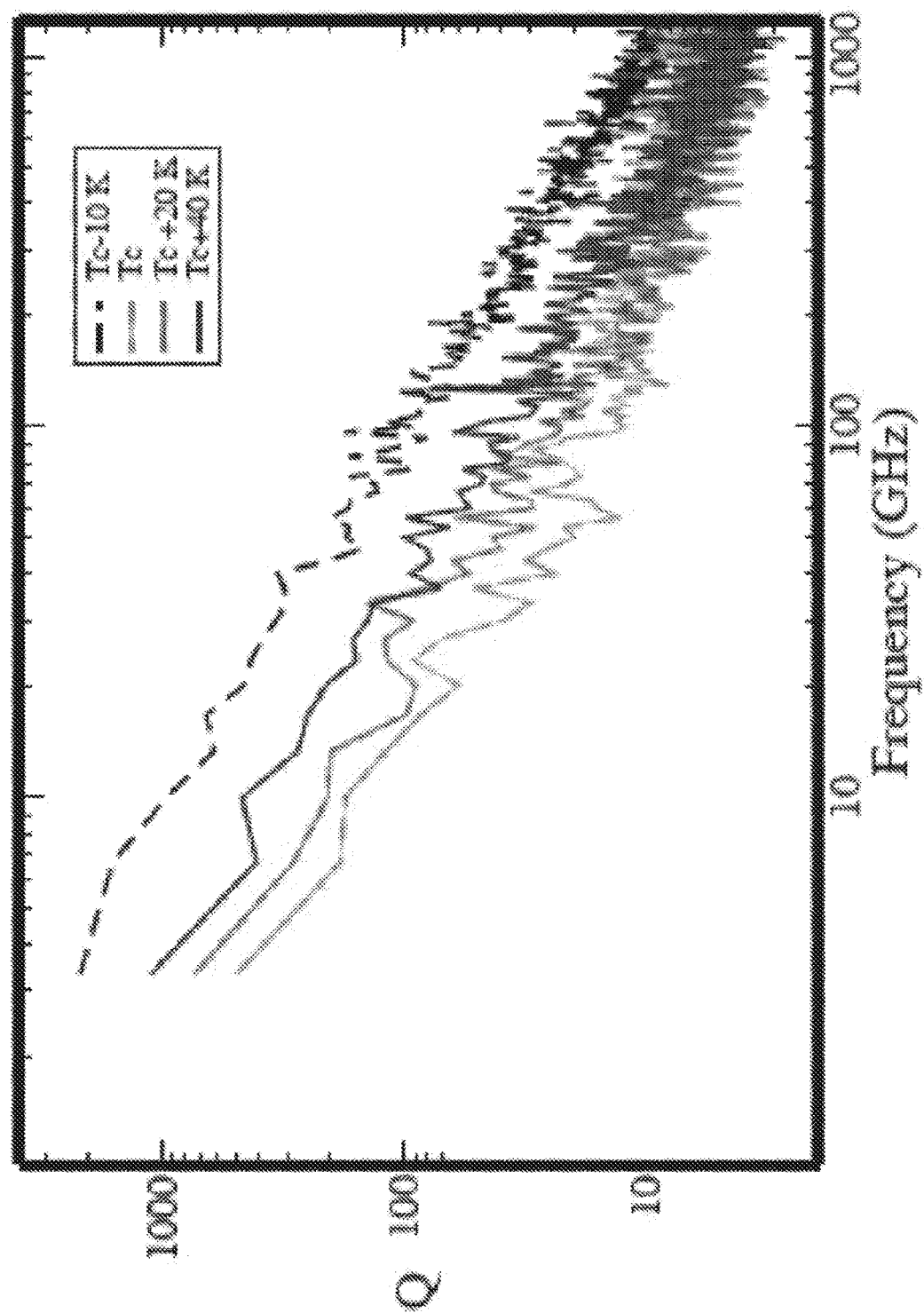

FIG. 27. Bond valence molecular dynamics (BVMD)-calculated single domain Q for bulk BaTiO₃ supercells at selected temperatures above and below $T_C$, permitting identification of the frequency- and temperature-dependent intrinsic limit of dielectric loss.

Figure 28:
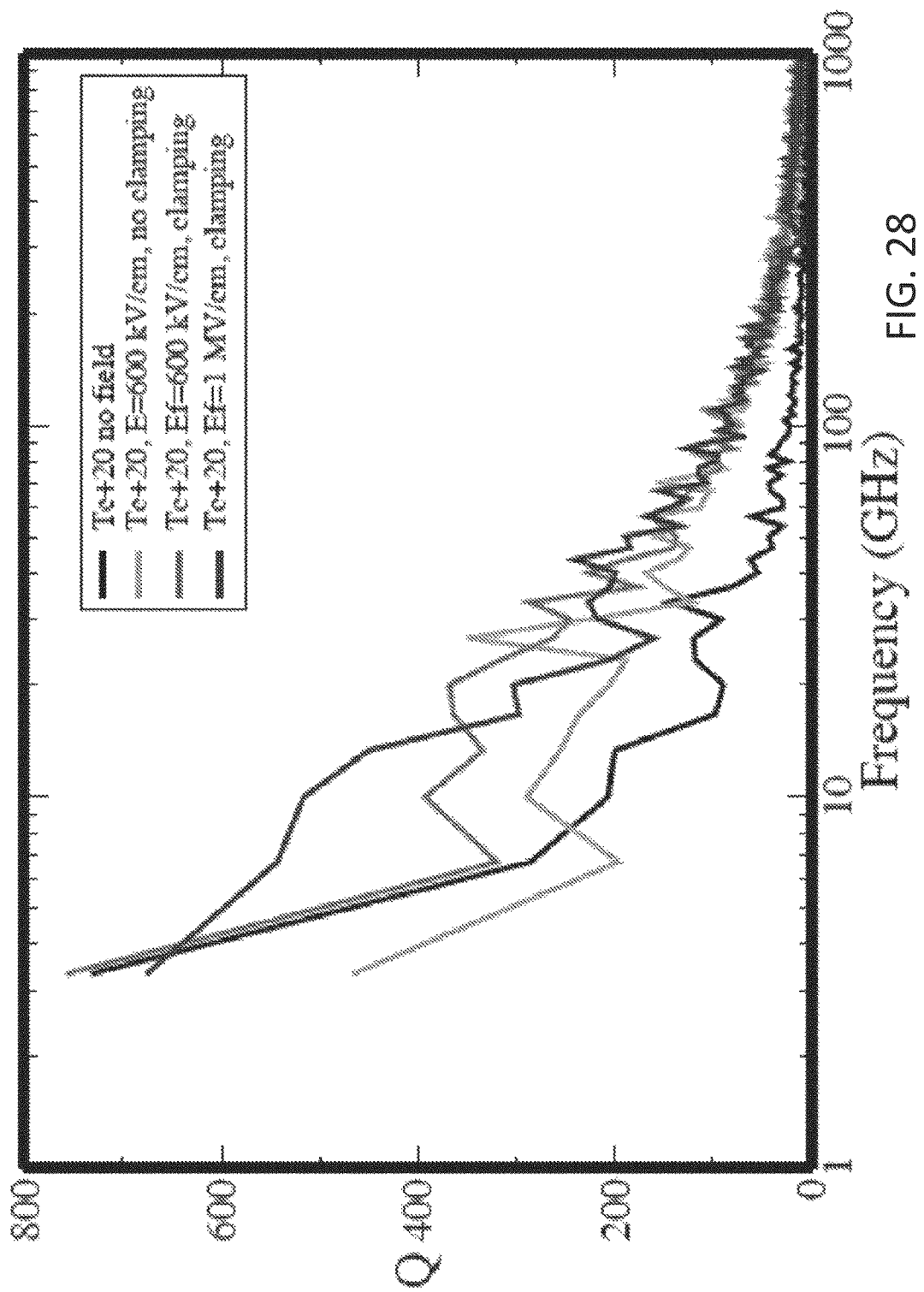

FIG. 28. BVMD calculated Q for a single domain with and without clamping by the substrate and with and without applied E field.

Figure 29:
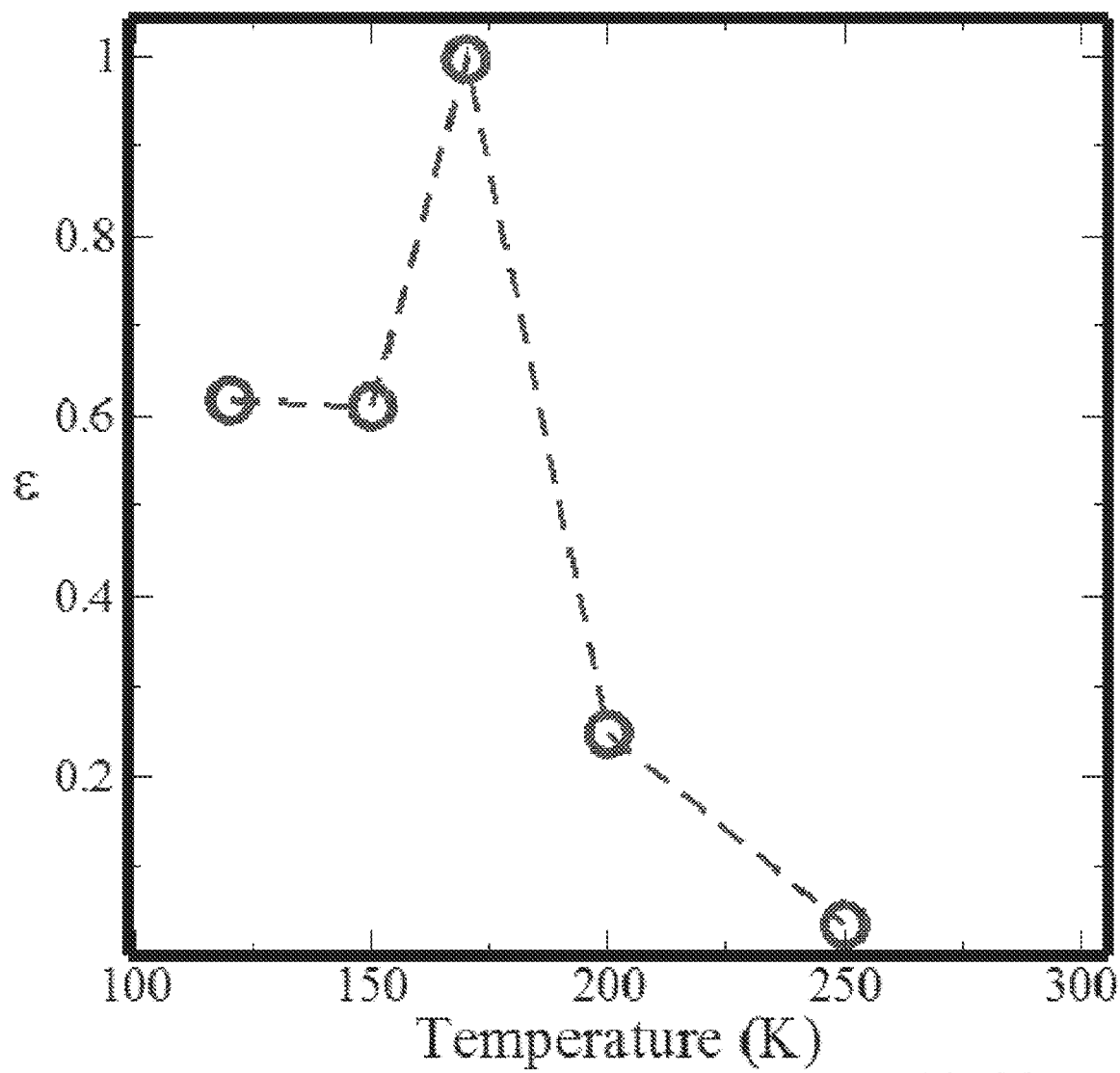

FIG. 29. Normalized capacitance from MD simulations. Normalized capacitance (static dielectric constant ε obtained from the fluctuations of the total polarization in MD simulations of the 120×10×10 $aa_1/aa_2$ domain supercell. Peak capacitance is obtained at ≈170K, 30K lower than the $T_C$ of 200K obtained from single domain calculations.

Figure 30A:
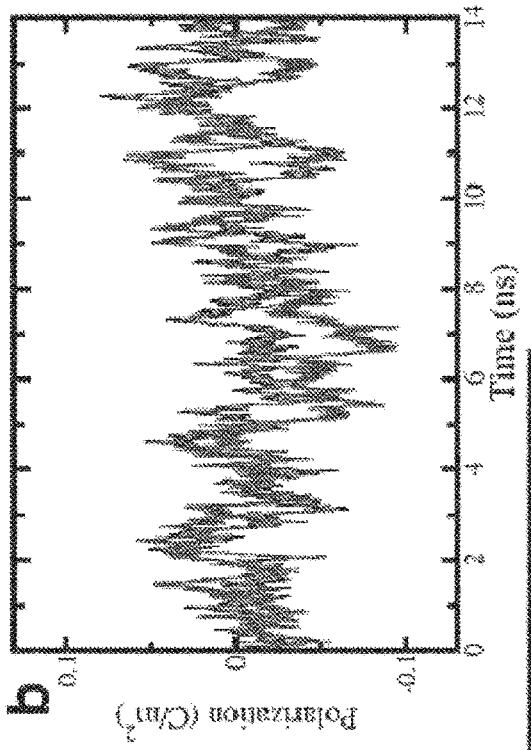
Figure 30B:
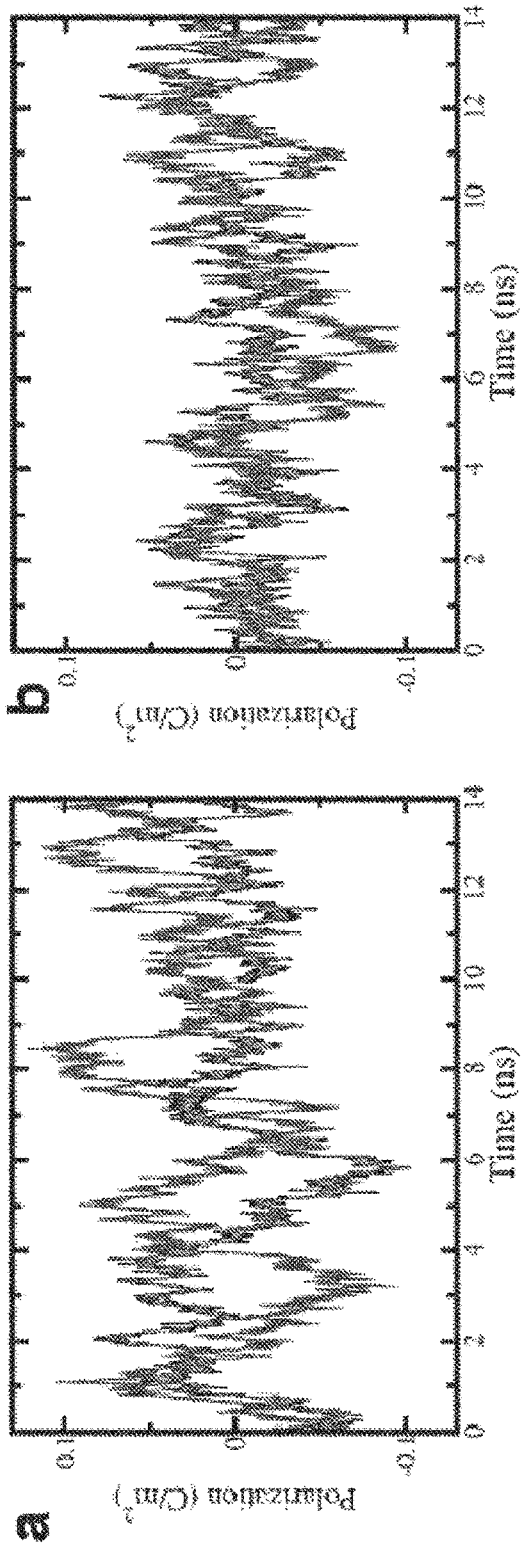
Figure 30C:
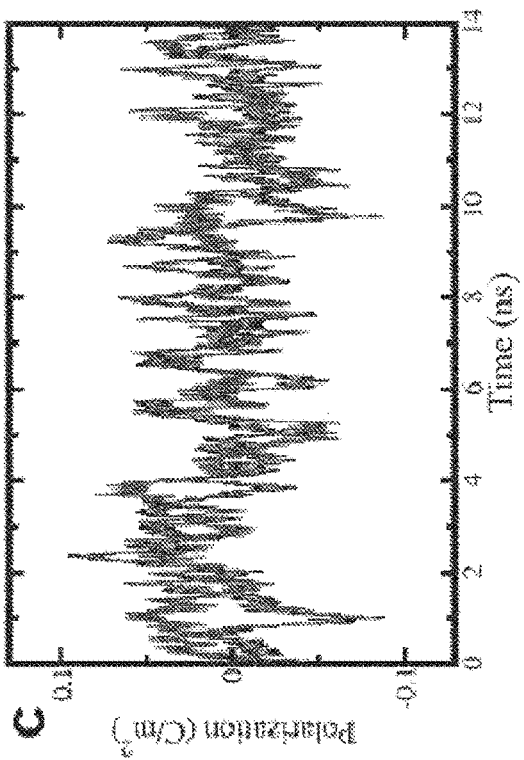

FIGS. 30A-30C. Polarization Trajectories of MD simulations. Overall supercell polarization in the y-direction as a function of time for the two simulations used to calculated Q(f). The raw $P_y$ trajectories of the two simulations are shown in black and green. Smoothed trajectories using a Gaussian window function with the full width-half maximum (FWHM) of 16 ps are shown in orange and blue. For (a) E=0 MV/cm, (b) E=0.3 MV/cm, (c) E=0.6 MV/cm. Large $P_y$ fluctuations are observed corresponding to the movement of the domain walls. Domain wall hopping is faster for E=0.3 MV/cm and E=0.6 MV/cm, leading to more rapid large oscillations of $P_y$.

Figure 31:
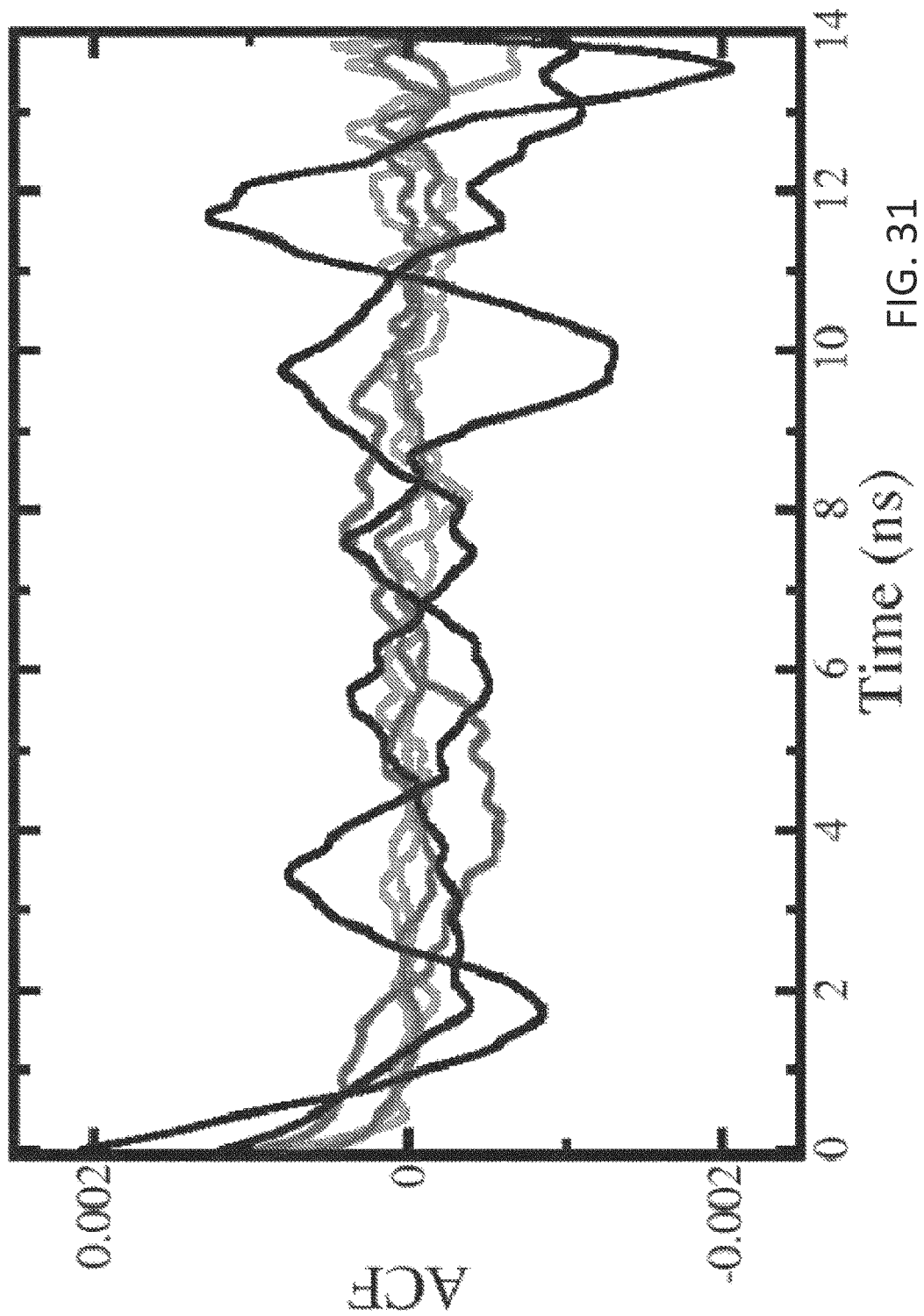

FIG. 31. Polarization auto-correlation functions MD simulations. Total polarization time auto-correlation functions (ACFs) for the $P_y$ component for individual simulations at E=0 MV/cm (black), E=0.3 MV/cm (green) and E=0.6 MV/cm (red). Large oscillations can be seen in all cases and it is clear that the ACF oscillations become more frequent with higher field. Sampling quality of the ACF decreases with greater time, with ACFs of E=0 MV/cm trajectories showing divergence earlier ≈8 ns) then the ACFs of E=0.3 MV/cm and E=0.6 MV/cm trajectories ≈12 ns).

Figure 32A:
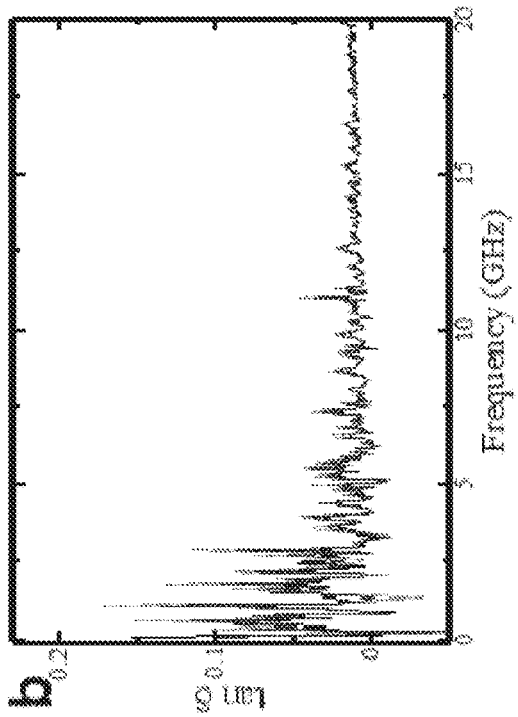
Figure 32B:
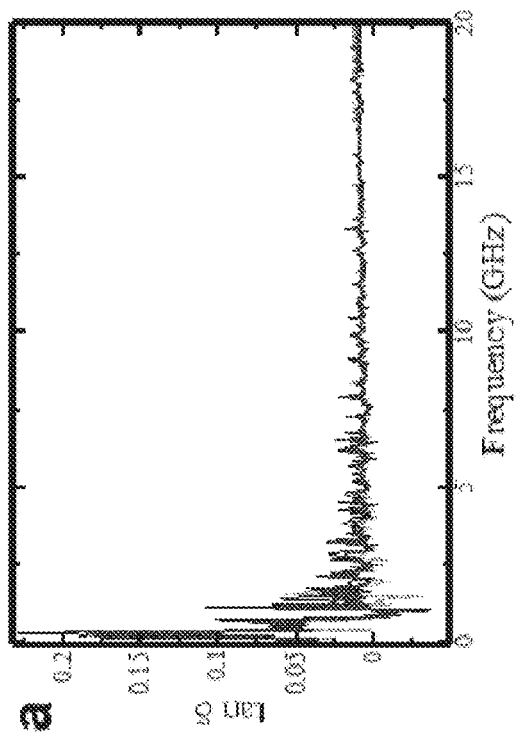
Figure 32C:
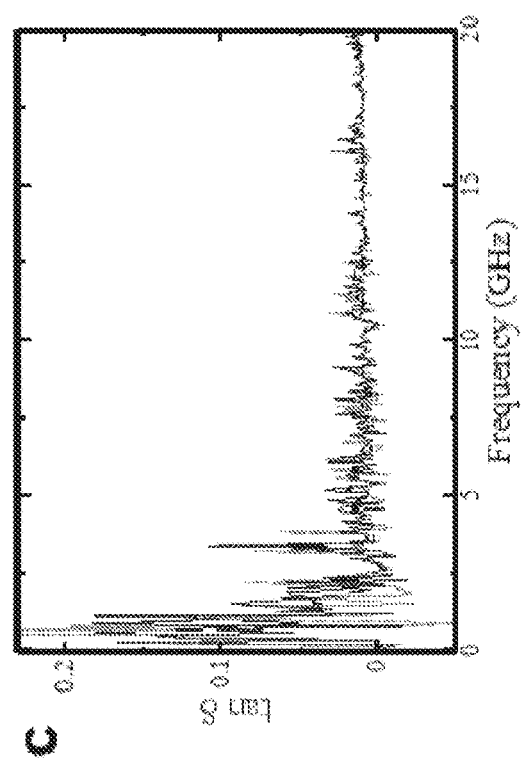

FIGS. 32A-32C. Loss tangent from MD simulations. Low-frequency tanδ(f) obtain from the Fourier transform of the first 9 ns of the ACFs of the individual MD simulations (black and red) and the averaged tanδ(f) (blue) for (a) E=0 MV/cm, (b) E=0.3 MV/cm, (c) E=0.6 MV/cm. The tanδ(f) of the two simulations are similar to each other, indicating that the 14 ns trajectories are sufficiently long for generating reproducible results for the positions of the tanδ(f) peaks and troughs. However, the values of the peaks and troughs show some variation, indicating the uncertainty in the obtained tanδ(f) and Q values. This is particularly significant for Q because a small difference in tanδ(f) can lead to a very large difference in Q. The values of tanδ(f) are more converged for E=0.3 MV/cm, and E=0.6 MV/cm. Nevertheless, negative tanδ(f) values and rapid tanδ(f) oscillations can be seen even for E=0.3 MV/cm and E=0.6 MV/cm data, indicating the presence of noise and the need for further smoothing of the data.

Figure 33A:
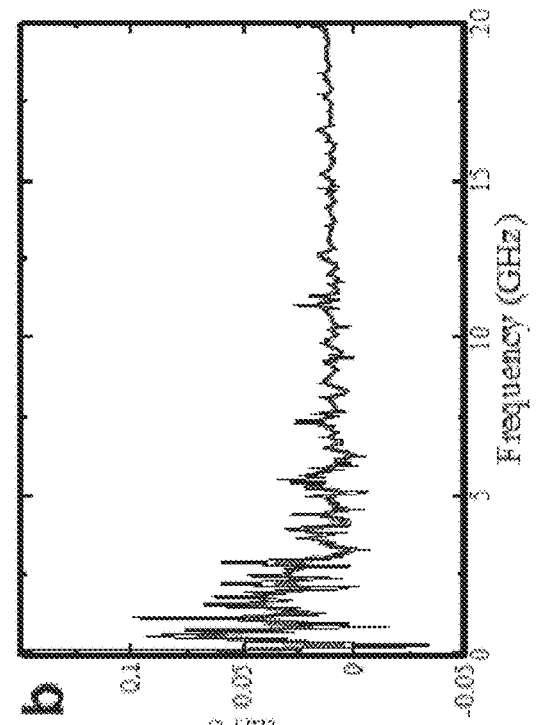
Figure 33B:
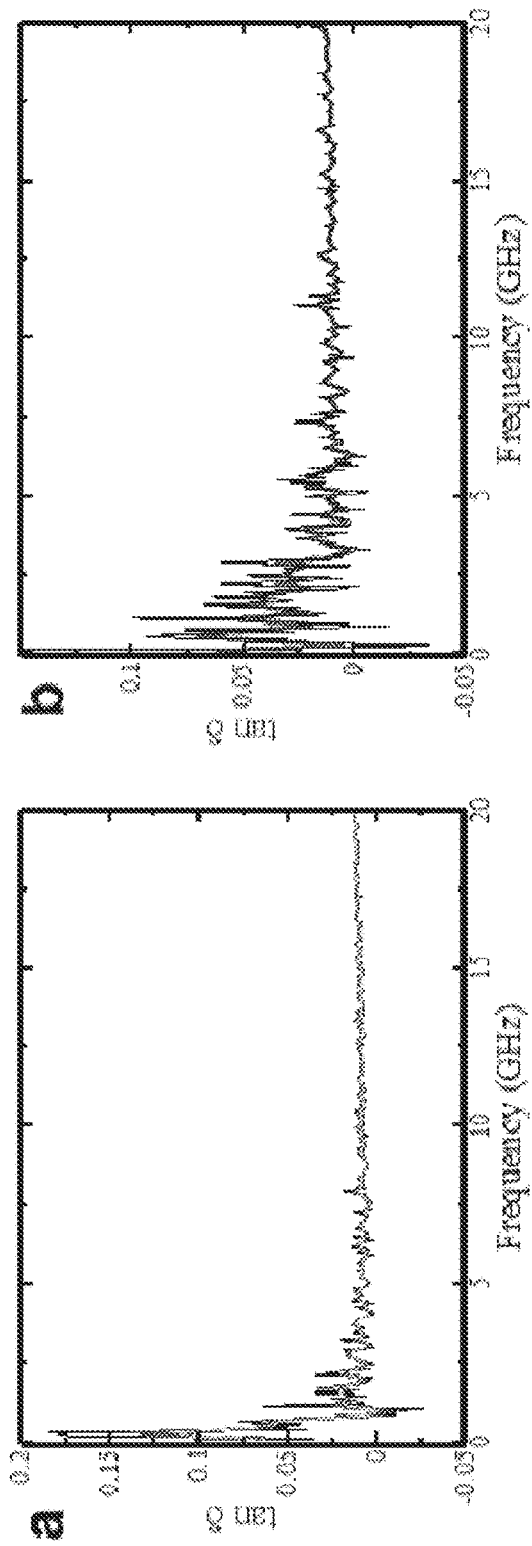
Figure 33C:
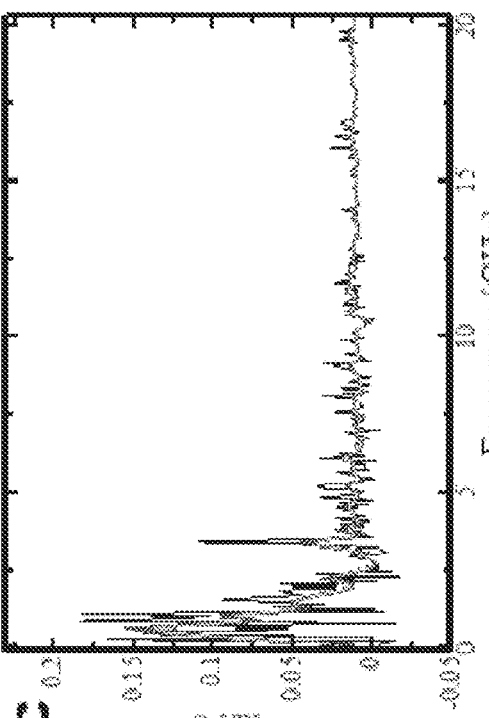

FIGS. 33A-33C. Smoothed Loss tangent from MD simulations. Low-frequency tanδ(f) obtained from the average of the tanδ(f) of the individual MD simulations (black and red) and smoothed tanδ(f) obtained using a Gaussian window function with the FWHM of 0.2 (green) and 0.3 GHz (magenta) for (a) E=0 MV/cm, (b) E=0.3 MV/cm, (c) E=0.6 MV/cm. The use of the smoothing function eliminates the unphysical negative tanδ(f) values and rapid and large oscillations of tanδ(f). In some cases smoothing with the FWHM of 0.05 is sufficient but in other cases smoothing using larger FWHM is necessary.

FIGS. 34A-34F. Q(f) from MD simulations. Q(f) obtained from the inverse of the average tanδ(f) of the individual MD simulations using Fourier transform of different lengths of the ACF. tanδ(f) from 3, 4, 5, 6 and 7 ns of ACFs are shown in black, red, green, blue and yellow, respectively for (a) E=0 MV/cm, (b) E=0.3 MV/cm, (c) E=0.6 MV/cm. The Q(f) curves are obtained from tanδ(f) smoothed using Gaussian window functions with the FWHM of 0.05 and 0.1 GHz. Q(f) from 3, 7, 8, 9, 10, 11 and 12 ns of ACFs are shown in black, yellow, brown, orange, violet, cyan, and magenta, respectively for (d) E=0 MV/cm, (e) E=0.3 MV/cm, (f) E=0.6 MV/cm. It can be see that for E=0 MV/cm, Q(f) curves obtained using ACFs of greater than 7 ns show wide variation in the position of loss peaks (dips in Q), whereas for E of 0.3 MV/cm and 0.6 MV/cm, the loss peak positions and the peak Q positions are largely preserved. The absolute values of Q vary with the length of the ACFs, reaching ≈$10^4$ in some cases. Nevertheless, despite the uncertainties in the absolute values of Q, it is clear that resonance peaks above the baseline are present in the MD system and can even be larger than the extrapolation of the 1/f high-frequency rise of Q with decreasing f.

Figure 35A:
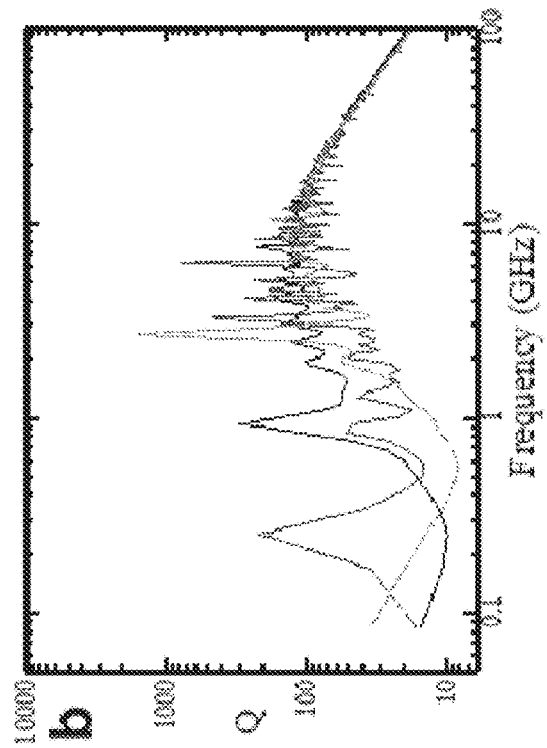
Figure 35B:
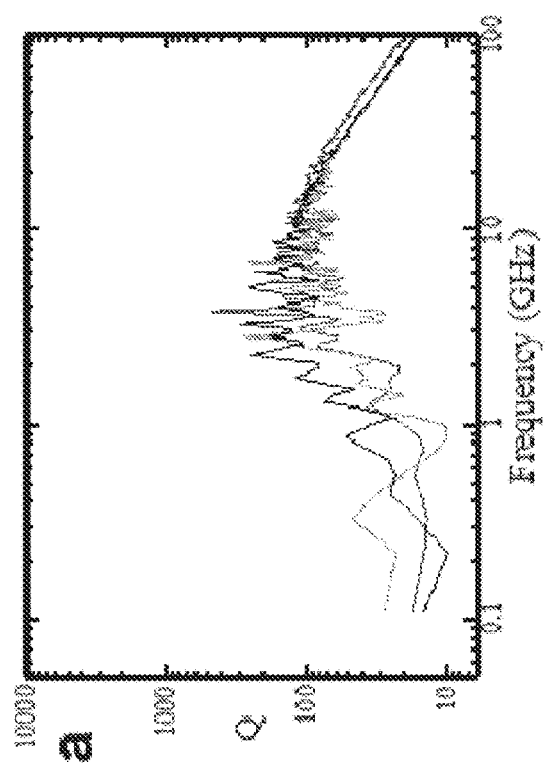
Figure 35C:
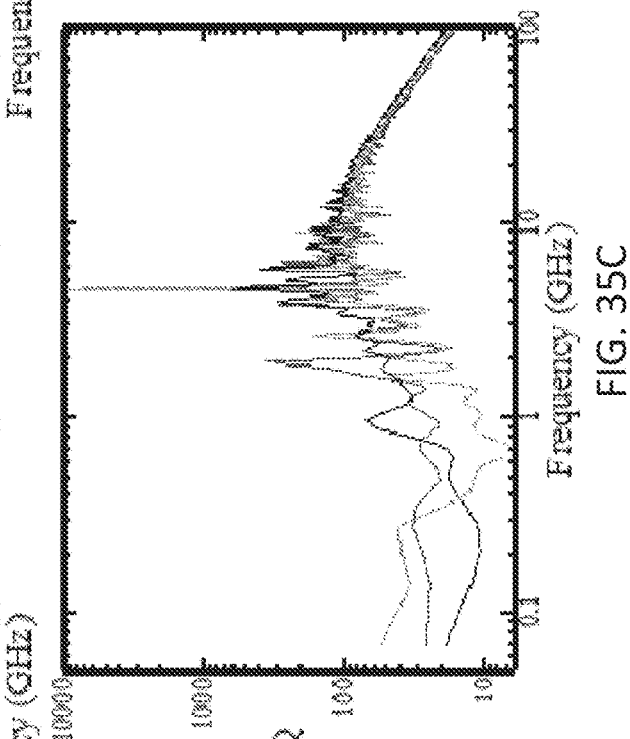

FIGS. 35A-35C. Comparison of Q(f) from MD simulations for different electric fields. Q(f) obtained the inverse of the average tanδ(f) of the individual MD simulations using Fourier transform for E=0 MV/cm (black), E=0.3 MV/cm (green) and E=0.6 MV/cm (red). The Q(f) are shown for Fourier transforms performed on (a) 7 ns of ACFs (b) 9 ns of ACFs and (c) 11 ns of ACFs). A shift to higher frequencies and greater rise of the resonance peaks from the baseline and higher maximum Q are observed upon the application of the field.

Figure 36:
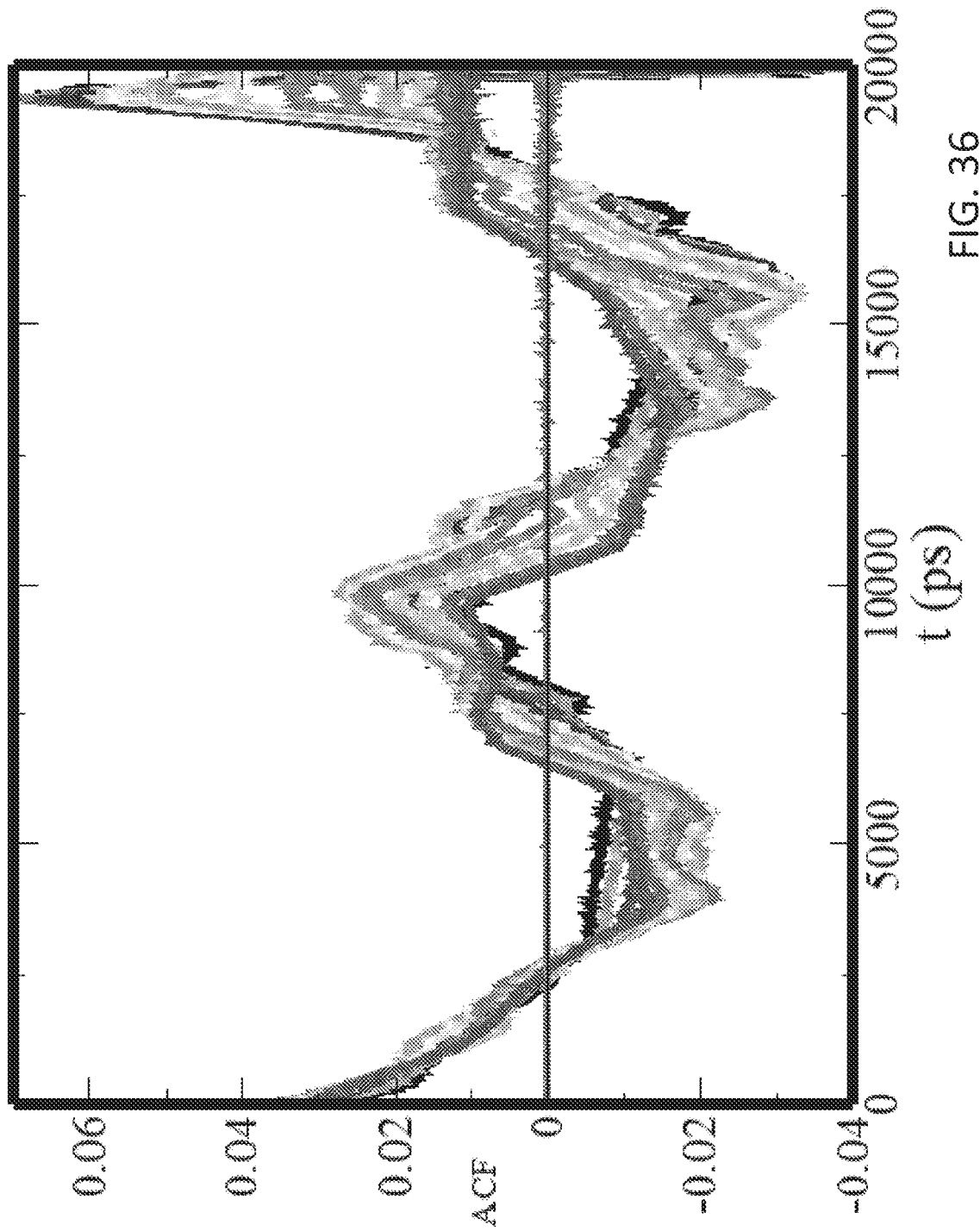

FIG. 36. Autocorrelation functions for different layers in MD simulation. Polarization time autocorrelation function for different layers in the domain wall region (layers 74-86) and in the bulk region (layers 100-113) obtained from MD simulations trajectory for E=0.6MV/cm. The ACF DW layers show large oscillations with a long period while the bulk layer ACFs show small oscillations with a small period and appear as a cyan line around zero in the plot.

Figure 37B:
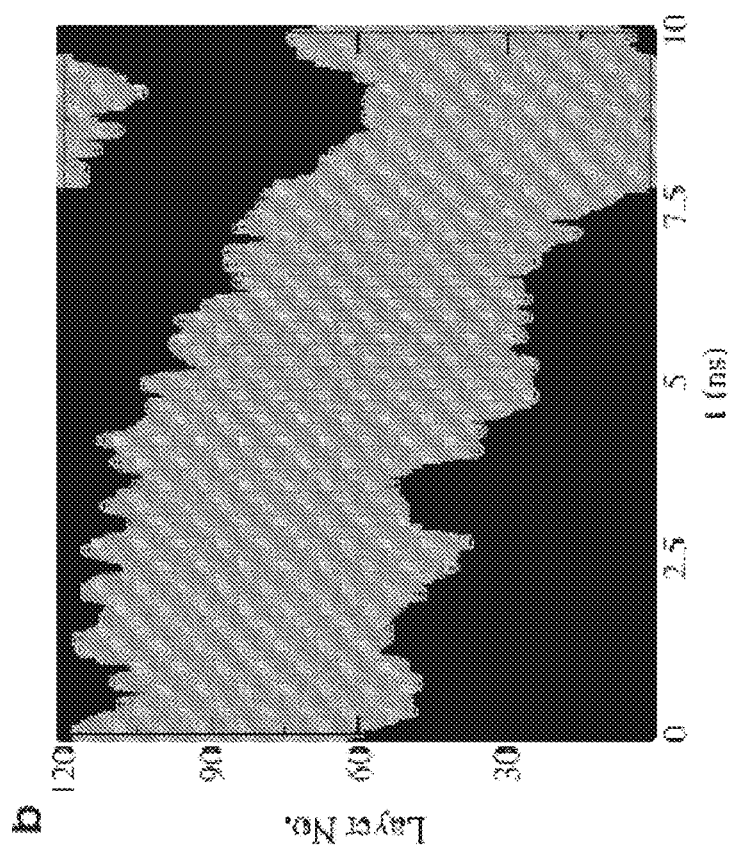
Figure 37A:
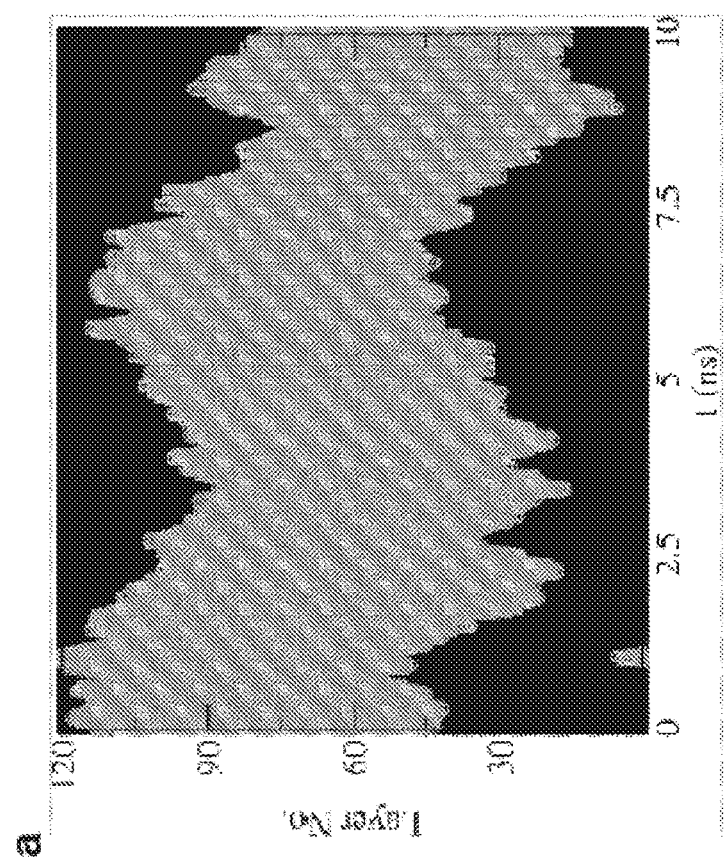

FIGS. 37A-37B. Movement of DW position as a function of time. An illustration of the MD supercell and domain fluctuations at $E_x$=0 MV/cm (a) and $E_x$=0.3 MV/cm (b) with the $P_y$>0 domain shown in black and $P_y$<0 domain shown in red.

Figure 38:
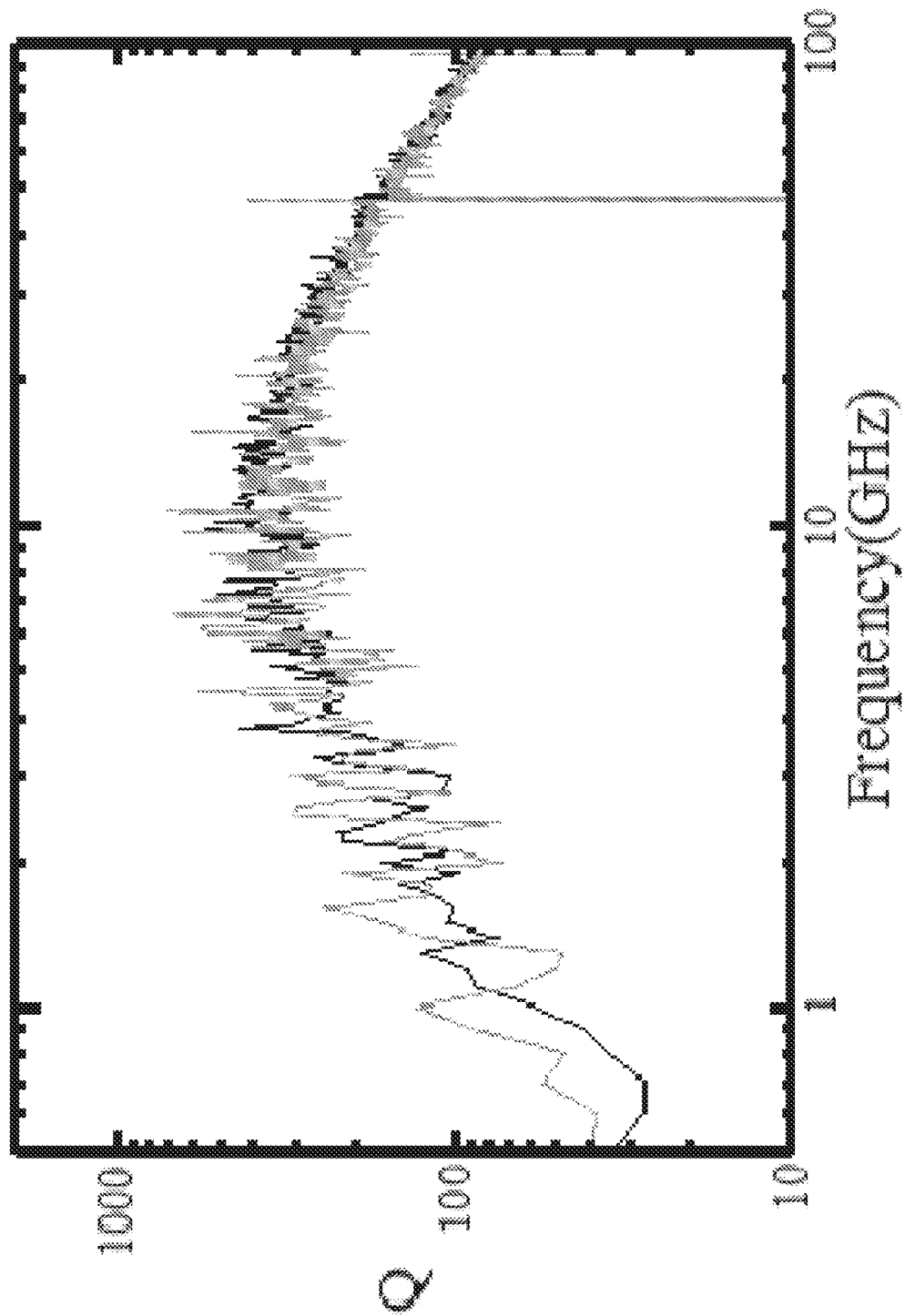

FIG. 38 shows a comparison of Q(f) obtained from stochastic model simulations. Comparison of the Q(f) obtained from stochastic model simulations using two different parameter sets, with Q(f) for parameter set A shown in black and Q(f) for parameter set B shown in red. Similar to the MD-obtained Q(f) shown in FIG. 3, a slight shift to higher frequencies and higher Q peaks can be obtained by a change in the stochastic model potential.

Figure 39A:
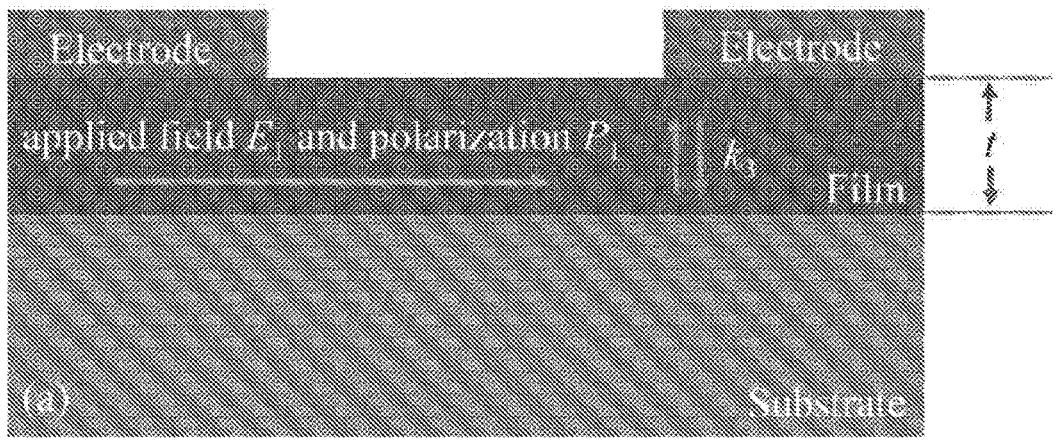
Figure 39B:
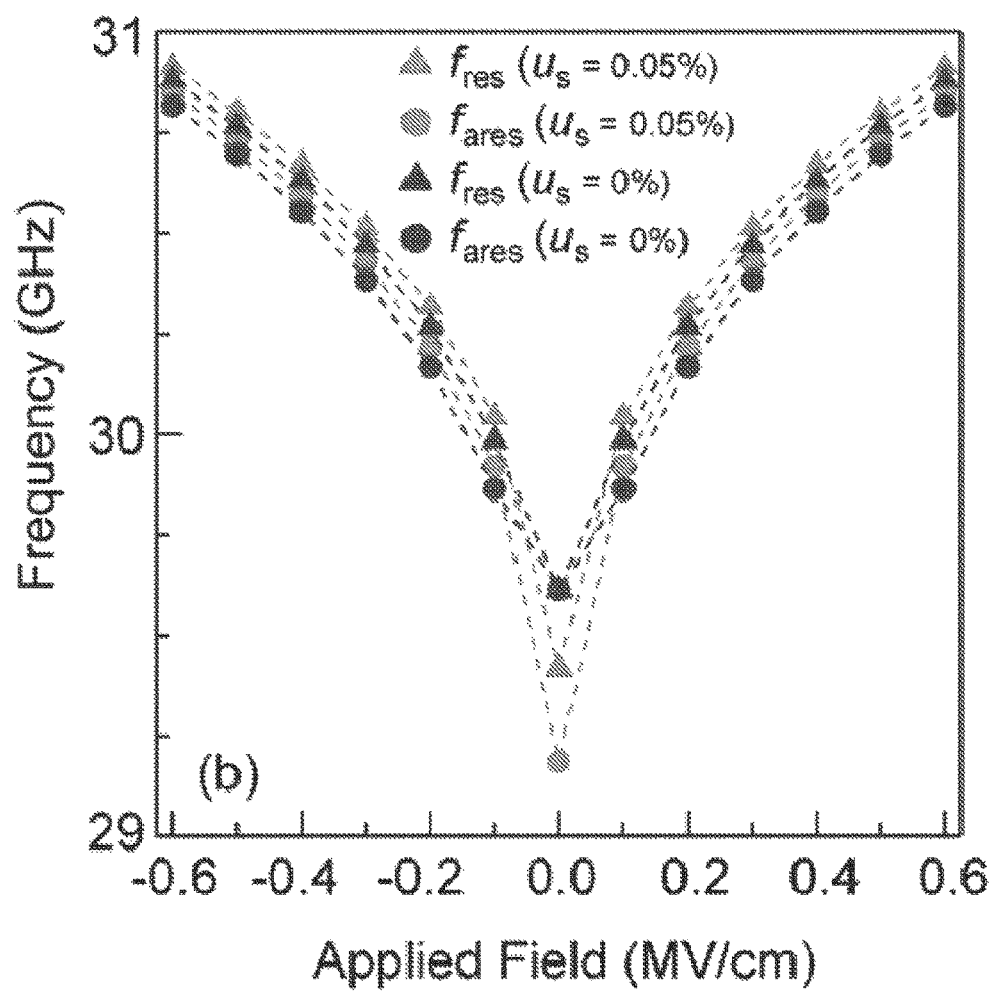

FIGS. 39A-39B. Schematic illustrations of (a) the LFE-type device, namely out-of-plane piezoelectric resonance oscillations of wavevector $k_3$ in a film resulting from in-plane bias and polarization achieved using IDC electrodes, and (b) the resonance and anti-resonance frequencies calculated for a t=100 nm $Ba_{0.8}Sr_{0.2}TiO_3$ thin film for 0% and 0.05% in-plane strain $u_s$ from the substrate.

Figure 40:
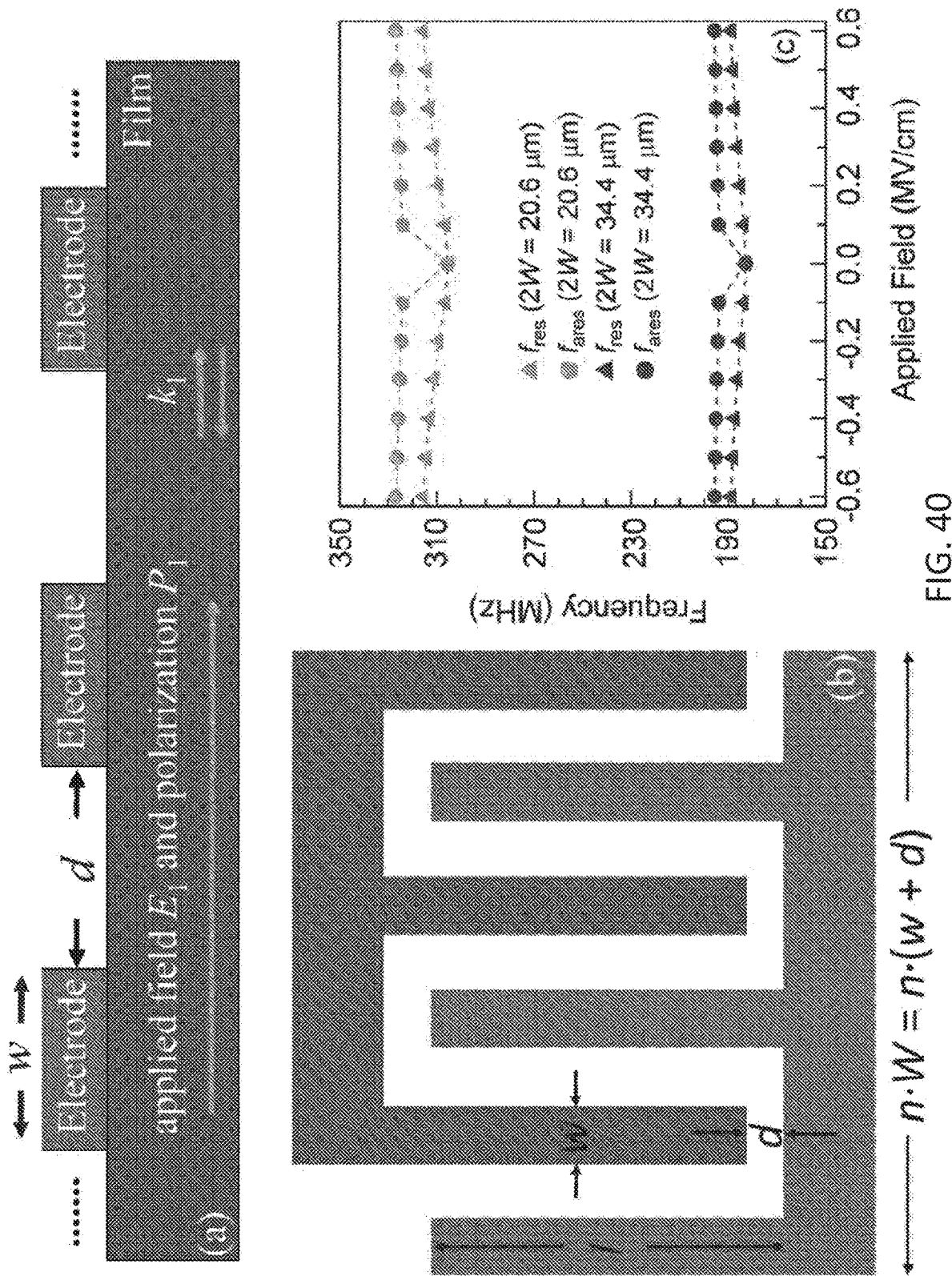

FIG. 40. Schematic illustrations of (a) in-plane piezoelectric resonance oscillations of wavevector $k_1$ in a film resulting from in-plane bias and polarization achieved using (b) an IDC electrode containing n fingers with finger gap d, width w and length l, where the periodicity 2 W=2(w+d), and (c) calculated results of resonance and anti-resonance frequencies for 2 W=20.6 μm and 34.4 μm.

Figure 41:
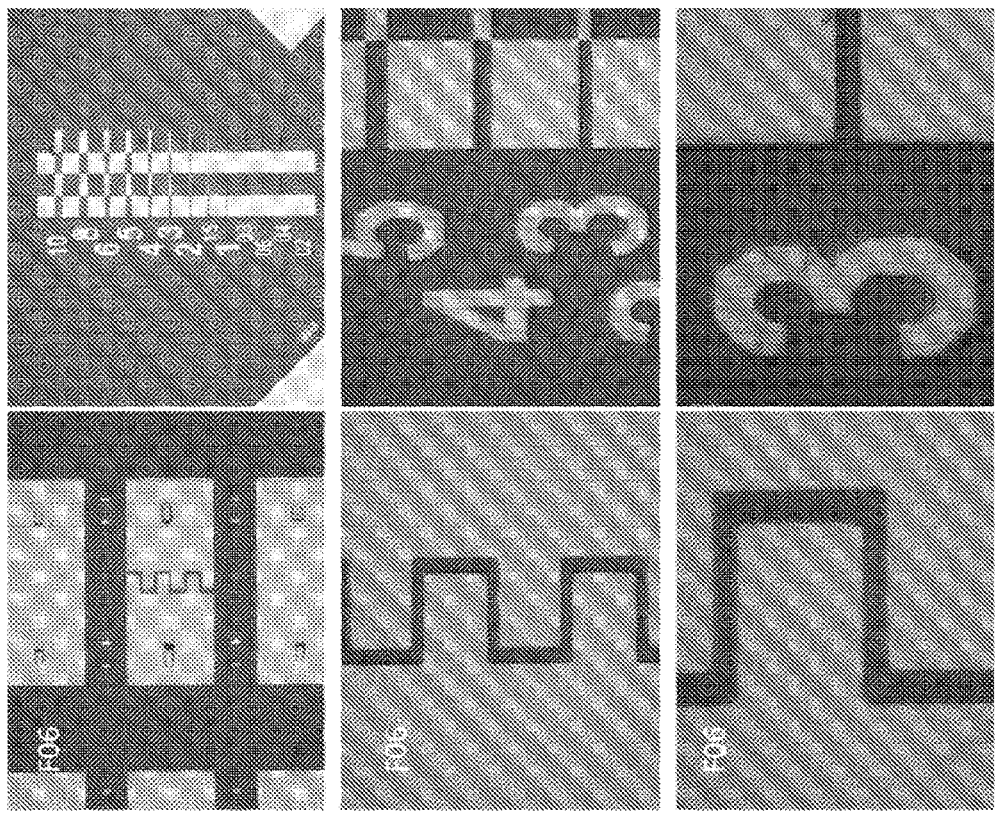
Figure 41:
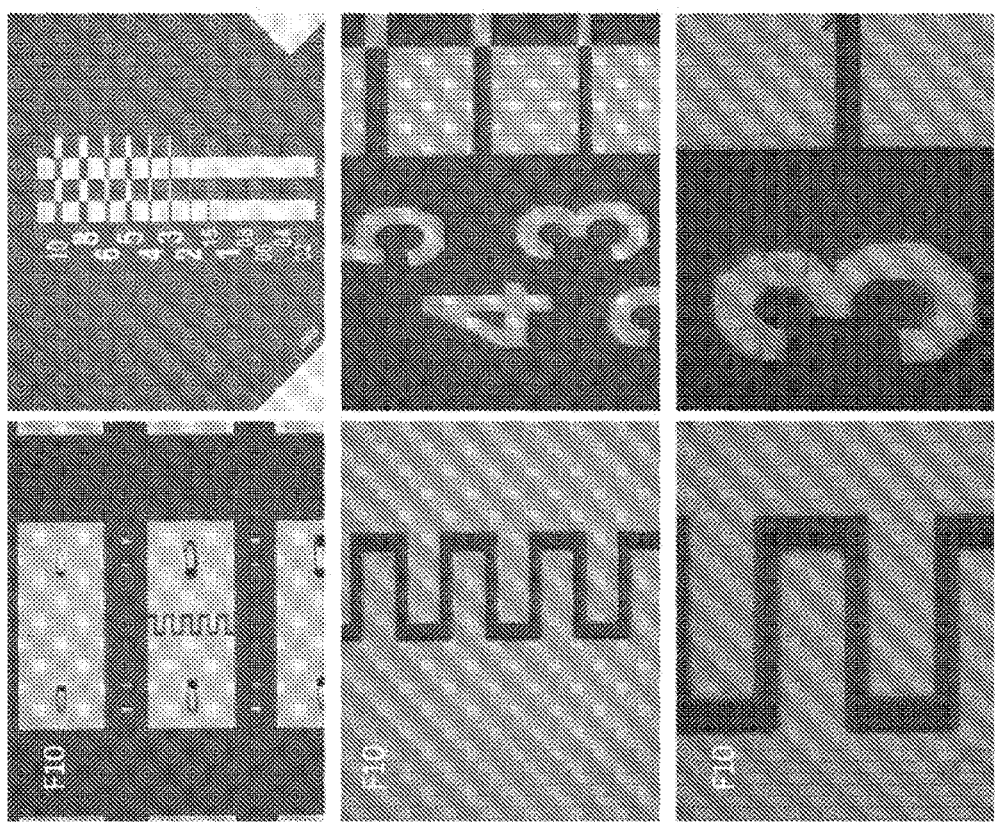

FIG. 41. Optical micrograph images collected at different magnifications, of representative devices possessing different electrode finger/gap periodicity (F10 and F06), as described above.

DETAILED DESCRIPTION

The present disclosure relates to a framework for a microwave dielectric oscillating medium based on atomic-scale domain wall fluctuations that enables new devices. These novel meta-dielectric thin film materials enable low losses that overcome the material-specific intrinsic limit.

These polar media are distinguished by their possessing a high density of specially engineered planar defects that, under selected DC bias, oscillate at several selected frequencies. The axis of vibration of the internal oscillators is not random, but instead oriented along one or more preferred direction(s), indicating that DC field-driven collective oscillations can support traveling EM waves. Additionally, experimental observations and model calculations results indicate that the oscillation frequencies can be controlled and tuned. The availability of a solid state microwave medium where resonant frequencies are dependent a priori not on the geometric dimensions and acoustic modes, but on tunable nanoscale oscillators that arise within the medium, opens a wide array of possibilities for frequency selectivity, spectrum management and reduced power requirements, through material non-linear response characteristics.

A material that possesses a ferroelectric instability, and within or near its ferroelectric phase, possessing high density of ferroelectric domain walls such that:
 a. The domain walls, under the application of a DC or AC field of sufficient magnitude and selected frequency, or under zero field, oscillate or fluctuate in their position with time (e.g., yielding a spectrum with resonance frequencies associated with the ferroelectric domain wall motions).
 b. The timescale or rate of these fluctuations vary depending upon the electrostatic potential landscape and domain width or domain wall density, applied field, temperature, strain (coherent or relaxed) and/or stress.
 c. The corresponding frequency spectrum associated with these fluctuations exhibits one or more minima in material dielectric loss (or peaks in reciprocal loss, Q) along an axis parallel to the axis of the domain wall and perpendicular to its fluctuations
 d. The width of the domain separating the domain walls fluctuates
 e. The material may be a ferroelectric in its ferroelectric phase (normal ferroelectric, improper ferroelectric, hybrid improper ferroelectric, relaxor ferroelectric), any which exhibits domain walls of density of 1-100 per 50,000 nm$^2$.
 f. Examples of ferroelectric materials are $BaTiO_3$, (Ba, Sr)$TiO_3$ (including combination of Ba and/or Sr), $PbTiO_3$, PZT, (Pb,Sr)$TiO_3$, $BiFeO_3$, Bi(Fe,Mn)$O_3$ and numerous other compounds, in a combination of composition and strain state permitting the aforementioned high domain wall density, whereby domain structure with polarization components lying completely or partially in the plane of a film even in the presence of weak or strong (e.g., 1 MV/cm) ordering electric field. As a non-limiting example, the ferroelectric materials may comprise perovskites Ba$_x$Sr$_{1-x}$TiO$_3$ (BSTx), PbTiO3, Pb(Zr,Ti)O3, (Pb,Sr)TiO3, BiFeO3, Bi(Fe,Mn)O3 and related solid solutions; Ruddelson-Popper phases A$_{n+1}$B$_n$X$_{3n+1}$, or more generally A$_{n+1}$A'$_2$B$_n$X$_{3n+1}$ where A and A' represent alkali and/or alkaline earth metals, and B denotes a rare earth metal, such as A=Sr or Ba, B=Ti, and X=O, or other ferroelectrics, such as SrBi2Ta2O9 and related solid solutions. BaTiO3, (Ba, Sr)TiO3, PbTiO3, PZT, (Pb,Sr)TiO3, BiFeO3, Bi(Fe, Mn)O3.
 g. Temperatures within 100 degrees C. of the ferroelectric phase transition temperature $T_C$
 h. Domain walls may be of any type. Examples include c+/c−/c+/c−, $a_1/a_2/a_1/a_2$, $aa_1/aa_2$, $r_1/r_2/r_1/r_2$, a/c/a/c, $ca_1/ca_2/ca_1/ca_2$, ca*/aa*/ca*/aa*, c/a/c/a, or other structure identified in the appendices, or any mixture thereof
 i. Domain wall densities of 1-100 per 50,000 nm$^2$; other domain wall densities may be used such as 1-100 per 40,000 nm$^2$ or 1-100 per 60,000 nm$^2$ or Domain wall oscillations produce one or more frequencies or frequency bands at which the dielectric material loss can be very low, and material Q can exceed the intrinsic limit, and contain the following features:
 a. These frequencies corresponding to high Q can remain fixed with applied field, or shift to higher or lower frequencies, with applied field.
 b. Frequencies can range from 0.01 GHz to 300 GHz, depending on the material, domain structure, domain wall density, strain, temperature and applied field.

Material containing domain wall (DW) oscillations whereby the low dielectric loss/high Q is anisotropic (it does not necessarily occur in all directions under application of a field), thereby allowing microwave and RF-band electromagnetic energy to propagate with considerably less loss in one or more preferred directions.

A microwave cavity supporting propagation of transverse electromagnetic (TEM) waves with little or no dissipation, carried and/or modulated by domain wall oscillations.

The present disclosure relates to (a) the origin of the unusually large experimentally observed Q spikes using the comparison of experimental data and data obtained from bond-valence potential molecular dynamics (MD) simulations of a model $BaTiO_3$ (BTO) system (Methods), (b) the voltage (or electric field) tunability of the observed Q spikes that is also exceptionally large, and (c) occurrence of both (frequency-tunable) Q spikes and exceptionally high voltage tunability of dielectric permittivity in the RF and microwave bands in the same material.

Figure 1:
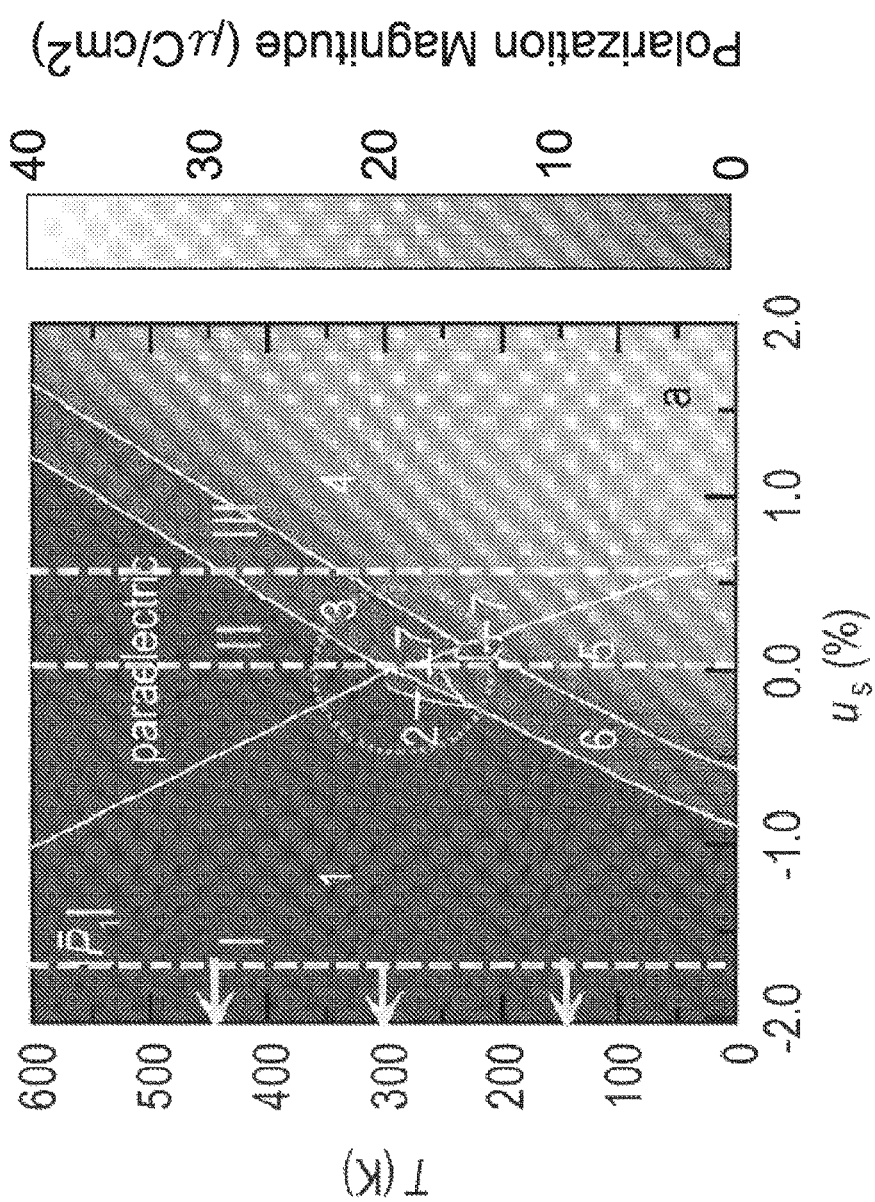
FIG. 1: design of domain wall variant-rich material and its microwave dielectric tunability, a. Thermodynamic landscape of in-plane polarization favoring domain wall variants showing calculated average value of in-plane polarization $|P_1|$ as a function of temperature and in-plane strain, for $Ba_{0.8}Sr_{0.2}TiO_3$. Arabic numerals denote various thermodynamically predicted domain wall variant structures.

Thermodynamic Ginzburg-Landau-Devonshire (GLD) model calculations support the hypothesis that large in-plane permittivity values can be obtained via in-plane domains. Application of the phenomenological GLD model permits calculation of in-plane strain $u_s$-temperature (T)-polarization (P) phase diagrams (FIG. 1) with a number of additional, domain variants ("superdomain" [S. Matzen, O. Nesterov, G. Rispens, J. A. Heuver, M. Biegalski, H. M. Christen, and B. Noheda, Super switching and control of in-plane ferroelectric nanodomains in strained thin films, Nature Commun. 5, 4415 (2014)]) predicted for BST films (FIG. 1). Focusing, for example, on x=0.8, which produces a vertex in the phase diagram where a number of domain wall variant phases are predicted to intersect near room temperature (FIG. 1). Noting the close proximity and high accessibility among the different variants, where this region of the phase diagram may be referred to as a manifold domain wall-variant material (MDVM).

Figure 2:
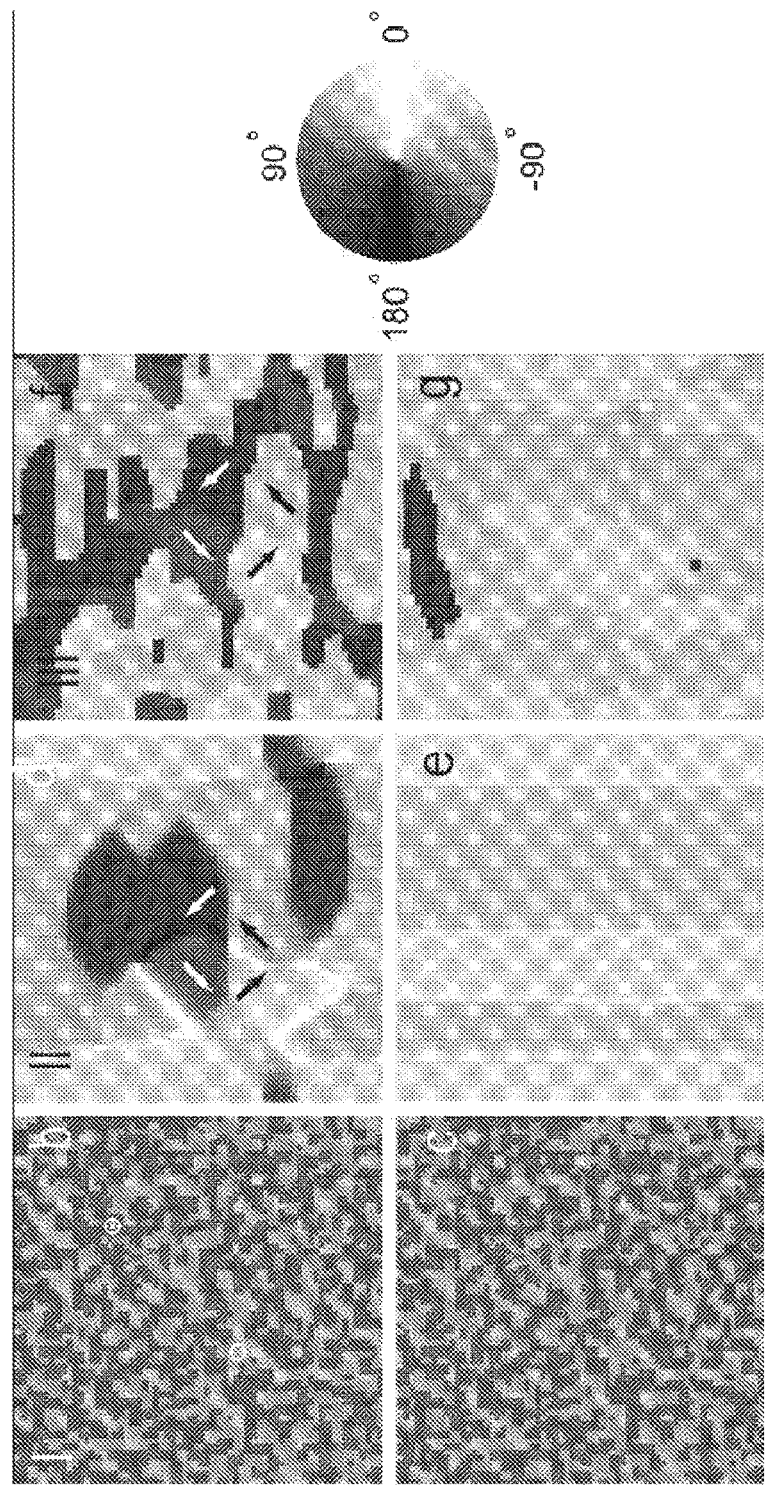
FIG. 2: Phase field simulations of domain structure for equivalent strains and corresponding non-degenerate (vertical dashed lines I and III) and degenerate (II) domain variant phase states in $BaTiO_3$ at =10 K<$T_c$ under zero field (b,d,f) reveal high out-of-plane (b) and in-plane (d, f) domain wall densities that persist even under a moderate in-plane field of 0.1 MV/cm applied along [100] (c,e,g). Plotted in b and c are plane-normal polarization $P_3$, with colormap range of ±30

Zero- and finite-field phase-field model calculations for three selected strain states (denoted in FIG. 1 by yellow dashed lines I, II, and III) confirm the expected c$^+$/c$^−$ structure for a compressively strained film (I), and in-plane domain structure for a film under moderate tensile strain (III) (FIG. 2). Application of a moderately large field (0.1 MV/cm along [100]) leaves the domain structure in I and III essentially unchanged (FIG. 2). For case II, which corresponds to the MDVM material, the $aa_1/aa_2$ domain wall variant structure at zero field is predicted, suggestive of multiple domain wall variant coexistence consistent with its location in the phase diagram. Despite the softer three-dimensional potential energy landscape for II as compared with I and III, domain structure is not eliminated at moderate field (FIG. 1), consistent with reports on epitaxial films in which domain structures cannot be eliminated [Griggio, F. et al. Composition dependence of local piezoelectric nonlinearity in (0.3)Pb(Ni$_{0.33}$Nb$_{0.67}$)O$_3$-(0.7)Pb(Zr$_x$Tu$_{1-x}$)O$_3$ films. J. Appl. Phys. 110, 044109 (2011)]) under applied electric field.

Dielectric permittivity values for the MDVM-engineered films exceed the composition-specific state-of-the-art for dielectric thin films: theoretically predicted values for zero-field relative dielectric permittivity $\varepsilon_{11}/\varepsilon_0$ easily exceed 10,000, reaching 10$^5$ for selected combinations. Higher permittivity promotes enhanced dielectric and capacitance tunability n(E)=$\varepsilon_{r,max}/\varepsilon_{r,min}$ (=$C_{max}/C_{min}$), where E r is the real part of the dielectric permittivity, $C_{max}$ and $C_{min}$ are the capacitances at zero and applied electric field E, aided by proximity to the phase boundary.

Theoretically calculated quasi-static in-plane tunability in MDVM films can be remarkably large. For example, an x=0.8 film coherently strained on SmScO$_3$ (110) (u$_s$≈0.05%, case II) is predicted to have tunability n(E$_1$)>20 at E$_1$=0.3 MV/cm, whereas n for films on SrTiO$_3$ (I) and BaTiO$_3$ (III) is considerably weaker (FIG. 3).

Experimental results support the GLD theory predictions. Epitaxial x=0.8 films, 100 and 400 nm thick, were deposited on SmScO$_3$(110) by pulsed-laser deposition and were characterized using a variety of techniques.

Compared with the bulk, the smaller out-of-plane lattice parameters in our films favor in-plane domain formation, and plane-normal and lateral dual-amplitude resonance tracking (DART™) piezoresponse force microscopy (PFM) confirms the presence of in-plane oriented domains, with domain walls aligned along the [100] or [010], consistent with the aa$_1$/aa$_2$/aa$_1$/aa$_2$ domain structure (SI).

Voltage-dependent capacitance data in the co-planar geometry (FIGS. 4A-4B) at selected frequencies across the measurement range demonstrate high capacitance tunability at modest fields (FIG. 5), in agreement with our calculations, and persisting to beyond 20 GHz. This capacitance tunability, even at equivalent fields, is considerably greater than the current state of the art in molecular beam epitaxy-grown films, including Ruddelson-Popper (R-P) Sr$_7$Ti$_6$O$_{19}$ [C.-H. Lee, N. D. Orloff, T. Birol, Y. Zhu, V. Goian, E. Rocas, R. Haislmaier, E. Vlahos, J. A. Mundy, L. F. Kourkoutis, et al., Exploiting dimensionality and defect mitigation to create tunable microwave dielectrics, Nature 502, 532-536 (2013)], and (Ba,Sr)TiO$_3$ [C. J. G. Meyers, C. R. Freeze, S. Stemmer, and R. A. York, (Ba, Sr)TiO$_3$ tunable capacitors with RF commutation quality factors exceeding 6000, Appl. Phys. Lett. 109, 112902 (2016)] (FIG. 5).

Remarkably, n(f) remains greater than 13 (at 0.67 MV/cm) throughout nearly the entire frequency range studied, peaking at n≈18.5 at 15.2 GHz. The deposited films also exhibit low losses (high Q values). This is in contrast to the usual observation of high losses accompanying high tunabilities. MDVM films exhibit low Q at zero field, but large Q (<Q(f)>≈1200, frequency-averaged from 0.1-20 GHz) at maximum field. Q at the highest applied field ranges generally between 10$^2$-10$^3$ over 2-10 GHz (FIG. 21).

A closer examination revealed extraordinary features in thinner films: combinations of field and frequency for which Q oscillates with frequency easily exceed the frequency-dependent bulk intrinsic limit for BaTiO$_3$ near T$_C$ (less than or approximately equal to 10$^3$, FIG. 27), reaching and even exceeding 10$^5$ (FIGS. 6A-6C). To put such Q values in context, these are much greater than the best reported to date in intrinsically tunable film materials [Meyers, C. J. G. et al., (Ba,Sr)TiO$_3$ tunable capacitors with RF commutation quality factors exceeding 6000] Appl. Phys. Lett. 109, 112902 (2016); Vorobiev, A. et al. Correlations between microstructure and Q-factor of tunable thin film bulk acoustic wave resonators. J. Appl. Phys. 110, 054102 (2011)], including ferroelectrics considered for high Q dielectrics [Budimir, M. Damjanovic, D. and Setter, N. Extension of the dielectric tunability range in ferroelectric materials by electric bias field antiparallel to polarization. Appl. Phys. Lett. 88, 082903 (2006); Rojac, T. et al. Piezoelectric nonlinearity and frequency dispersion of the direct piezoresponse of BiFeO$_3$ ceramics. J. Appl. Phys. 112, 064114 (2012); Vorobiev, A. et al., J. Appl. Phys. 110, 054102 (2011)], greater than in AlN films [Rinaldi, M. et al. Super-high two-port AlN contour-mode resonators for RF applications. IEEE Trans. Ultrason. Ferroelectr. Freq. Control 57, 38-45 (2010); Rinaldi, M. et al. 5-10 GHz AlN contour-mode nanoelectromechanical resonators. In 2009 IEEE 22nd International Conference on Micro Electro Mechanical Systems 916-919 (IEEE, 2009)], which are the leading non-ferroelectric (i.e., not intrinsically tunable) piezoelectrics. The experimentally determined Q values are comparable, in fact, to measured values for bulk single-crystal quartz [Krupka, J., et al. Extremely high-Q factor dielectric resonators for millimeter-wave applications. IEEE Trans. Microw. Theory Tech. 53, 702-712 (2005); Harnett, J. G. et al., Room temperature measurement of the anisotropic loss tangent of sapphire using the whispering gallery mode technique. IEEE Trans. Ultrason. Ferroelectr.Freq. Control 53 34-38 (2006)], and ZnO [Magnusson, E. B. et al. Surface acoustic wave devices on bulk ZnO crystals at low temperature. Appl. Phys. Lett. 106, 063509 (2015)]. The field dependence of the resonant frequency f$_r$(E) shows exceptional variation across one decade, spanning L (1-2 GHz), S (2-4 GHz) and C (4-8 GHz) bands, and extending into the X band (8-12 GHz), all in a single device. The commutation quality factor CQF(f)=(n (f)-1)$^2$ Q(0,f) Q(E,f)ln(f) [Vendik, I. B. et al., Commutation quality factor of two-state switchable devices. IEEE Trans. Microw. Theory Tech. 48, 802-808 (2000)], a key metric that incorporates n(E) and Q(E), shows values that are greater than those of the best reported BST films [Meyers, C. J. G. et al., Appl. Phys. Lett. 109, 112902 (2016).

Bulk dielectric and film resonators rely on electromechanical coupling of microwave power through piezoelectric oscillations which appear as resonant and anti-resonant features that can be voltage tuned by <4.5% in the best tunable materials [Berge, J. and Gevorgian, S. Tunable bulk acoustic wave resonators based on Ba$_{0.25}$Sr$_{0.75}$TiO$_3$ thin films and a HfO$_2$/SiO$_2$ Bragg reflector. IEEE Trans. Ultrason. Ferroelectr. Freq. Control 58, 2768-2771 (2011)]. Considering the change in piezoelectric coupling coefficient, the calculated bias field dependence of resonance and anti-resonance frequencies of in-plane piezoelectric oscillations for Ba$_{0.8}$Sr$_{0.2}$TiO$_3$ in our experimental geometry amounts to not more than ≈3% for 0-0.6 MV/cm (FIG. 4I), hundreds of times less than that observed in our devices.

Furthermore, the design of piezoelectric resonators utilizing in-plane piezoelectric oscillations operating at fundamental (or higher mode) frequency relies on interdigitated capacitor (IDC) electrode periodicity, [Gevorgian, S. S., Tagantsev, A. K. and Vorobiev, A. K. Tunable Film Bulk Acoustic Wave Resonators (Springer, New York, 2013)]. Comparison of the spectrum obtained in devices that differ in electrode finger width instead reveals spectra that are essentially the same (FIGS. 6A-6C), further demonstrating that it is highly unlikely that piezoelectric oscillations cause the observed spectrum.

The origin of the unusual experimentally observed Q spikes may be observed using the data obtained from molecular dynamics (MD) simulations of a model BaTiO$_3$ (BTO) system (Methods). Analytical theory of intrinsic dielectric response [Tagantsev, 2003] predicts a 1/f dependence of Q(f) as is also found in our single-domain MD simulations (FIG. 27), indicating that the unusual f-dependence of Q is due to extrinsic effects. Examination of static dielectric response shows that the peak dielectric constant value is observed in the FE phase; such a DW-driven shift of the dielectric response peak to the FE phase was previously experimentally observed in $BaTiO_3$ in the FE phase close to $T_c$ [Hoshia, T. et al. Domain size effect on dielectric properties of barium titanate ceramics., Jpn. J. Appl. Phys. 47, 7607-7611 (2008); Wang, Y. L. et al. Giant domain wall contribution to the dielectric susceptibility in $BaTiO_3$. Appl. Phys. Lett. 91, 062905 (2007)] and reversible domain wall oscillations are also found to lead to the peak dielectric constant in the FE phase for the model $aa_1/aa_2$ DW supercell in our MD simulations (FIG. 2 and FIGS. 8A-8B). The main reason for this domain-wall contribution to dielectric permittivity is the existence of very low-energy modes localized on the 2D domain walls. The strong impact of domain wall oscillations on the dielectric response and the presence of a high density of domain walls in our sample superdomain state suggest that these oscillations may also be the cause of Q(f) oscillations.

To understand the relationships between the reversible domain wall dynamics and Q(f), long (14 ns) simulations may be performed using a model system containing two $aa_1/aa_2$ domain walls in a 120×10×10 supercell (FIGS. 8A-8B) at 50K below the FE-PE transition temperature and then obtain Q(f) from the fluctuations of the total polarization of the supercell. This size may be selected because at this domain length (24 nm), a clear distinction is observed between the domain wall and the bulk-like regions in the sample as can be seen in FIGS. 8A-8B. Additionally, GLD theory predicts that the domain size should be on the order of 30 nm.

Comparison of the experimental and MD-obtained Q(f) shows several similar features (FIG. 9). First, at zero DC bias, the linear or almost linear rise in Q value with decreasing f is succeeded by flattening out of Q with gentle oscillations owing to the onset of relaxation at about 18 GHz (marked by black arrow). This observation is in agreement with the expectation that the presence of domain walls leads to higher loss and lower Q as can be seen from the much lower Q for f in the low f region (<2 GHz for experiment and <18 GHz for MD) than that expected from the intrinsic 1/f Q dependence. Second, at higher bias, Q peaks above the baseline appear at certain frequencies (marked by blue arrows) with the Q curve shifting to higher frequencies with higher DC bias. Finally, a greater number of narrow Q peaks is observed at higher bias. The $Q_y(f)$ data from the E=0 MV/cm and E=0.6 MV/cm $Q_y(f)$ for the MD simulations are qualitatively similar to the E=0.09 and E=0.25 MV/cm Q(f) data obtained experimentally, albeit at higher frequencies due to the difference between the experimental BST and the computational BTO systems (FIG. 9). The uniform shift to higher Q with higher DC bias is not observed for MD simulation and this difference is likely due to the difference between the simple model used in MD simulations and the much more complex E-field profile in experimental samples.

Analysis of Q(f) of individual layers shows that the bulk-like layers (i.e., layers in the middle of the domain that do not show switching) exhibit bulk-like 1/f dependence of Q on f, whereas the DW layers exhibit Q(f) spikes and a flattening out of the Q(f) at low f, similar to the experimentally observed data and the Q(f) obtained computationally for the total system (FIG. 10). Comparison of the autocorrelation function (ACF) for the bulk-like and DW layers (SI) shows that the bulk-like layer ACF shows the normal behavior of rapid decay followed by small fluctuations around 0, whereas the DW layers show slow ACF decays and large amplitude and period of oscillation due to the much larger magnitude of the fluctuations of DW layer P between the two sides of the double-well potential compared to the oscillations of P inside a well. Therefore, DW fluctuations dominate the dielectric response at low f.

Analysis of the polarization switching (from $-P_y$ to $+P_y$ and vice versa) rates for individual layers in the supercell shows that hopping rates increase with increasing DC bias (FIG. 11) which can also be seen from the oscillations of the overall polarization time autocorrelation functions (FIG. 12). Thus, the application of the DC bias accelerates the rate of DW oscillations and leads to the shift of the Q(f) curves to higher f. With no DW oscillations, a bulk-like 1/f Q spectrum is obtained, whereas for slow DW hopping a relaxation-driven flattening out is observed with gentle oscillations in Q and sharp Q peaks are obtained for faster hopping. This strongly suggests that the experimental Q spectrum with gentle oscillations at zero bias is due to the slow oscillations of the high density of DW and the experimentally observed appearance of sharp Q peaks is due to the acceleration of the DW hopping by the application of DC bias.

To show that the DW fluctuation mechanism alone can give rise to the observed sharp Q(f) peaks, stochastic simulations were performed using a simple model of coupled bistable oscillators with a domain wall (SI). We find that DW position oscillations and Q(f) profiles qualitatively similar to those obtained in MD can be obtained by adjusting the double-well parameters of the oscillators (SI), demonstrating that DW oscillations can give rise to the observed sharp variation in Q(f).

The hypothesis that the domain wall position fluctuations give rise to the anomalous Q observed at high static bias in experiments explains why such Q characteristics have not been observed previously. To obtain Q oscillations, a large domain wall density corresponding to domain size of <100 nm is necessary because otherwise the high Q arising from the domain walls will be averaged out by the normal behavior of the bulk of the domain. Secondly, this effect is likely to appear only close to $T_C$ where the thickness of the DW is larger and the barrier to switching is very low, enabling the hopping of the DW layer between the two alternate $P_y$ orientations at GHz frequencies. At lower T, the energy barrier for switching $P_y$ of the layer is too high so that the time necessary to cross the barrier between the two alternative $P_y$ states is too long and high Q would only be observed at f in the MHz range or below where such effect may not be apparent due to the high Q of the bulk dielectric response at such low f. Finally, very high quality films are necessary to observe these effects because variation in the frequencies of the very low dielectric loss resonance due to defects, grain boundaries and compositional variations would lead to averaging out of the low loss and the disappearance of the high Q peaks.

The product of Q and frequency f is one of the most often cited metrics for all dielectric microwave resonators, where acoustic attenuation parameterized by $\alpha \propto f^2$ in the Akhiezer limit for phonon-phonon scattering leads to Qf equaling a material-specific constant. We note that the Qf product in the material deviates from the usual monotonic Q(f) dependence for $1<f_r<10$ GHz in our experimental films, showing a strong increase of Qf in this range. This suggests that the effective scattering rate due to thermal phonons is much lower than $f_r$, providing additional experimental evidence that our domain wall resonant films overcome intrinsic losses in this range. Meanwhile, simulations of BTO indicate that the expected frequency band of voltage-tuned domain wall resonances is material-specific and can be higher than that experimentally observed for BST.

Thus, these experimental and computational simulation results show that engineered domain structure can in fact be exploited for ultra-low loss and exceptional frequency selectivity without piezoelectric resonance, and very large voltage tunability of capacitance, and without hysteresis. The materials are defined not merely by chemical composition, but rather by the proximity of and accessibility among thermodynamically predicted strain-induced, ferroelectric domain wall variants [Pertsev, N. A. et al. Effect of mechanical boundary conditions on phase diagrams of epitaxial ferroelectric thin films. Phys. Rev. Lett. 80 1988-1991 (1998)] to achieve gigahertz microwave tunability and dielectric loss that surpass those for the current best film devices by 1-2 orders of magnitudes, attaining values comparable to bulk single crystals, but in an intrinsically tunable material. The nearly isotropic free energy-polarization landscape of these materials (and correspondingly lower barrier to polarization rotation) is expected to lead to a rich phase diagram and a large response to an applied electric field. Magnitudes of the measured quality factor Q exceed the theoretically predicted zero-field intrinsic limit owing to domain-wall fluctuations rather than the usual piezoelectric oscillations. Resonant frequency tuning across the entire L, S and C microwave bands is achieved in an individual device, about 100 times larger than the current best intrinsically tuned material. Extrinsically-driven MDVM tunable dielectric materials exhibit Q near $T_C$ that exceeds the intrinsic limit without piezoelectric oscillations, and are promising for achieving similar values of Q at a wider range of frequencies. These results point to a rich phase space of possible nanodomain structures that can be used to surmount current limitations and demonstrate a fundamentally new and promising strategy for ultrahigh frequency agility and low-loss microwave devices.

The present disclosure comprises at least the following aspects:

1. An article (e.g., which may be comprise in a resonator, oscillator, device, etc.) comprising a ferroelectric material in its ferroelectric phase, wherein the article is configured to enable low-loss propagation of signals with ultra-low dielectric loss ($10^3 < Q < 10^7$, or $10^{-3} > \tan\delta > 10^{-7}$) at select frequencies.
2. An article comprising a ferroelectric material possessing a high density of one or more (thermally) oscillating ferroelectric domain walls, wherein the article contains domain walls that enable efficient propagation of signals with ultra low dielectric loss ($10^3 < Q < 10^7$, or $10^{-3} > \tan\delta > 10^{-7}$) at select frequencies, wherein the density of domain walls of ranges from 1-100 per 50,000 nm².
3. An article comprising a ferroelectric material in its ferroelectric phase, wherein the article is configured to enable low-loss propagation of signals with ultra low dielectric loss ($10^3 < Q < 10^7$, or $10^{-3} > \tan\delta > 10^{-7}$) at select frequencies and at or within 20% of $T_C$ of the ferroelectric material.
4. An article comprising a ferroelectric material in thin film form in its ferroelectric phase, wherein the composition and strain of the material are selected to stabilize the material, for a given temperature, in two or more energetically equivalent, or nearly energetically equivalent thermodynamically predicted domain wall variant types as specified by a domain wall variant boundary or vertex, thereby enabling efficient propagation of signals with ultra-low loss ($10^3 < Q < 10^7$, or $10^{-3} > \tan\delta > 10^{-7}$) at select frequencies.
5. A dielectric, field-tunable article comprising a ferroelectric material, wherein a range and/or values of article frequency and/or frequencies are controlled based on changes in domain wall oscillation frequency in response to electric field applied to the ferroelectric material.
6. The article of any one of aspects 1-5, wherein the select frequencies are between 0.01 GHz and 300 GHz.
7. The article of any one of aspects 1-5, wherein a range and/or values of article frequency or frequencies of the article are controlled based on the density of domain walls.
8. The article of any one of aspects 1-5, wherein the magnitude of the quality factor Q is controlled by the density of domain walls and increases with domain wall density.
9. The article of any one of aspects 1-5, wherein the range and/or values of article frequency or frequencies are controlled based on the type and/or types of ferroelectric domain wall variants.
10. The article of any one of aspects 1-5, wherein the range and/or values of article frequency or frequencies are controlled based on the degree of strain.
11. The article of any one aspects 1-10 wherein ferroelectric material is in a phase comprising one of: normal ferroelectric, improper ferroelectric, hybrid improper ferroelectric, relaxor ferroelectric, incipient ferroelectric phase, or multi-ferroic ferromagnetic or antiferromagnetic ferroelectric.
12. An article of aspects 1-11, wherein the range and/or values of article frequency and/or frequencies are controlled based on changes in domain wall oscillation in response to magnetic field applied across the multiferroic ferromagnetic (or antiferromagnetic) ferroelectric material due to multiferroic coupling of magnetic field to ferroelectric polarization.
13. The article of any one of aspects 1-12, wherein the chemical composition of the ferroelectric material comprises $BaTiO_3$, $(Ba,Sr)TiO_3$, $PbTiO_3$, PZT, $(Pb,Sr)TiO_3$, $BiFeO_3$, and related solid solutions.
14. An article comprising a ferroelectric material having 1-100 per 50,000 nm² of engineered planar two-dimensional topological defects that, under selected DC bias or zero DC bias, oscillate at select frequencies and within 100 degrees C. of the $T_C$ of the ferroelectric material.
15. The article of aspect 14, wherein the select frequencies are between 0.1 GHz and 300 GHz.
16. The article of any one of aspects 14-15, wherein an axis of vibration of the ferroelectric domain walls is oriented along one or more directions and is indicative that collective oscillations can support traveling EM waves in the presence or absence of DC bias field.
17. The article of any one of aspects 14-16, wherein the planar two-dimensional topological defects comprise domain walls, and wherein the domain walls, under the application of a DC or AC field or under zero DC or AC field, oscillate or fluctuate in their position with respect to time.
18. The article of aspect 17, wherein the timescale or rate of the fluctuations vary depending upon the electrostatic potential landscape and domain width or domain wall density, applied field, temperature, strain (coherent or relaxed) and/or stress.

19. The article of aspect 18, wherein the corresponding frequency spectrum associated with the fluctuations exhibits one or more minima in material dielectric loss (or peaks in reciprocal loss, Q) along an axis parallel (or perpendicular) to the axis of the domain wall and perpendicular to its fluctuations.

20. The article of aspect 19, where the width of the domain separating the domain walls fluctuates.

21. The article of any one of aspects 14-20, wherein ferroelectric material is in its ferroelectric or paraelectric phase (normal ferroelectric, improper ferroelectric, hybrid improper ferroelectric, relaxor ferroelectric, incipient ferroelectric, multi-ferroic ferromagnetic or antiferromagnetic ferroelectric).

22. The article of any one of aspects 14-22, wherein ferroelectric material comprise $BaTiO_3$, $(Ba,Sr)TiO_3$, $PbTiO_3$, PZT, $(Pb,Sr)TiO_3$, $BiFeO_3$, $Bi(Fe,Mn)O_3$.

23. A device having a microwave or mm-wave cavity supporting propagation of transverse electromagnetic (TEM) waves with less dissipation than that for the intrinsic limit of the material forming the cavity, wherein the TEM waves are carried and/or modulated by oscillations of one or more domain walls and at or near $T_C$ of a material forming the microwave cavity, wherein the density of domain walls of ranges from 1-100 per 50,000 $nm^2$ 24. The device of aspect 23, wherein the microwave cavity comprises a ferroelectric material comprising the one or more domain walls that, under zero bias or selected finite DC bias, oscillate at select frequencies.

25. The device of aspect 24, wherein an axis of vibration of the one or more domain walls is oriented along one or more directions and is indicative that zero-field or finite DC field-driven collective oscillations can support traveling EM waves.

26. The device of any one of aspects 23-25, wherein the ferroelectric material is in its ferroelectric or paraelectric phase (normal ferroelectric, improper ferroelectric, hybrid improper ferroelectric, relaxor ferroelectric, incipient ferroelectric, multi-ferroic ferromagnetic or antiferromagnetic ferroelectric).

27. The device of any one of aspects 23-26, wherein the ferroelectric material comprise $BaTiO_3$, $(Ba,Sr)TiO_3$, $PbTiO_3$, PZT, $(Pb,Sr)TiO_3$, $BiFeO_3$, $Bi(Fe,Mn)O_3$.

28. The device of any one of aspects 23-27, wherein Q may increase with increasing temperature, depending on the proximity to $T_C$.

29. The device of any one of aspects 23-28, wherein the magnitude of Q may depend on the amplitude of ambient stochastic noise (given by temperature) in relation to the amplitude of driving signal probing the transmission and/or reflection of RF, microwave or mm-wave energy through the article.

30. A method of making the article of any one of aspects 1-22.

31. A method of making the device of any one of aspects 23-29.

Example Applications:

Transducers. The domain wall oscillating (DWO) material may be a basis for highly efficient transduction of electromechanical energy at one or more resonant frequencies, for sensing and/or actuation, via coupling to mechanical and/or electromagnetic waves. Changes in the resonant frequency associated with the binding of analytes to its surface and its influence on the thermodynamic landscape and DW oscillation conditions, changing the surface boundary condition, is distinct from conventional bulk and/or surface acoustic wave or other similar devices where eigenfrequencies are influenced by the geometry.

Communications. The availability of an ultra-high Q at room temperature, as well as other temperatures, enabled in the DWO-based devices, permits encoding, detection, sensing of information with considerably higher fidelity than current solid state oscillator materials. This includes utilization as a highly frequency-selective voltage-tuned filter, antenna, or oscillator.

Position, navigation and timing. The availability of an ultra-high Q at room temperature, as well as other temperatures, enabled in the DWO-based devices, permits more precise relationships (higher fidelity) between variables defining position, navigation and timing and Q, where frequency selectivity is the means of establishing values of these values; and lower power is necessary to transmit or receive signals relating to position, navigation and timing.

Programmability, by application of local or non-local DC or AC field, strain and/or temperature, of domain structure for reconfiguring DW orientation, oscillation vector, and wave propagation.

Although the meta-materials and articles have been described herein with reference to preferred embodiments and/or preferred methods, it should be understood that the words which have been used herein are words of description and illustration, rather than words of limitation, and that the scope of the instant disclosure is not intended to be limited to those particulars, but rather is meant to extend to all structures, methods, and/or uses of the herein described meta-materials. Those skilled in the relevant art, having the benefit of the teachings of this specification, may effect numerous modifications to the meta-materials as described herein, and changes may be made without departing from the scope and spirit of the instant disclosure, for instance as recited in the appended claims. As an example, the conventional notion of a ferroelectric having polarization-field hysteresis is not supported because it is suppressed on a macroscopic scale due to the high domain density of the present disclosure.

An oscillator or system/collection of coupled oscillators in a ferroelectric material may be configured in accordance with the present disclosure to exhibit resonances at odd integer multiple frequencies of the fundamental domain wall switching resonance frequency due to the noise-induced fluctuation of the system between two sides of the double well.

A resonator may comprise an article for which one or more of the dimension(s) and mechanical and electrical boundary conditions of the volume or cavity containing the medium or bounding the apparatus is selected in accordance with one or more of the domain wall resonance frequencies in order to promote efficient flow of mechanical and/or electromagnetic energy, thereby permitting constructive interference at wave energies in accordance with the altered modulus and/or susceptibility of the domain wall-renormalized (or -dominant) material.

What is claimed is:

1. An article comprising a ferroelectric material including a high density of one or more fluctuating ferroelectric domain walls, wherein the article contains one or more fluctuating ferroelectric domain walls that enable efficient propagation of signals with ultra-low dielectric loss, the ultra-low dielectric loss comprising a range of $10^3 < Q < 10^7$, or $10^{-3} > \tan\delta > 10^{-7}$, wherein Q refers to a quality factor, at one or more select frequencies, wherein the density of domain walls ranges from 1-100 per 50,000 nm$^2$.

2. The article of claim 1, wherein the article is configured to enable low-loss propagation of signals with ultra-low dielectric loss, the ultra-low dielectric loss comprising a range of $10^3<Q<10^7$, or $10^{-3}>\tan\delta>10^{-7}$, at or within 20% of the ferroelectric phase transition temperature $T_C$ of the ferroelectric material.

3. The article of claim 1, wherein the one or more select frequencies are between 0.01 GHz and 300 GHz.

4. An article comprising a ferroelectric material in thin film form in its ferroelectric phase, wherein the composition and strain of the material are selected to stabilize the material, for a given temperature, in or about two or more energetically equivalent thermodynamically predicted domain wall variant types as specified by a domain wall variant boundary or vertex of intersecting boundaries, thereby enabling efficient propagation of signals with ultra-low dielectric loss, the ultra-low dielectric loss comprising a range of $10^3<Q<10^7$, or $10^{-3}>\tan\delta>10^{-7}$, wherein Q refers to a quality factor, at select frequencies.

5. The article of claim 4, wherein at least one of a range and values of at least one of fluctuation frequency and frequencies are controlled based on changes in fluctuating ferroelectric domain wall oscillation frequency in response to electric field applied to the ferroelectric material.

6. The article of claim 4, wherein the one or more select frequencies are between 0.01 GHz and 300 GHz.

7. The article of claim 4, wherein at least one of a range and values of at least one of fluctuation frequency and frequencies of the article are controlled based on the density of fluctuating ferroelectric domain walls.

8. The article of claim 4, wherein the magnitude of the quality factor Q is controlled by the density of fluctuating ferroelectric domain walls and increases with domain wall density.

9. The article of claim 4, wherein the at least one of a range and values of at least one of fluctuation frequency and frequencies are controlled based on at least one of the type and types of fluctuating ferroelectric domain wall variants.

10. The article of claim 4, wherein the at least one of a range and values of at least one of fluctuation frequency and frequencies are controlled based on the degree of strain.

11. The article of claim 4, wherein ferroelectric material is in a phase comprising one of: normal ferroelectric, improper ferroelectric, hybrid improper ferroelectric, or multi-ferroic ferromagnetic or antiferromagnetic ferroelectric.

12. The article of claim 4, wherein the at least one of a range and values of at least one of fluctuation frequency and frequencies are controlled based on changes in fluctuating ferroelectric domain wall oscillation in response to magnetic field applied across the multiferroic ferromagnetic, or anti-ferromagnetic, ferroelectric material due to multiferroic coupling of magnetic field to ferroelectric polarization.

13. The article of claim 4, wherein the ferroelectric material has 1-100 per 40,000 nm$^2$ of engineered planar two-dimensional topological defects that, under selected electric DC bias or zero electric DC bias, oscillate at the one or more select frequencies and within 100 degrees C. of the $T_C$ of the ferroelectric material.

14. The article of claim 13, wherein the select frequencies are between 0.1 GHz and 300 GHz.

15. The article of claim 13, wherein the planar two-dimensional topological defects comprise fluctuating ferroelectric domain walls, and wherein the fluctuating ferroelectric domain walls, under the application of a DC or AC electric field or under zero DC or AC electric field, oscillate or fluctuate in their position with respect to time.

16. The article of claim 15, wherein the timescale or rate of the fluctuations vary depending upon the electrostatic potential landscape and domain width or at least one of fluctuating ferroelectric domain wall density, applied field, temperature, coherent strain, relaxed strain, and stress.

17. The article of claim 4, wherein ferroelectric material comprises perovskites, $Ba_xSr_{1-x}TiO_3$ ($BST_x$), $PbTiO_3$, $Pb(Zr,Ti)O_3$, $(Pb,Sr)TiO_3$, $BiFeO_3$, $Bi(Fe,Mn)O_3$, or Ruddelson-Popper phases $A_{n+1}B_nX_{3n+1}$, or Ruddelson-Popper phases $A_{n+1}A'_2B_nX_{3n+1}$ where A and A' represent alkali and/or alkaline earth metals, and B denotes a rare earth metal, and X=O or other ferroelectrics, or a combination thereof.

18. A method of making the article of claim 4.

19. A resonator comprising the article of claim 4.

\* \* \* \* \*